(12) United States Patent
Inoue et al.

(10) Patent No.: US 9,306,027 B2
(45) Date of Patent: Apr. 5, 2016

(54) SEMICONDUCTOR DEVICE AND A METHOD FOR MANUFACTURING A SEMICONDUCTOR DEVICE

(71) Applicant: Renesas Electronics Corporation, Kawasaki-shi, Kanagawa (JP)

(72) Inventors: Takashi Inoue, Kanagawa (JP); Toshiyuki Takewaki, Kanagawa (JP); Tatsuo Nakayama, Kanagawa (JP); Yasuhiro Okamoto, Kanagawa (JP); Hironobu Miyamoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/548,527

(22) Filed: Nov. 20, 2014

(65) Prior Publication Data

US 2015/0145004 A1   May 28, 2015

(30) Foreign Application Priority Data

Nov. 28, 2013   (JP) .................................. 2013-245845

(51) Int. Cl.
*H01L 29/66*     (2006.01)
*H01L 29/51*     (2006.01)
(Continued)

(52) U.S. Cl.
CPC .......... *H01L 29/518* (2013.01); *H01L 29/2003* (2013.01); *H01L 29/205* (2013.01);
(Continued)

(58) Field of Classification Search
CPC ......................... H01L 29/2009; H01L 29/7813
See application file for complete search history.

(56) References Cited

U.S. PATENT DOCUMENTS

| 5,500,381 A  * | 3/1996 | Yoshida et al. ............... 438/172 |
| 8,525,274 B2 | 9/2013 | Takada |

(Continued)

FOREIGN PATENT DOCUMENTS

| JP | 2008-205392 A | 9/2008 |
| JP | 2010-206110 A | 9/2010 |

(Continued)

OTHER PUBLICATIONS

Waki et al., "ECR sputtered SiN film quality effects on the characteristics of SiN/AlGaN/GaN MIS-HFETs", The Papers of Technical Meeting of the Institute of Electrical Engineers of Japan, Technical Group on Electron Devices, EDD11043, Mar. 2, 2011.

(Continued)

*Primary Examiner* — Fernando L Toledo
*Assistant Examiner* — Neil Prasad
(74) *Attorney, Agent, or Firm* — Shapiro, Gabor and Rosenberger, PLLC

(57) ABSTRACT

The characteristics of a semiconductor device are improved. A semiconductor device is formed so as to have a channel layer formed over a substrate, a barrier layer, a trench penetrating through the barrier layer in an opening region, and reaching some point of the channel layer, a gate electrode arranged in the trench via a gate insulation film, and an insulation film formed over the barrier layer outside the opening region. Then, the insulation film has a lamination structure of a Si-rich silicon nitride film, and a N-rich silicon nitride film situated thereunder. Thus, the upper layer of the insulation film is set as the Si-rich silicon nitride film. This enables the improvement of the breakdown voltage, and further, enables the improvement of the etching resistance. Whereas, the lower layer of the insulation film is set as the N-rich silicon nitride film. This can suppress collapse.

7 Claims, 34 Drawing Sheets

(51) Int. Cl.
*H01L 29/778* (2006.01)
*H01L 29/205* (2006.01)
*H01L 29/20* (2006.01)
*H01L 29/423* (2006.01)

(52) U.S. Cl.
CPC ...... *H01L29/4236* (2013.01); *H01L 29/66431* (2013.01); *H01L 29/66462* (2013.01); *H01L 29/778* (2013.01); *H01L 29/7787* (2013.01)

(56) References Cited

U.S. PATENT DOCUMENTS

| | | | |
|---|---|---|---|
| 8,587,092 | B2 | 11/2013 | Makiyama |
| 2008/0035934 | A1 | 2/2008 | Sheppard et al. |
| 2008/0203541 | A1* | 8/2008 | Makiyama .................... 257/640 |
| 2008/0237605 | A1* | 10/2008 | Murata et al. .................. 257/76 |
| 2013/0082400 | A1 | 4/2013 | Ohki et al. |

FOREIGN PATENT DOCUMENTS

| | | |
|---|---|---|
| JP | 2012-044003 A | 3/2012 |
| JP | 2013-077629 A | 4/2013 |

OTHER PUBLICATIONS

Marui et al., "Effects of a Thermal CVD SiN Passivation Film on AlGaN/GaN HEMTs", IEICE Electron. vol. E91-C, No. 7, pp. 1009-1014, Jul. 2008.

Karouta et al., "Influence of the Structural and Compositional Properties of PECVD Silicon Nitride Layers on the Passivation of AlGaN/GaN HEMTs", ECS Transactions, 16(7) 181-191 (2008).

Lee et al., "Bi-layer $Si_xN_y$ passivation on AlGaN/GaNHEMTs to suppress current collapse and improve breakdown", 2010 Semicond. Sci. Technol. 25(2010), p. 125010.

Extended European Search Report issued Apr. 14, 2015, in European Patent Application No. EP14191816.9.

* cited by examiner

|  | Type-I | Type-II |
|---|---|---|
| Lgs [μm] | 3 | 1 |
| Lg [μm] | 1 | 1 |
| Lgd [μm] | 10 | 2.5 |
| Lfp [μm] | 0 | 1 or 0 |
| SiN FILM THICKNESS [nm] | 300 | 60 |
| Wg [μm] | 500 | 50 |
| AlGaN THICKNESS [nm] | 30 | 30 |
| Al COMPOSITION OF AlGaN [%] | 25 | 25 |

FIG. 30

| | DEVICE STRUCTURE | | CHARACTERISTICS | | |
|---|---|---|---|---|---|
| | SiN FILM QUALITY | FP ELECTRODE | COLLAPSE | BREAKDOWN VOLTAGE | ETCHING RATE |
| (a) | Si-RICH MONOLAYER 60nm ([Si]/[N] = 0.95) | NONE | 22 | 160 | 210 |
| (b) | Si-RICH MONOLAYER 60nm ([Si]/[N] = 0.95) | PROVIDED | 20 | 240 | 210 |
| (c) | N-RICH MONOLAYER 60nm ([Si]/[N] = 0.75) | NONE | 8 | 50 | 800 |
| (d) | N-RICH MONOLAYER 60nm ([Si]/[N] = 0.75) | PROVIDED | 4 | 190 | 800 |
| (e) | Si-RICH 20nm / N-RICH 40nm | NONE | 9 | 120 | 210 |
| (f) | Si-RICH 20nm / N-RICH 40nm | PROVIDED | 1~3 | 210 | 210 |
| | | | % | V | Å/min |

ELECTRIC FIELD INTENSITY AT A-B

ELECTRIC FIELD INTENSITY AT A-B

SEMICONDUCTOR DEVICE AND A METHOD FOR MANUFACTURING A SEMICONDUCTOR DEVICE

CROSS-REFERENCE TO RELATED APPLICATIONS

The disclosure of Japanese Patent Application No. 2013-245845 filed on Nov. 28, 2013 including the specification, drawings and abstract is incorporated herein by reference in its entirety.

BACKGROUND

The present invention relates to a semiconductor device, and is preferably usable for, for example, a semiconductor device using a nitride semiconductor, and a method for manufacturing a semiconductor device.

In recent years, attention has been paid to semiconductor devices each using a III-V group compound having a larger band gap than that of silicon (Si). Among them, development has been pursed on semiconductor devices using gallium nitride (GaN) having advantages such as 1) large breakdown electric field, 2) large saturated electron velocity, 3) large thermal conductivity, 4) being able to form a favorable hetero junction between AlGaN and GaN, and 5) being a nontoxic and high-safety material.

Further, for high breakdown voltage and high-speed switching characteristic, development has been pursued on a semiconductor device which is a power MISFET (Metal Insulator Semiconductor Field Effect Transistor) using gallium nitride, and is capable of normally-off operation.

For example, in Patent Document 1 (Japanese Unexamined Patent Publication No. 2010-206110), there is disclosed a nitride semiconductor device having a gate recess structure. Then, there is disclosed a technology of surface-stabilizing the nitride semiconductor device, and thereby suppressing the current collapse.

Further, in Patent Document 2 (Japanese Unexamined Patent Publication No. 2008-205392), there is disclosed a compound semiconductor device in which the protective insulation film covering the surface of the compound semiconductor region is formed in a double layer structure of a first insulation film and a second insulation film having different properties.

Further, Patent Document 3 (Japanese Unexamined Patent Publication No. 2012-44003) and Patent Document 4 (Japanese Unexamined Patent Publication No. 2013-77629) disclose nitride semiconductor devices, and each disclose a technology of suppressing the current collapse.

Whereas, in Non-Patent Document 1, there is disclosed the relation between the stoichiometric composition of SiN and the collapse amount. In Non-Patent Document 2, there is disclosed the relation between the refractive index and the collapse amount of the protective film of a monolayer thermal CVD silicon nitride film. Furthermore, Non-Patent Document 3 discloses as follows: for the protective film of a silicon nitride film, when the refractive index is 2.01, the collapse amount is minimum. Further, in Non-Patent Document 4, there is disclosed a nitride semiconductor device using a nitrogen (N)-rich SiN film and a SiN film formed by low temperature deposition CVD as the protective films.

Patent Documents

[Patent Document 1] Japanese Unexamined Patent Publication No. 2010-206110

[Patent Document 2] Japanese Unexamined Patent Publication No. 2008-205392

[Patent Document 3] Japanese Unexamined Patent Publication No. 2012-44003

[Patent Document 4] Japanese Unexamined Patent Publication No. 2013-77629

Non-Patent Documents

[Non-Patent Document 1] WAKI Eiji, et al., "ECR sputtered SiN film quality effects on the characteristics of SiN/AlGaN/GaN MIS-HFETs", the paper of Technical Meeting of the Institute of Electrical Engineers of Japan, Technical Group on Electron Devices, EDD11043, Mar. 2, 2011.

[Non-Patent Document 2] T. Marui et al., "Effects of a Thermal CVD SiN Passivation Film on AlGaN/GaN HEMTs," IEICE Electron. Vol. E91-C, No. 7, pp. 1009-1014, July 2008.

[Non-Patent Document 3] F. Karouta et al., "Influence of the Structural and Compositional Properties of PECVD Silicon Nitride Layers on the Passivation of AlGaN/GaN HEMTs," ECS Transactions, 16 (7) 181-191 (2008).

[Non-Patent Document 4] K. B. Lee et al., "Bi-layer SixNy passivation on AlGaN/GaN HEMTs to suppress current collapse and improve breakdown," 2010 Semicond. Sci. Technol. 25 (2010), p. 125010.

SUMMARY

The present inventors have been involved in research and development of the semiconductor devices using a nitride semiconductor as described above, and have conducted a close study on the improvement of the characteristics. During the process thereof, it has been proved that there is room for further improvement of the characteristics of the semiconductor device using a nitride semiconductor.

Other objects and novel features will be apparent from the description of this specification and the accompanying drawings.

Summaries of the representative ones of the embodiments disclosed in the present application will be described in brief as follows.

A semiconductor device shown in one embodiment disclosed in the present application has an insulation film over a nitride semiconductor layer. Then, the insulation film has a first silicon nitride film formed over the nitride semiconductor layer, and a second silicon nitride film formed over the first silicon nitride film. Then, the second silicon nitride film is larger in composition ratio of silicon (Si) than the first silicon nitride film.

For example, the composition ratio $[Si]/[N]$ of the first silicon nitride film is within ±1% around 0.75. Further, the composition ratio $[Si]/[N]$ of the first silicon nitride film is 0.65 or more and 0.85 or less.

For example, the composition ratio $[Si]/[N]$ of the second silicon nitride film is larger than 0.85.

In accordance with the semiconductor devices shown in the following representative embodiments disclosed in the present application, it is possible to improve the characteristics of the semiconductor devices.

BRIEF DESCRIPTION OF THE DRAWINGS

FIG. 30 is a table summarizing the characteristics of semiconductor devices with configurations (a) to (f);

DETAILED DESCRIPTION

Figure 1:
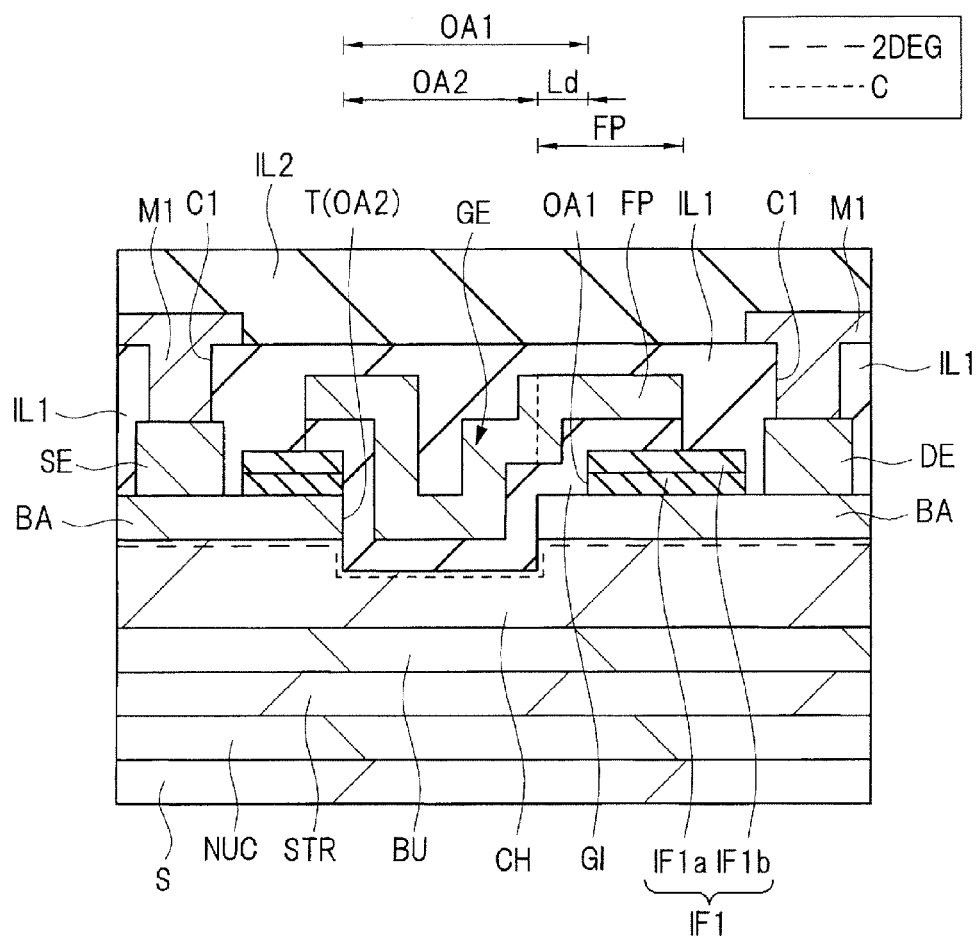
FIG. 1 is a cross sectional view showing a configuration of a semiconductor device of First Embodiment.

In description of the following embodiment, the embodiment may be described in a plurality of divided sections or embodiments for convenience, if required. However, unless otherwise specified, these are not independent of each other, but are in a relation such that one is a modification example, an applied example, a detailed description, complementary explanation, or the like of a part or the whole of the other. Further, in the following embodiments, when a reference is made to the number of elements, and the like (including number, numerical value, quantity, range, or the like), the number of elements is not limited to the specific number, but may be greater than or less than the specific number, unless otherwise specified, or except the case where the number is apparently limited to the specific number in principle.

Further, in the following embodiments, it is needless to say that the constitutional elements (including element steps, or the like) are not always essential, unless otherwise specified, or except the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numbers and the like (including numbers, numerical values, ranges, and the like).

Below, embodiments will be described in details by reference to the accompanying drawings. Incidentally, in all the drawings for describing the following embodiments, the members having the same function are given the same or related reference signs and numerals, and a repeated description thereon is omitted. Further, when a plurality of similar members (portions) are present, a sign may be added to a generic reference numeral to denote an individual or specific portion. Further, in the following embodiments, unless particularly necessary, the same or similar portions will not be repeatedly described.

Further, in the accompanying drawings used in embodiments, hatching may be omitted even in a cross sectional view for ease of understanding of the drawings.

Further, in a cross sectional view, the dimensions of each part are not intended to correspond to those of an actual device. For ease of understanding of the drawing, a specific part may be shown on a relatively larger scale.

First Embodiment

Below, with reference to the accompanying drawings, a semiconductor device of the present embodiment will be described in details. FIG. 1 is a cross sectional view showing a configuration of the semiconductor device of the present embodiment. FIGS. 2 to 17 are each a cross sectional view showing the semiconductor device of the present embodiment during a manufacturing step.

Structure Description

FIG. 1 is a cross sectional view showing a configuration of the semiconductor device of the present embodiment. The semiconductor device shown in FIG. 1 is a MIS (Metal Insulator Semiconductor) type field effect transistor (FET) using a nitride semiconductor. The semiconductor device can be used as a High Electron Mobility Transistor (HEMT) type power transistor. The semiconductor device of the present embodiment is a so-called recess gate type semiconductor device.

In the semiconductor device of the present embodiment, on a substrate S, there are sequentially formed a nucleation layer NUC, a strain relaxation layer STR, a buffer layer BU, a channel layer (also referred to as an electron running layer) CH, and a barrier layer BA. A gate electrode GE is formed in the inside of a trench T penetrating through an insulation film (protective film) IF1 and the barrier layer BA, and reaching some point of the channel layer CH via a gate insulation film GI. The channel layer CH and the barrier layer BA are each formed of a nitride semiconductor. The barrier layer BA is a nitride semiconductor larger in band gap than the channel layer CH.

On the channel layer CH side in the vicinity of the interface between the channel layer CH and the barrier layer BA, there is formed a two-dimensional electron gas 2DEG. Whereas, when the gate electrode GE is applied with a positive potential (threshold potential), a channel C is formed in the vicinity of the interface between the gate insulation film GI and the channel layer CH.

The two-dimensional electron gas 2DEG is formed by the following mechanism. The nitride semiconductors (herein, gallium nitride type semiconductors) forming the channel layer CH and the barrier layer BA respectively have different band gaps and electron affinities. For this reason, at the junction surface of the semiconductors, there is formed a square well potential. The accumulation of electrons in the square well potential results in the formation of the two-dimensional electron gas 2DEG in the vicinity of the interface between the channel layer CH and the barrier layer BA. Particularly, herein, the channel layer CH and the barrier layer BA are epitaxially formed with a gallium (or aluminum) plane grown nitride semiconductor material. For this reason, positive fixed polarization charges are generated at the interface between the channel layer CH and the barrier layer BA. Thus, electrons are accumulated in order to neutralize the positive polarization charges. Accordingly, the two-dimensional electron gas 2DEG becomes more likely to be formed.

Herein, the two-dimensional electron gas 2DEG formed in the vicinity of the interface between the channel layer CH and the barrier layer BA is divided by the trench T including the gate electrode GE formed therein. For this reason, in the semiconductor device of the present embodiment, with the gate electrode GE not applied with a positive potential (threshold potential), the OFF state can be kept; and with the gate electrode GE applied with a positive potential (threshold potential), the ON state can be kept. Thus, the normally off operation can be performed.

The configuration of the semiconductor device of the present embodiment will be further described in details. As shown in FIG. 1, in the semiconductor device of the present embodiment, over the substrate S, there is formed the nucleation layer NUC. Over the nucleation layer NUC, there is formed the strain relaxation layer STR. The nucleation layer NUC is formed in order to generate the crystalline nucleus for growing layers to be formed thereover such as the strain relaxation layer STR. Further, the nucleation layer NUC is formed in order to prevent the deterioration of the substrate S due to diffusion of the constituent elements (such as Ga) of the layer formed thereover into the substrate S from the layer formed thereover. Whereas, the strain relaxation layer STR is formed in order to release the stress on the substrate S, and to suppress the generation of warpage or cracks in the substrate S.

Over the strain relaxation layer STR, there is formed a buffer layer BU. Over the buffer layer BU, there is formed a channel layer (which is also referred to as an electron running layer) CH formed of a nitride semiconductor. Over the channel layer CH, there is formed the barrier layer BA formed of a nitride semiconductor. Namely, over the main surface (upper surface) of the strain relaxation layer STR, there are formed (deposited) the buffer layer BU, the channel layer CH, and the barrier layer BA, sequentially from the bottom. Over the barrier layer BA, a source electrode SE and a drain electrode DE are each formed via an ohmic layer. The buffer layer BU is an intermediate layer situated between the channel layer CH and the strain relaxation layer STR.

The gate electrode GE is formed in the inside of a trench (which is also referred to as a recess) T penetrating through the insulation film (protective film) IF1 and the barrier layer BA, and bored partway into the channel layer CH via the gate insulation film GI.

The insulation film IF1 has an opening in an opening region OA1. The opening is provided in a region wider toward the drain electrode DE side than the trench T formation region (opening region OA2) by the distance Ld. In other words, the insulation film IF1 is set back from the end of the trench T on the drain electrode DE side by the distance Ld.

Over the gate insulation film GI, there is formed the gate electrode GE. The gate electrode GE has a shape projecting in one direction (the right-hand side in FIG. 1, the drain electrode DE side). The projecting part is also referred to as a field plate electrode (which is also referred to as a field plate electrode part or a FP electrode part) FP. The field plate electrode FP is a partial region of the gate electrode GE extending from the end of the trench T on the drain electrode DE side toward the drain electrode DE side.

Over the barrier layers BA on the opposite sides of the gate electrode GE, there are formed a source electrode SE and a drain electrode DE. Incidentally, the distance between the end of the trench T and the drain electrode DE is larger than the distance between the end of the trench T and the source electrode SE. Each coupling between the source electrode SE and the drain electrode DE and the barrier layer BA is an ohmic coupling.

Herein, in the present embodiment, an insulation film IF1 has a lamination structure of a Si-rich silicon nitride film IF1b, and a N-rich silicon nitride film IF1a situated thereunder. In other words, the insulation film IF1 has a N-rich silicon nitride film IF1a in contact with the barrier layer BA, and a Si-rich silicon nitride film IF1b situated thereover. Namely, the silicon nitride film IF1b is larger in composition ratio of silicon (Si) than the silicon nitride film IF1a.

In the the present specification, the N-rich silicon nitride film refers to that having a composition ratio $[Si]/[N]$ of 0.85 or less. The Si-rich silicon nitride film refers to that having a composition ratio $[Si]/[N]$ of larger than 0.85.

The insulation film IF1 is arranged over the barrier layer BA on the opposite sides of the trench T. Further, over the insulation film IF1, a gate electrode GE is arranged via the gate insulation films GI. Then, a Si-rich silicon nitride film IF1b is arranged on the gate insulation film GI side. A N-rich silicon nitride film IF1a is arranged on the barrier layer BA side.

Thus, the insulation film IF1 is formed in a lamination structure. This can improve the characteristics of the semiconductor device.

Specifically, by configuring the upper layer of the insulation film IF1 as the Si-rich silicon nitride film IF1b, it is possible to improve the breakdown voltage. Further, it is possible to improve the etching resistance.

Whereas, by configuring the lower layer of the insulation film IF1 as the N-rich silicon nitride film IF1a, it is possible to suppress the collapse (current collapse phenomenon). These will be described in details later.

Incidentally, over the gate electrode GE, the source electrode SE, and the drain electrode DE, there is formed an insulation layer IL1. Further, the source electrode SE and the drain electrode DE are coupled with wires M1 via plugs in the contact holes C1 formed in the insulation layer IL1, respectively. Further, over the wires M1 and the insulation layer IL1, there is formed an insulation layer IL2.

Manufacturing Method Description

Then, referring to FIGS. 2 to 17, a description will be given to a method for manufacturing a semiconductor device of the present embodiment. In addition, the configuration of the semiconductor device will be more elucidated. FIGS. 2 to 17 are each a cross sectional view showing the semiconductor device of the present embodiment during a manufacturing step.

Figure 2:
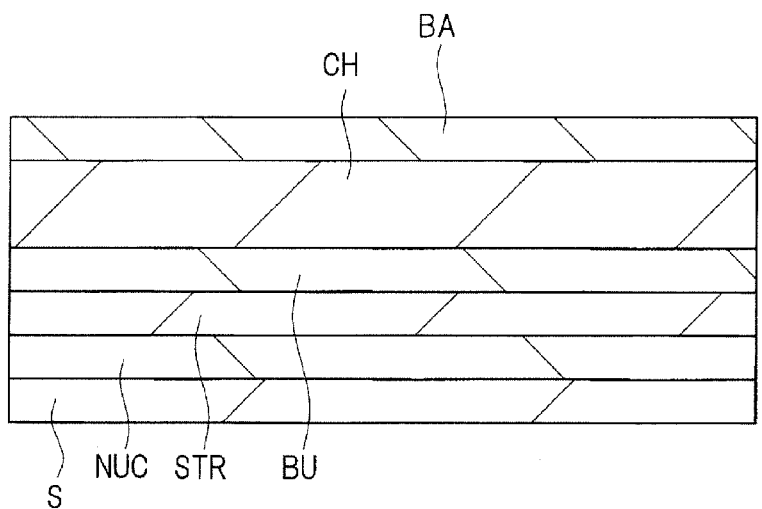
FIG. 2 is a cross sectional view showing the semiconductor device of First Embodiment during a manufacturing step.

As shown in FIG. 2, over the substrate S, there are sequentially formed the nucleation layer NUC, the strain relaxation layer STR, and the buffer layer BU. As the substrate S, there is used, for example, a semiconductor substrate formed of silicon (Si) with a (111)-plane exposed. Thereover, as the nucleation layer NUC, for example, an aluminum nitride (AlN) layer is heteroepitaxially grown using the metal organic chemical vapor deposition (MOCVD) method or the like. Then, over the nucleation layer NUC, as the strain relaxation layer STR, there is formed a superlattice structure in which lamination films (AlN/GaN films) of a gallium nitride (GaN) layer and an aluminum nitride (AlN) layer are repeatedly deposited. For example, gallium nitride (GaN) layers and aluminum nitride (AlN) layers are repeatedly heteroepitaxially grown about 100 layers, respectively, (a total of 200 layers), each with a film thickness of about 2 to 3 nm using the metal organic chemical vapor deposition method or the like. Incidentally, as the substrate S, there may be used a substrate formed of SiC, sapphire, or the like other than the silicon. Further, generally, the III-group nitride layers including the nucleation layer NUC, and over the nucleation layer NUC are all formed by III-group element plane growth (namely, in the present case, gallium plane growth or aluminum plane growth).

Then, over the strain relaxation layer STR, there is formed the buffer layer BU. Over the strain relaxation layer STR, as the buffer layer BU, for example, an AlGaN layer is heteroepitaxially grown using the metal organic chemical vapor deposition method or the like.

Then, over the buffer layer BU, there is formed the channel layer CH. For example, over the buffer layer BU, a gallium nitride (GaN) layer is heteroepitaxially grown using the metal organic chemical vapor deposition method or the like. The film thickness of the channel layer CH is, for example, 3 nm or more.

Then, over the channel layer CH, as the barrier layer BA, for example, an AlGaN layer is heteroepitaxially grown using the metal organic chemical vapor deposition method or the like. The composition ratio of Al of the AlGaN layer of the barrier layer BA is set larger than the composition ratio of Al of the AlGaN layer of the buffer layer BU.

Thus, the lamination of the buffer layer BU, the channel layer CH, and the barrier layer BA is formed. The lamination is formed by the heteroepitaxial growth, namely, III-group plane growth by which deposition is made in the [0001] crystal axis (C axis) direction. In other words, the lamination is formed by (0001) Ga plane growth. Of the lamination, in the vicinity of the interface between the channel layer CH and the barrier layer BA, there is formed a two-dimensional electron gas 2DEG.

Figure 3:
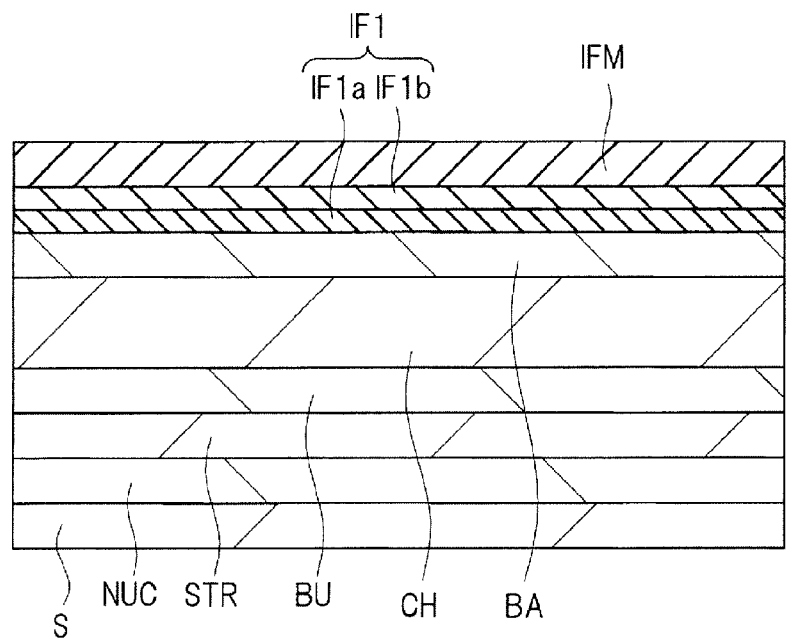
FIG. 3 is a cross sectional view showing the semiconductor device of First Embodiment during a manufacturing step, and showing the manufacturing step following FIG. 2.

Then, as shown in FIG. 3, over the barrier layer BA, there is formed an insulation film IF1. First, a N-rich silicon nitride film IF1a is deposited with a film thickness of, for example, about 30 nm using a CVD (Chemical Vapor Deposition) method or the like. Then, over the N-rich silicon nitride film IF1a, a Si-rich silicon nitride film IF1b is deposited with a film thickness of, for example, about 60 nm using a CVD method or the like.

The composition ratio of the silicon nitride film, namely, whether the N-rich or Si-rich composition is achieved can be adjusted by changing the gas flow rate ratio of the raw material gas (i.e., a mixed gas of a silicon compound gas and a nitrogen compound gas) as described later. Then, over the insulation film IF1, as a masking insulation film IFM, for example, a silicon oxide film is formed using a CVD method.

Figure 4:
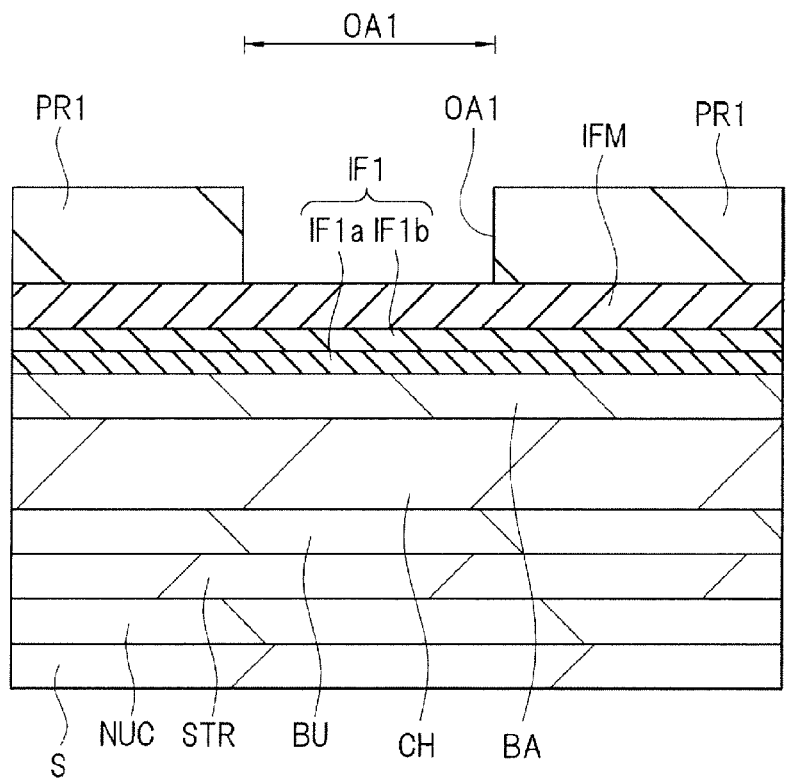
FIG. 4 is a cross sectional view showing the semiconductor device of First Embodiment during a manufacturing step, and showing the manufacturing step following FIG. 3.
Figure 5:
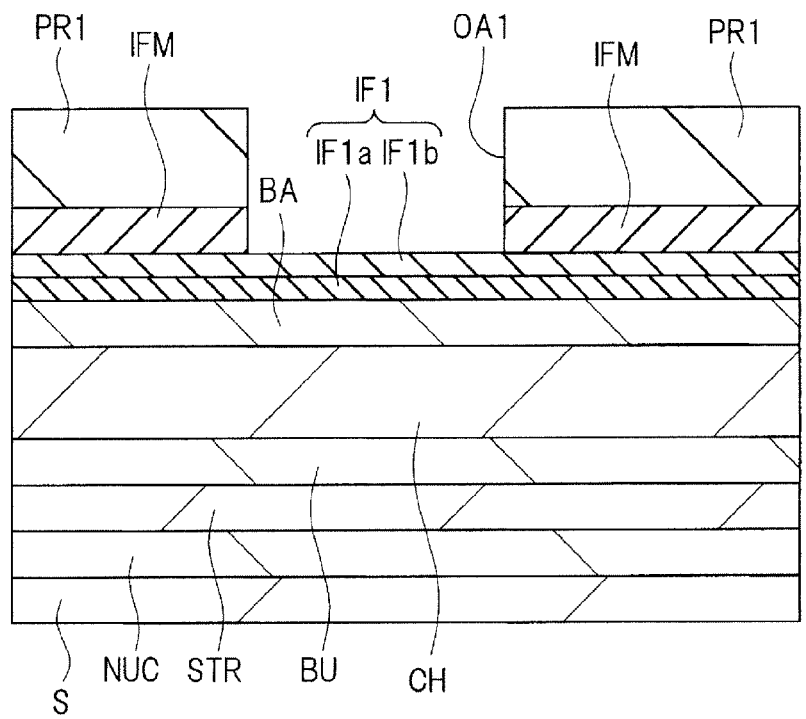
FIG. 5 is a cross sectional view showing the semiconductor device of First Embodiment during a manufacturing step, and showing the manufacturing step following FIG. 4.
Figure 6:
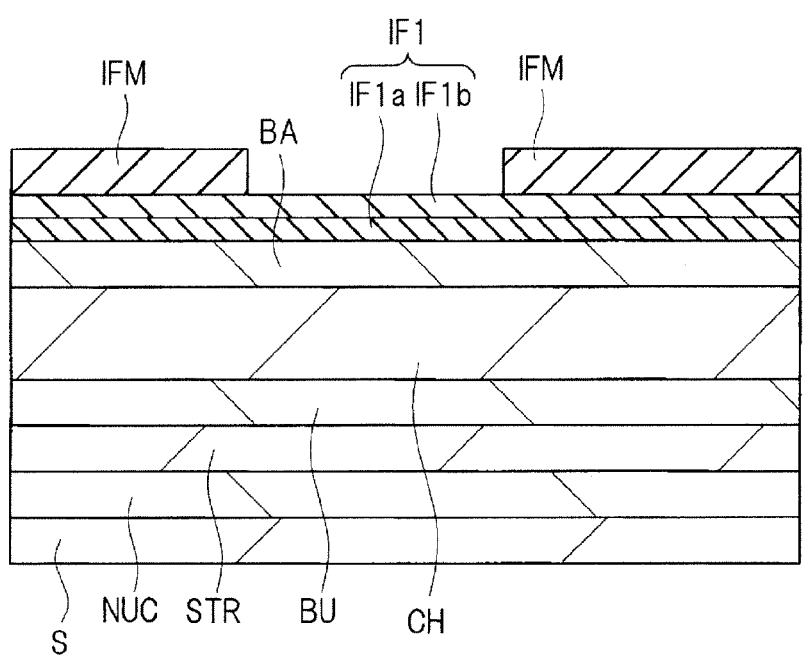
FIG. 6 is a cross sectional view showing the semiconductor device of First Embodiment during a manufacturing step, and showing the manufacturing step following FIG. 5.

Then, as shown in FIG. 4, using a photolithography technology, a photoresist film PR1 having an opening in an opening region OA1 is formed over the masking insulation film IFM. Then, as shown in FIG. 5, using the photoresist film PR1 as a mask, the masking insulation film IFM is etched. As the etching gas for the silicon oxide film, there can be used a hydrocarbon gas such as $C_4H_8$. As a result, as shown in FIG. 5, over the insulation film IF1, there is formed the masking insulation film IFM having an opening in the opening region OA1. Then, as shown in FIG. 6, the photoresist film PR1 is removed by a plasma peel treatment or the like.

Figure 7:
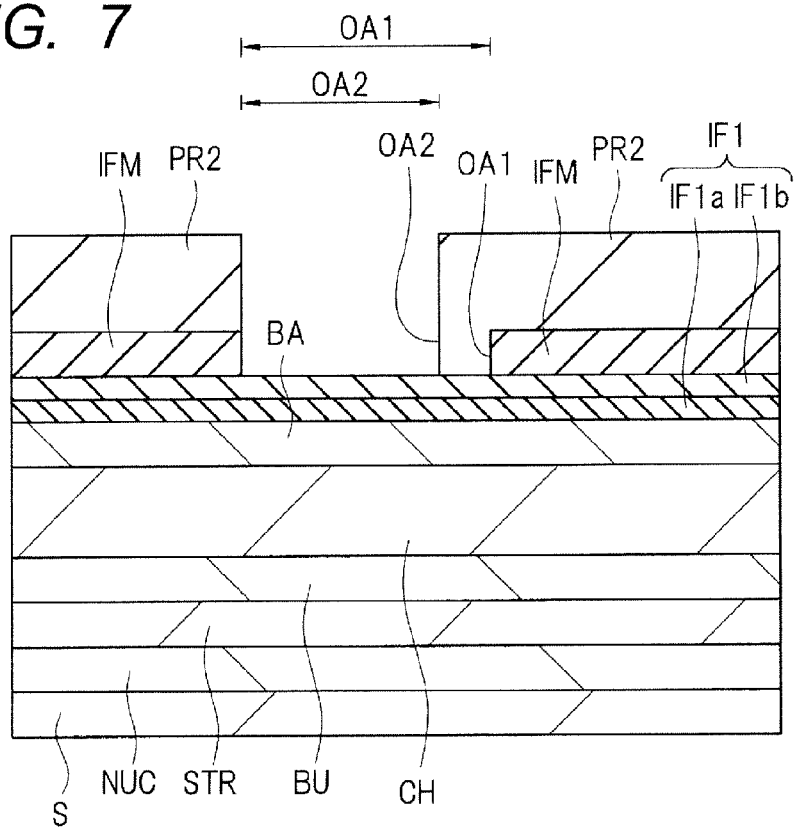
FIG. 7 is a cross sectional view showing the semiconductor device of First Embodiment during a manufacturing step, and showing the manufacturing step following FIG. 6.
Figure 8:
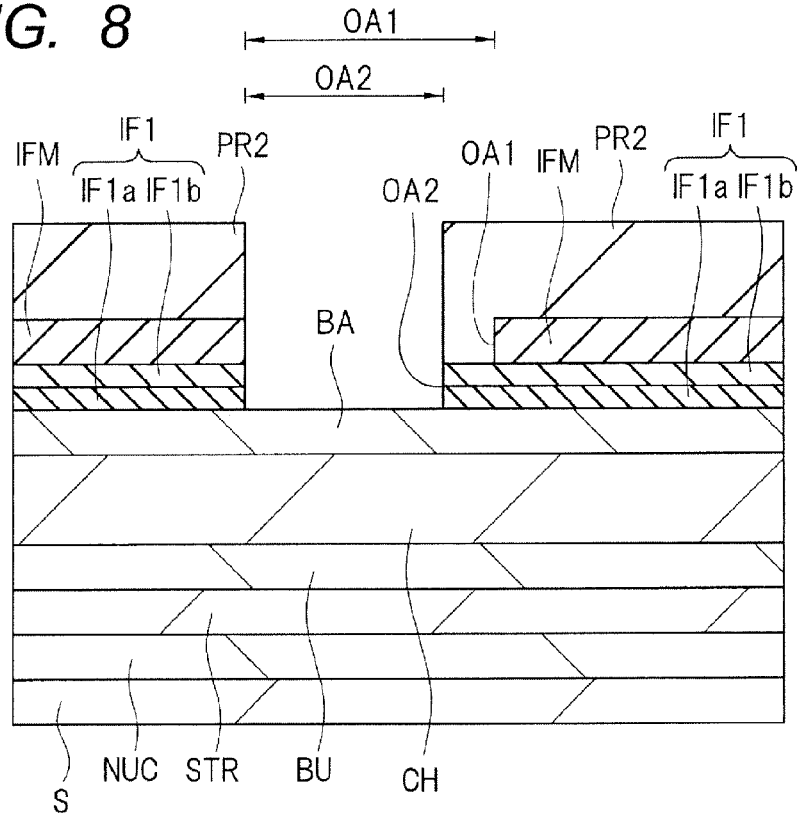
FIG. 8 is a cross sectional view showing the semiconductor device of First Embodiment during a manufacturing step, and showing the manufacturing step following FIG. 7.

Then, as shown in FIG. 7, using a photolithography technology, there is formed a photoresist film PR2 having an opening in an opening region OA2 situated on the inner side of the opening region OA1. Then, as shown in FIG. 8, using the photoresist film PR2 as a mask, the insulation film IF1 is etched. As the etching gas for the silicon nitride film, there can be used a fluorine type gas such as $SF_6$ or $CF_4$.

Figure 9:
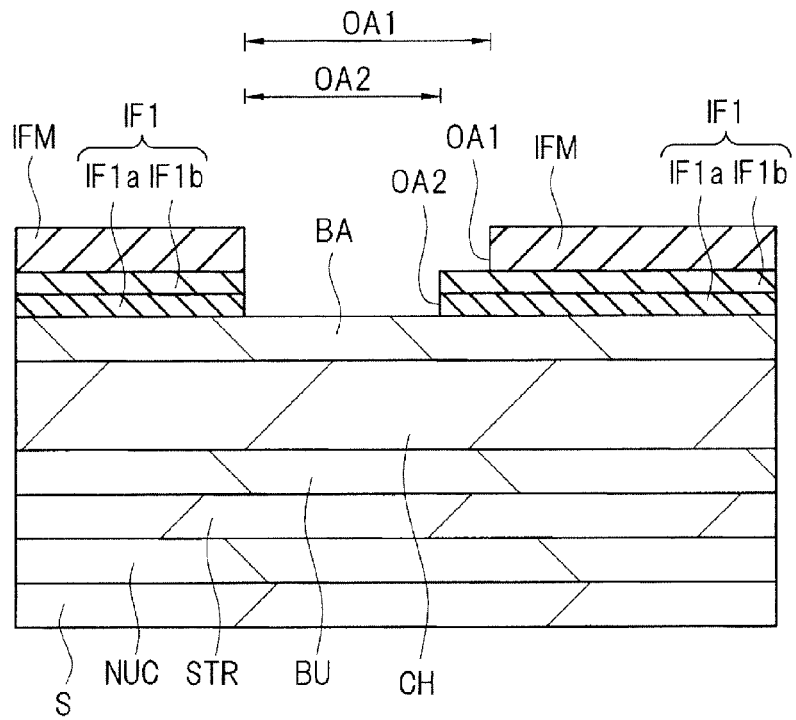
FIG. 9 is a cross sectional view showing the semiconductor device of First Embodiment during a manufacturing step, and showing the manufacturing step following FIG. 8.

Then, by a plasma peel treatment or the like, the photoresist film PR2 is removed. As a result, as shown in FIG. 9, over the barrier layer BA, there is formed the insulation film IF1 having an opening in the opening region OA2. Further, over the insulation film IF1, there is arranged a masking insulation film IFM set back from one end of the opening region OA2, and having an opening in the opening region OA1.

Figure 10:
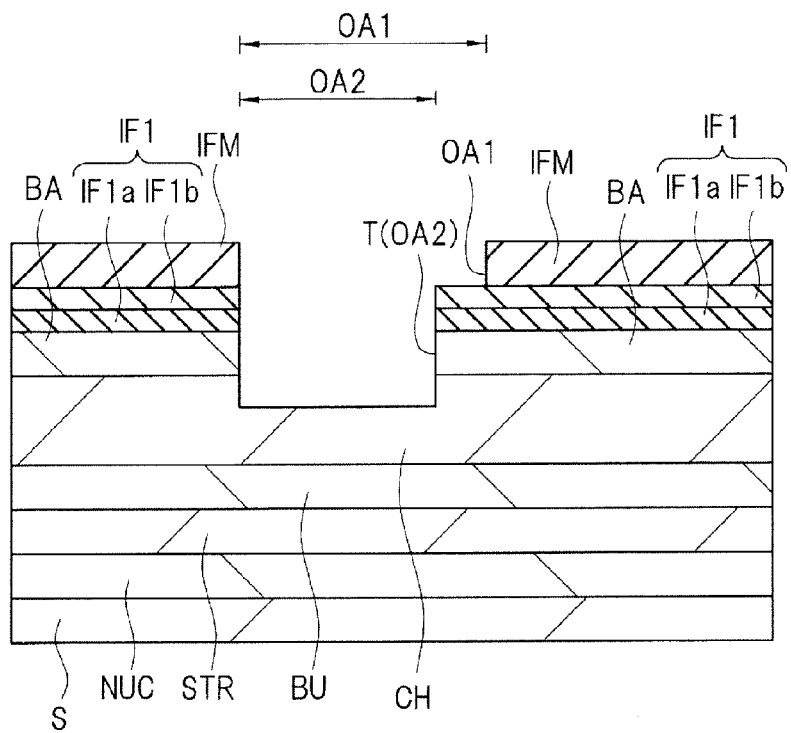
FIG. 10 is a cross sectional view showing the semiconductor device of First Embodiment during a manufacturing step, and showing the manufacturing step following FIG. 9.

Then, as shown in FIG. 10, using a lamination film of the insulation film IF1 and the insulation film IFM as a mask, the barrier layer BA and the channel layer CH (also referred to as a lamination) are etched. This results in the formation of the trench T penetrating through the insulation film IF1 and the barrier layer BA, and reaching some point of the channel layer CH. As the etching gas, there is used, for example, chlorine type gas (such as $BCl_3$). After the etching, a heat treatment (annealing) is performed for recovery of etching damage.

Figure 11:
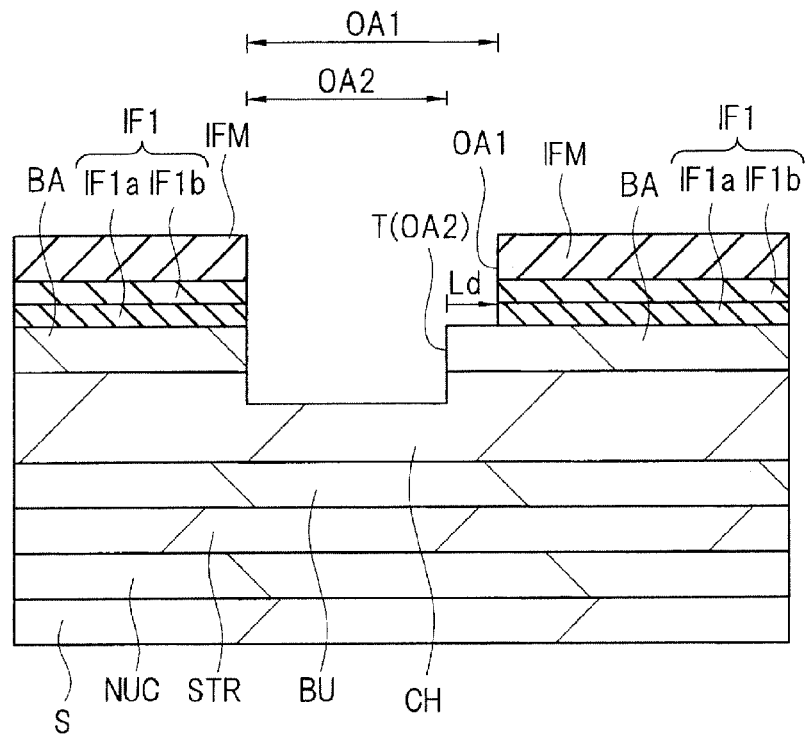
FIG. 11 is a cross sectional view showing the semiconductor device of First Embodiment during a manufacturing step, and showing the manufacturing step following FIG. 10.
Figure 12:
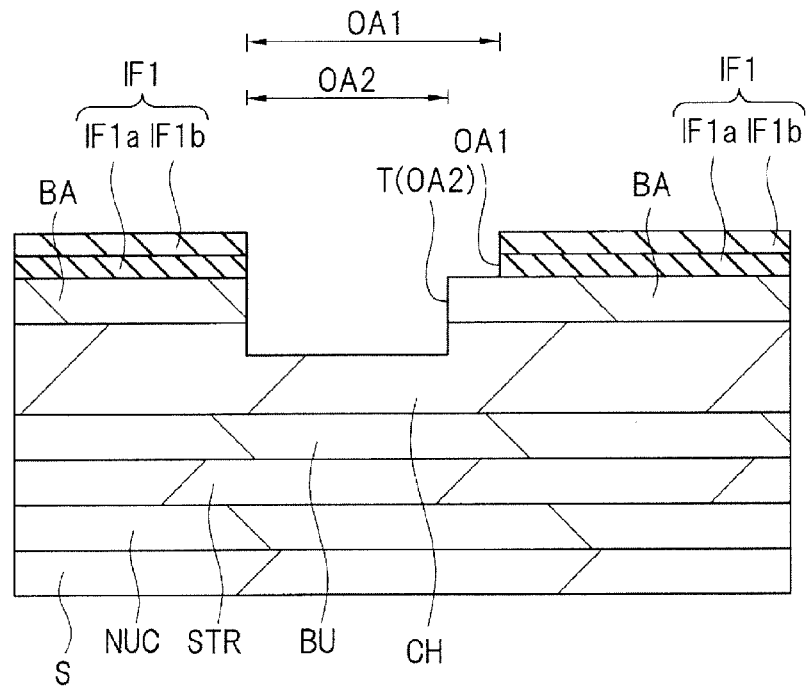
FIG. 12 is a cross sectional view showing the semiconductor device of First Embodiment during a manufacturing step, and showing the manufacturing step following FIG. 11.

Then, as shown in FIG. 11, using the masking insulation film IFM as a mask, the insulation film IF1 is etched. As a result, the end of the insulation film IF1 on the trench T side is set back in one direction (the right-hand side in FIG. 11) by the distance Ld. This direction is the drain electrode DE side described later. Then, as shown in FIG. 12, the masking insulation film IFM is removed by etching.

Figure 13:
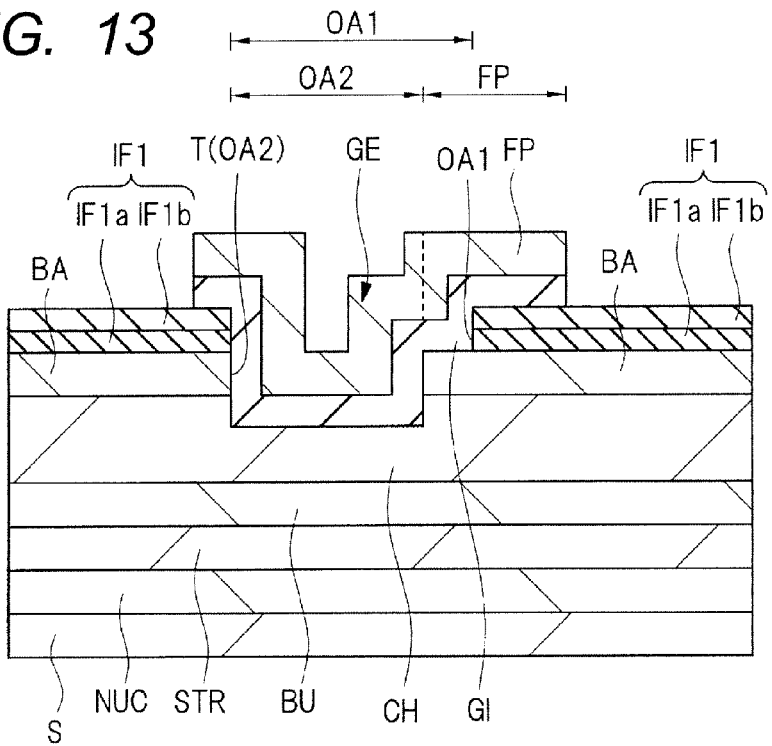
FIG. 13 is a cross sectional view showing the semiconductor device of First Embodiment during a manufacturing step, and showing the manufacturing step following FIG. 12.

Then, as shown in FIG. 13, over the insulation film IF1 including the inside of the trench T and the exposed portion of the barrier layer BA, there is formed a gate insulation film GI. For example, as the gate insulation film GI, alumina (aluminum oxide film, $Al_2O_3$) is deposited over the insulation film IF1 including the inside of the trench T and the exposed portion of the barrier layer BA using an ALD (Atomic Layer Deposition) method or the like. After alumina deposition, a heat treatment at 700° C. for 10 minutes is performed.

As the gate insulation film GI, there may be used a silicon oxide film or a high dielectric constant film higher in dielectric constant than a silicon oxide film other than alumina (alumina-containing film). As the high dielectric constant film, there may be used a hafnium oxide film ($HfO_2$ film). Further, as the high dielectric constant films, there may be used other hafnium type insulation films such as a hafnium aluminate film, a HfON film (hafnium oxynitride film), a HfSiO film (hafnium silicate film), a HfSiON film (hafnium silicon oxynitride film), and a HfAlO film.

Then, over the gate insulation film GI in the inside of the trench T, there is formed a gate electrode GE. For example, over the gate insulation film GI, as a conductive film, for example, a TiN (titanium nitride) film is deposited using a sputtering method or the like. Then, using a photolithography technology and an etching technology, the TiN film and the alumina are patterned, thereby to form the gate electrode GE.

During the patterning, the gate electrode GE is patterned in a shape projecting in one direction (the right hand side in FIG. 13, the drain electrode DE side). In other words, patterning is performed so as to provide a field plate electrode FP as a part of the gate electrode GE. Further, during the patterning, the Si-rich silicon nitride film IF1b (insulation film IF1) situated at the underlying layer of the gate electrode GE plays a role of an etching buffer material.

Figure 14:
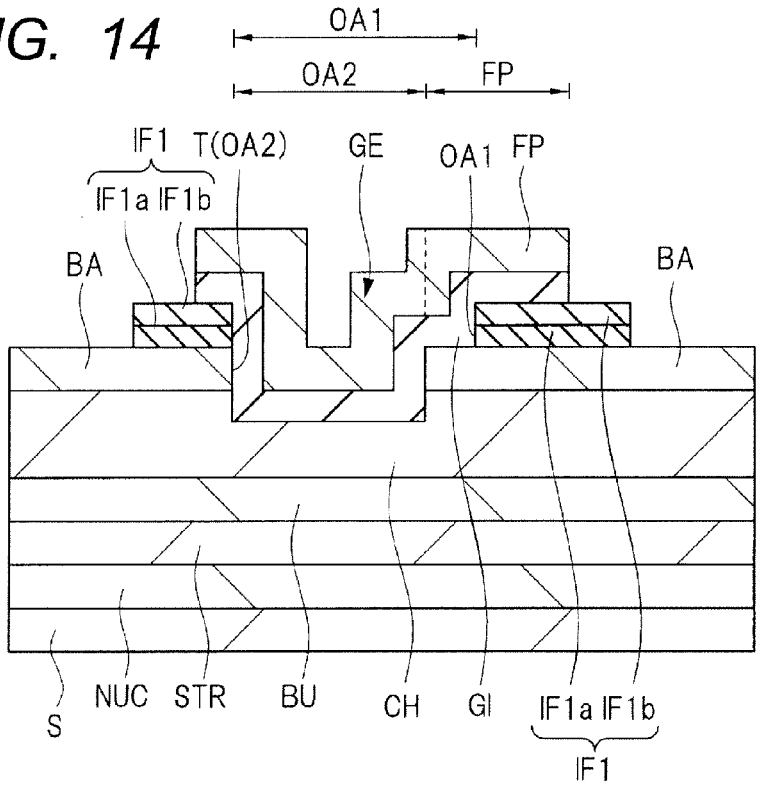
FIG. 14 is a cross sectional view showing the semiconductor device of First Embodiment during a manufacturing step, and showing the manufacturing step following FIG. 13.

Then, as shown in FIG. 14, there is removed the insulation film IF1 in each formation region of the source electrode SE and the drain electrode DE described later. Using a photolithography technology and an etching technology, the insulation film IF1 is patterned. This results in exposure of the barrier layer BA in each formation region of the source electrode SE and the drain electrode DE.

Figure 15:
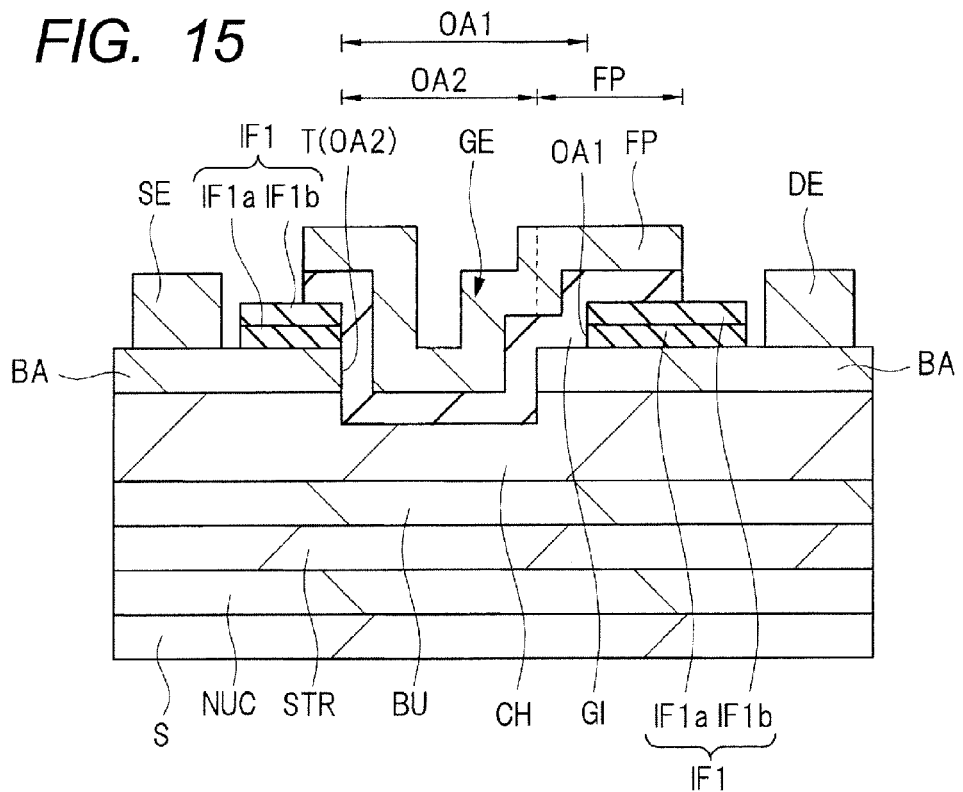
FIG. 15 is a cross sectional view showing the semiconductor device of First Embodiment during a manufacturing step, and showing the manufacturing step following FIG. 14.

Then, as shown in FIG. 15, over the portions of the barrier layer BA on the opposite sides of the gate electrode GE, there are formed the source electrode SE and the drain electrode DE, respectively. The source electrode SE and the drain electrode DE are formed using, for example, a lift-off method. For example, in other regions than the formation regions of the source electrode SE and the drain electrode DE, there is formed a photoresist film (not shown). Then, over the photoresist film, there is formed a metal film. As a result, in each formation region of the source electrode SE and the drain electrode DE, a metal film is formed directly over the barrier layer BA. On the other hand, in other regions, a metal film is formed over the photoresist film.

The metal film is formed of, for example, an Al/Ti film. For example, a lamination film formed of a titanium (Ti) film and an aluminum (Al) film thereover is deposited using a vapor deposition method or the like. Then, for example, a heat treatment at 550° C. for about 30 minutes is performed. By the heat treatment, the contact at the interface between the metal film and a GaN type semiconductor becomes an ohmic contact. Then, as described previously, using a lift-off method, the Al/Ti film is left only in the formation regions of the source electrode SE and the drain electrode DE.

Figure 16:
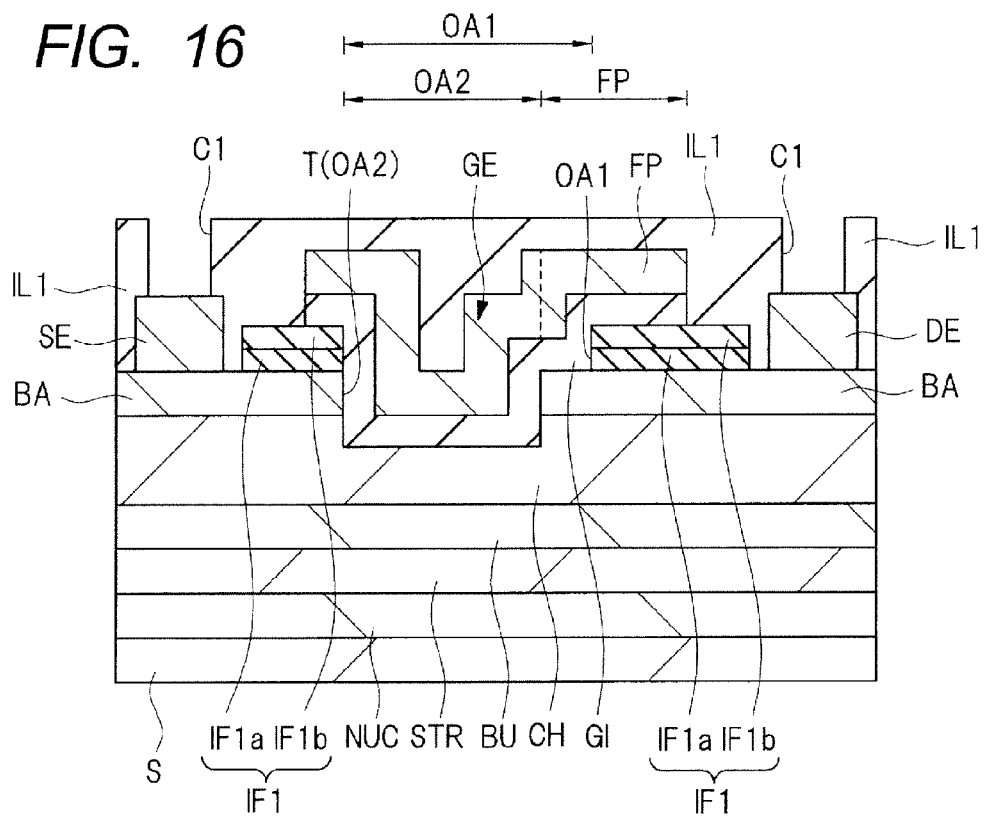
FIG. 16 is a cross sectional view showing the semiconductor device of First Embodiment during a manufacturing step, and showing the manufacturing step following FIG. 15.

Then, as shown in FIG. 16, over the gate electrode GE, the source electrode SE, and the drain electrode DE, there is formed an insulation layer IL1. Over the gate electrode GE, the insulation film IF1, and the barrier layer BA, as the insulation layer IL1, for example, a silicon oxide film is formed using a CVD method or the like. Then, using a photolithography technology and an etching technology, contact holes C1 are formed in the insulation layer IL1. The contact holes C1 are arranged over the source electrode SE and the drain electrode DE, respectively.

Figure 17:
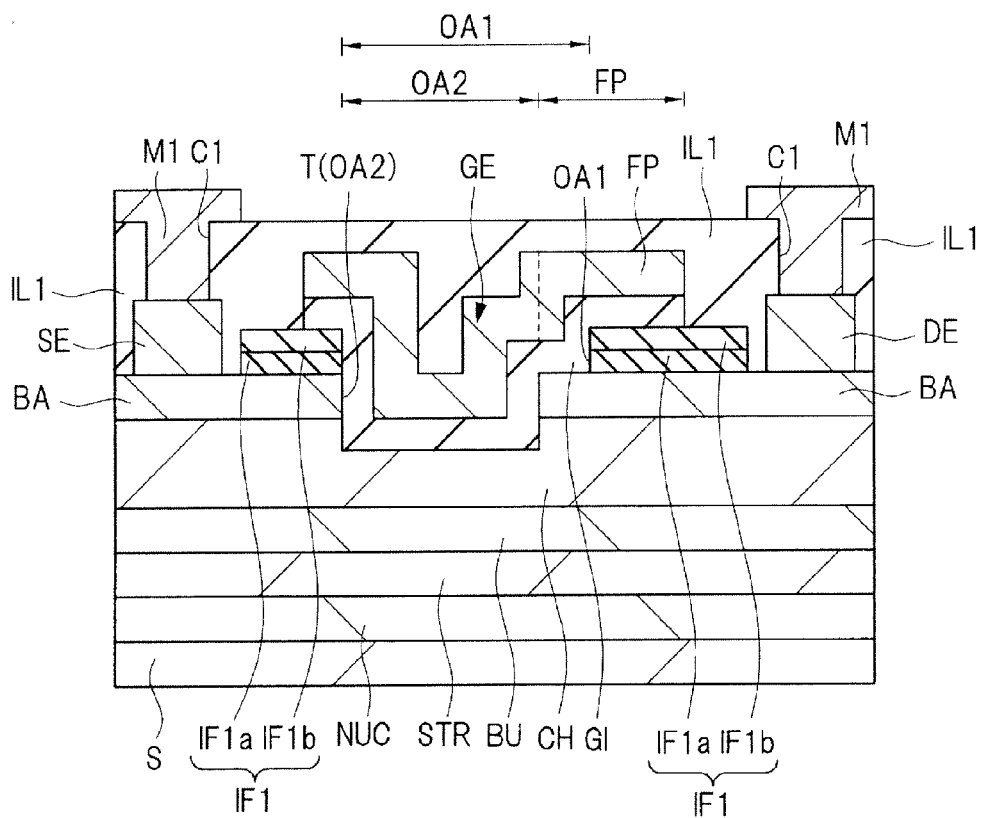
FIG. 17 is a cross sectional view showing the semiconductor device of First Embodiment during a manufacturing step, and showing the manufacturing step following FIG. 16.

Then, as shown in FIG. 17, over the insulation layer IL1 including the insides of the contact holes C1, an aluminum alloy film is deposited using a sputtering method or the like. Then, using a photolithography technology and an etching technology, the aluminum alloy film is patterned, thereby to form a wire M1. The wire M1 is coupled with the source electrode SE or the drain electrode DE via a plug in the contact hole C1.

Then, over the insulation layer IL1 including over the wire M1, there is formed an insulation layer (which is also referred to as a cover film or a surface protective film) IL2. For example, over the insulation layer IL1, as the insulation layer IL2, for example, a silicon oxynitride (SiON) film is deposited using a CVD method or the like.

By the steps up to this point, it is possible to form the semiconductor device shown in FIG. 1. Incidentally, the steps are examples. The semiconductor device of the present embodiment may be manufactured by other steps than the foregoing steps.

Figure 18:
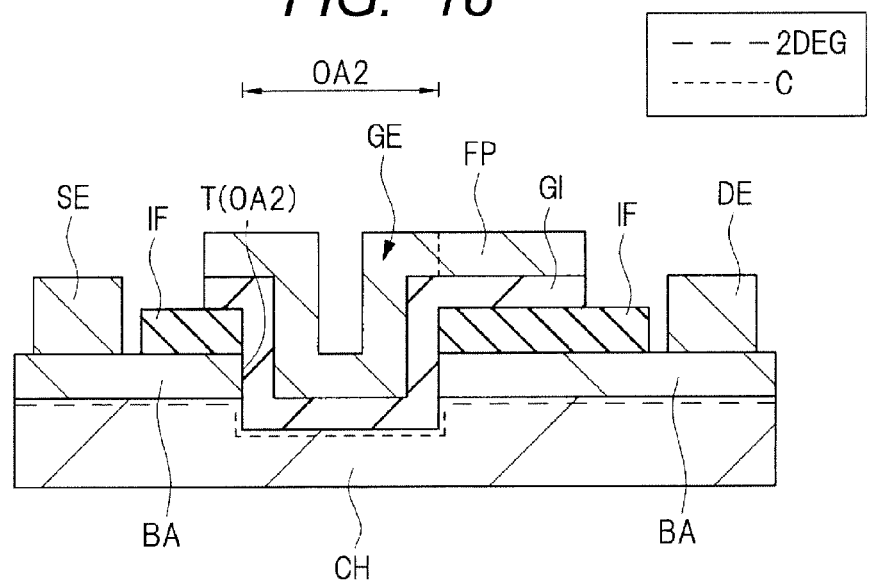
FIG. 18 is a cross sectional view showing a configuration of a semiconductor device of Comparative Example.

Thus, in accordance with the present embodiment, the insulation film IF1 is formed in a lamination structure of the Si-rich silicon nitride film IF1b, and the N-rich silicon nitride film IF1a situated thereunder. This can improve the characteristics of the semiconductor device. Specifically, as compared with a semiconductor device shown in FIG. 18, the breakdown voltage can be improved. Further, the etching resistance can be improved. Still further, the collapse can be suppressed. FIG. 18 is a cross sectional view showing a configuration of a semiconductor device of Comparative Example. In FIG. 18, the insulation film (protective film) IF over the barrier layer BA is formed of a monolayered silicon nitride film.

Below, with reference to the characteristics of the silicon nitride film, the advantageous effects will be further described in details.

Composition Ratio of Silicon Nitride Film

The characteristics of the silicon nitride film are roughly characterized by the composition ratio [N]/[Si] of nitrogen (N) to silicon (Si) (or the composition ratio [Si]/[N] of silicon (Si) to nitrogen (N)). Incidentally, in this section, a description will be given with the composition ratio [N]/[Si] as an indicator. In accordance with the composition ratio [N]/[Si], even in the case of amorphous Si, the value of the composition ratio [N]/[Si] does not diverge infinitely. For this reason, the composition region of the silicon nitride film is more easily broadly defined than with the inverse (composition ratio [Si]/[N]).

The deposition methods of a silicon nitride film include a sputtering method and a CVD method. The sputtering methods include an ECR sputtering method and the like. Whereas, the CVD methods include a PECVD (Plasma Enhancement CVD) method, a thermal CVD method, a catalytic chemical vapor deposition (Cat-CVD) method, a surface wave plasma CVD method, and the like. For deposition using the ECR sputtering method, a complicatedly configured device is used. For this reason, deposition using the CVD method is frequently adopted for mass production.

For example, in the CVD method, as a raw material gas, there is used a mixed gas of a compound gas of silicon and a compound gas of nitrogen. Specifically, there are used a mixed gas of $SiH_4$ and $NH_3$, a mixed gas of $SiH_4$ and $N_2$, a mixed gas of $SiH_4$, $NH_3$, and $N_2$, and the like. Alternatively, the gas obtained by diluting each of the mixed gases with hydrogen ($H_2$) or argon (Ar) may be used as a raw material gas.

Figure 19A:
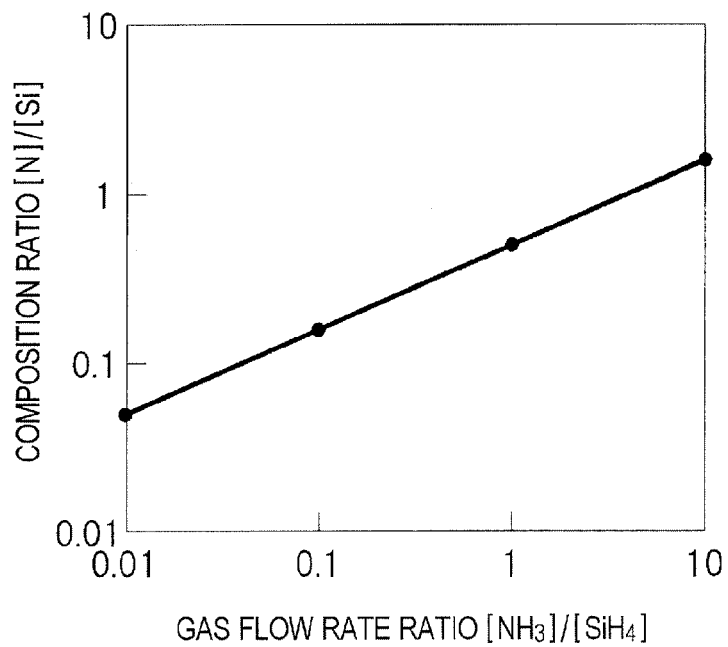
FIG. 19A is a graph showing the relation between the gas flow rate ratio [$NH_3$]/[$SiH_4$] and the composition ratio [N]/[Si]

FIG. 19A is a graph showing the relation between the gas flow rate ratio $[NH_3]/[SiH_4]$ and the composition ratio $[N]/[Si]$. The vertical axis represents the composition ratio $[N]/[Si]$, and the horizontal axis represents the gas flow rate ratio $[NH_3]/[SiH_4]$.

The graph shows the relation between the composition ratio $[N]/[Si]$ of nitrogen (N) to silicon (Si) in the deposited film and the gas flow rate ratio $[NH_3]/[SiH_4]$ when a silicon nitride film is deposited using a mixed gas of $SiH_4$ and $NH_3$ as a raw material gas. Specifically, under the conditions of a RF power or 13.56 MHz and 195 W, and a deposition temperature of 285° C., using a gas obtained by diluting a mixed gas of $SiH_4$ and $NH_3$ with Ar as a raw material gas, a deposited film was formed by a PECVD method. The content of N (nitrogen) or Si (silicon) in the deposited film can be analyzed directly by a RBS (Rutherford Backscattering Spectroscopy) method or an ERD (Elastic Recoil Detection) method, or indirectly by a XPS method or a refractive index measuring method.

Generally, the composition ratio $[N]/[Si]$ and the gas flow rate ratio $[NH_3]/[SiH_4]$ have the relation shown in the following equation (1).

[Mathematical Expression 1]

$$\frac{[N]}{[Si]} = 10^{-0.3} \cdot \sqrt{\frac{[NH_3]}{[SiH_4]}} \quad (1)$$

As indicated from FIG. 19A and the equation (1), with an increase in content of $NH_3$ in the raw material gas, the ratio of nitrogen (N) in the film increases. Whereas, with an increase in content of $SiH_4$ in the raw material gas, the ratio of silicon (Si) in the film increases.

Thus, with the CVD method, by controlling the gas flow rate ratio $[NH_3]/[SiH_4]$, it is possible to adjust the composition ratio $[N]/[Si]$ of the deposited film with precision.

For example, when a silicon nitride film with a prescribed composition ratio $[N]/[Si]$ is formed, first, from the graph of FIG. 19A, the gas flow rate ratio $[NH_3]/[SiH_4]$ is determined. Then, with the gas flow rate ratio $[NH_3]/[SiH_4]$, deposition is performed. As a result, it is possible to form a silicon nitride film with a prescribed composition ratio $[N]/[Si]$.

Further, when a silicon nitride film is deposited with a prescribed gas flow rate ratio $[NH_3]/[SiH_4]$, it has been indicated as follows. Although there are some error due to devices, variations within the wafer plane and the variations among lots fall within the range of ±1% or less whether evaluation is performed based on the composition ratio $[N]/[Si]$, or based on the composition ratio $[Si]/[N]$.

Thus, it has been proved as follows: based on the gas flow rate ratio $[NH_3]/[SiH_4]$, the composition ratio of the silicon nitride film can be adjusted with precision.

However, when the silicon nitride film undergoes a heat history at higher temperatures than during deposition after deposition (after film formation), the composition ratio changes toward a slightly Si-rich ratio. For this reason, preferably, in consideration of the heat history during manufacturing steps, the gas flow rate ratio [NH$_3$]/[SiH$_4$] (the composition ratio [N]/[Si] of the deposited film during deposition) is adjusted.

Specifically, during the manufacturing steps of the semiconductor device, the same heat history as the heat history is applied to a silicon nitride film over a dummy silicon substrate. Thus, the gas flow rate ratio [NH$_3$]/[SiH$_4$] (the composition ratio [N]/[Si] of the deposited film during deposition) is adjusted so as to obtain the composition ratio [N]/[Si] of the objective silicon nitride film from the composition ratio [N]/[Si] of the silicon nitride film.

Further, when the objective silicon nitride film has a composition ratio richer in N than Si$_3$N$_4$ with the stoichiometric composition (composition ratio [N]/[Si]=4/3), nitrogen tends to release in the form of a nitrogen gas (N$_2$) from the inside of the film. For this reason, the gas flow rate ratio [NH$_3$]/[SiH$_4$] (the composition ratio [N]/[Si] of the deposited film during deposition) is adjusted in expectation of the amount of N to volatilize.

Hydrogen in the Composition of Silicon Nitride Film

Then, a description will be given to hydrogen (H) in the silicon nitride film. As described previously, with deposition of a silicon nitride film by a CVD method, a hydrogen (H) compound is contained as a raw material gas. Accordingly, hydrogen (H) is present in the film. For example, in a thesis or the like, the film may be described as "α-SixNy:H" in consideration of the H. The H is contained in the form of a N—H bond or a Si—H bond resulting from chemical covalent bond with the constituent elements of the film. The H is contained in a content of at least 1 atm % or more in the film.

Figure 19B:
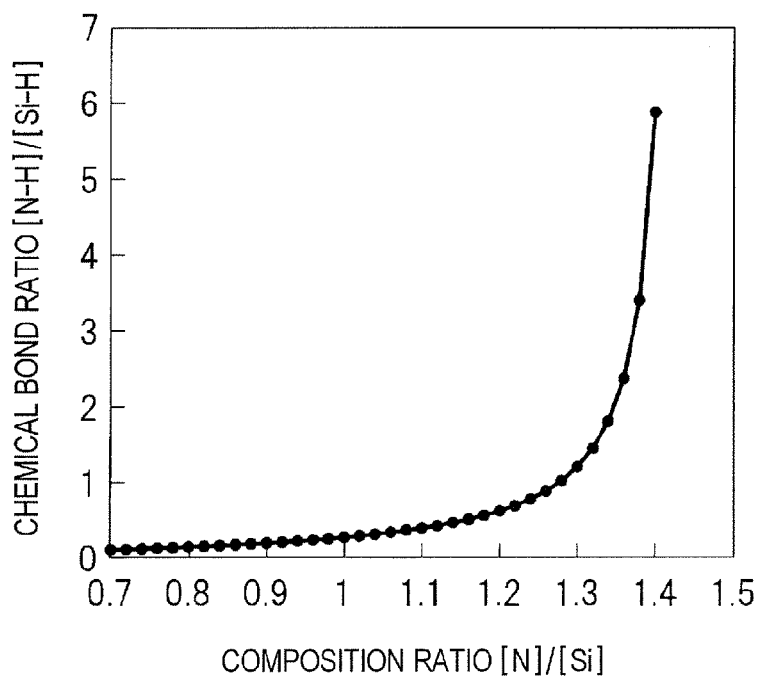
FIG. 19B is a graph showing the relation between the composition ratio [N]/[Si] and the chemical bond ratio ([N—H]/[Si—H]) between the N—H bonds and the Si—H bonds in the silicon nitride film.

The volume density of the N—H bonds or the Si—H bonds in the film can be subjected to quantitative analysis by a method such as a Fourier transform infrared spectroscopy (FT-IR). FIG. 19B is a graph showing the relation between the composition ratio [N]/[Si] and the chemical bond ratio ([N—H]/[Si—H]) of the N—H bonds and the Si—H bonds in the silicon nitride film. The vertical represents the chemical bond ratio [N—H]/[Si—H], and the horizontal axis represents the composition ratio [N]/[Si].

As shown in FIG. 19B, with an increase in composition ratio of Si in the silicon nitride film, namely, with a change toward a Si-rich composition, the Si—H bonds in the film tend to increase. Further, the chemical bond ratio ([N—H]/[Si—H]) of the N—H bonds and the Si—H bonds in the silicon nitride film is represented by the following equation (2) from the graph of FIG. 19B.

[Mathematical Expression 2]

$$\frac{[N-H]}{[Si-H]} = \frac{0.084}{1/\frac{[N]}{[Si]} - 0.70} \quad (2)$$

The Si—H bond in the silicon nitride film is relatively unstable, and tends to be dissociated by heat, electrical field, light, or the like. Then, the dangling bond of a Si atom after dissociation may be a trapping site of electrons. Accordingly, when the composition ratio of Si in the silicon nitride film increases, namely, the Si—H bonds in the film increase, collapse tends to occur. Therefore, by configuring the lower layer of the insulation film (protective film) IF1 as a N-rich silicon nitride film IF1a, it is possible to suppress collapse.

Incidentally, the silicon nitride film may contain therein oxygen mixed in the chamber during deposition. However, mixing of oxygen in the film inhibits the collapse suppressing effect. For this reason, in the present application, a description will be given assuming that mixing of oxygen is minimized.

Identification of Composition Ratio of Silicon Nitride Film

Figure 20:
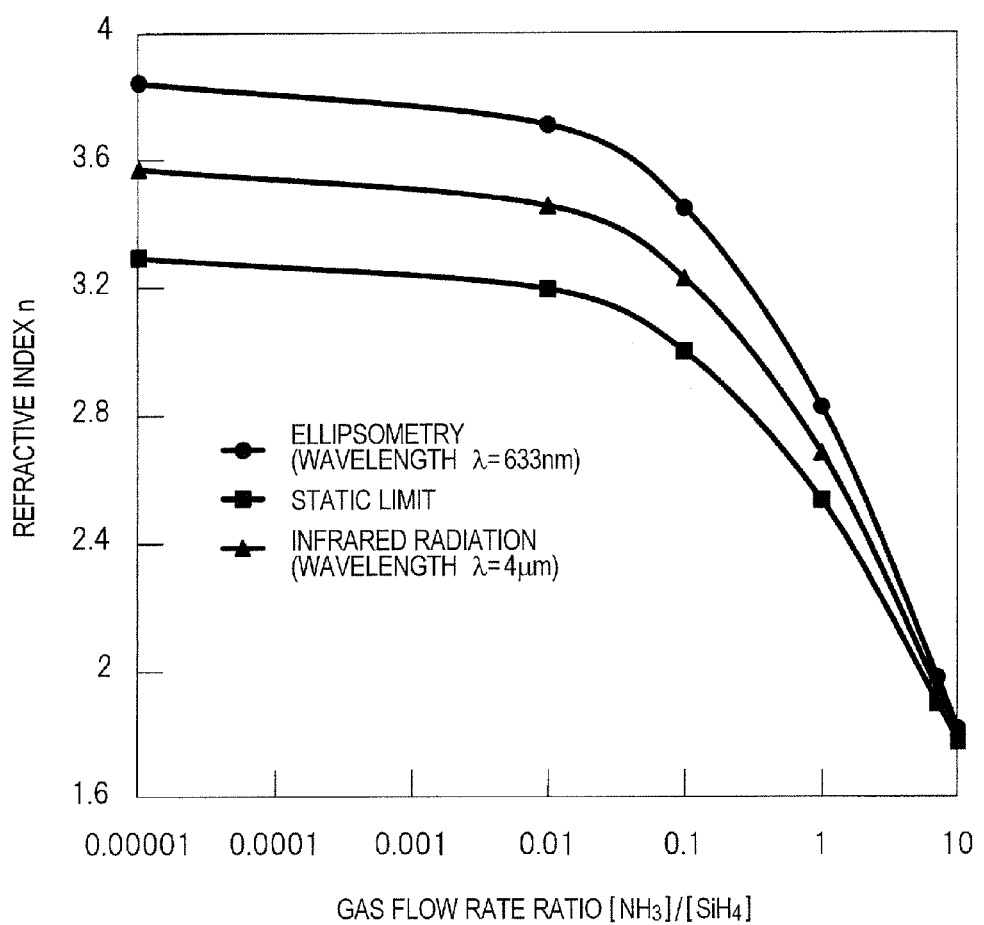
FIG. 20 is a graph showing the relation between the gas flow rate ratio [$NH_3$]/[$SiH_4$] and the refractive index n.

FIG. 20 is a graph showing the relation between the gas flow rate ratio [NH$_3$]/[SiH$_4$] and the refractive index n. The vertical axis represents the refractive index n, and the horizontal axis represents the gas flow rate ratio [NH$_3$]/[SiH$_4$]. As shown in FIG. 20, with a change in gas flow rate ratio [NH$_3$]/[SiH$_4$], the refractive index n of the deposited film changes. The refractive index n takes slightly different values according to the wavelength of light used for the measurement. With a decrease in gas flow rate ratio [NH$_3$]/[SiH$_4$], the refractive index n increases. As lights, infrared radiation (wavelength λ=4 μm), DC limit (Static Limit), and visible light (λ=633 nm) ellipsometry were used to measure the refractive index n. Incidentally, the refractive indexes (n) of amorphous silicon and Si$_3$N$_4$ with a stoichiometric composition were as follows. The refractive index with infrared radiation of amorphous silicon was 3.58, the refractive index with DC limit thereof was 3.3, and the refractive index with visible light ellipsometry thereof was 3.85. Whereas, the refractive index with infrared radiation of Si$_3$N$_4$ was 1.94, the refractive index with DC limit was 1.9, and the refractive index with visible light ellipsometry was 1.98.

As shown in FIG. 20, the gas flow rate ratio [NH$_3$]/[SiH$_4$] and the refractive index n are related to each other. Further, as shown in FIG. 19A, the gas flow rate ratio [NH$_3$]/[SiH$_4$] and the composition ratio [N]/[Si] of the silicon nitride film are related to each other. Accordingly, by measuring the refractive index n, it is possible to know the composition ratio [N]/[Si] of the silicon nitride film.

Figure 21:
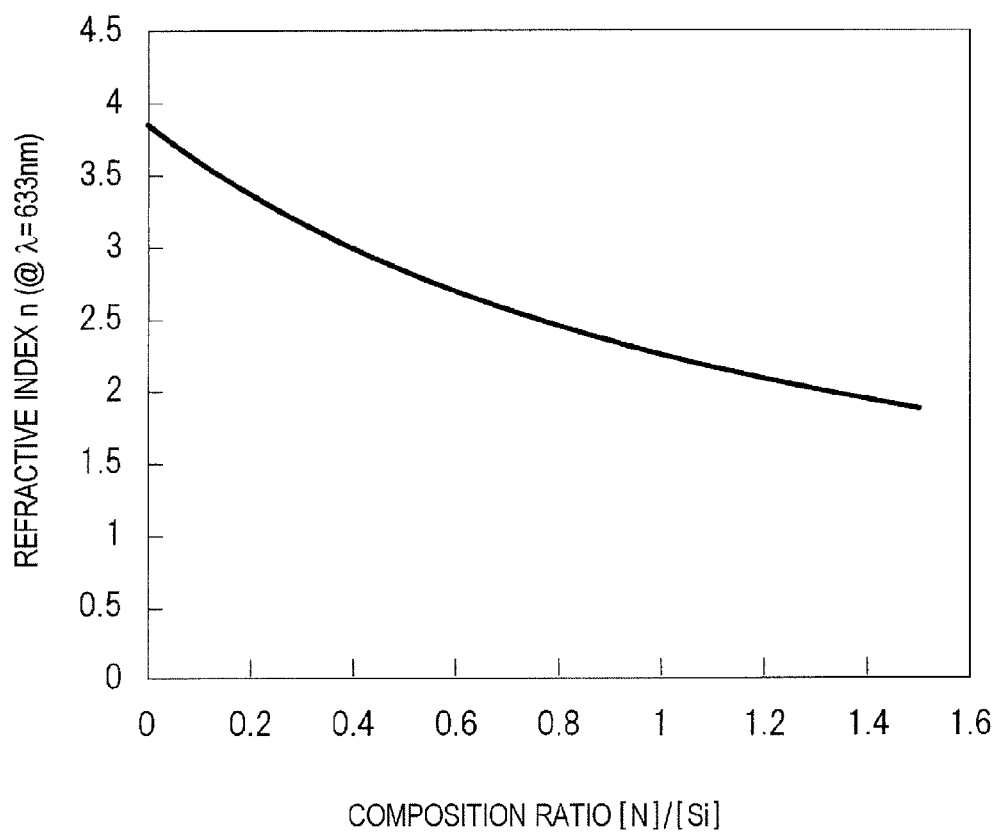
FIG. 21 is a graph showing the relation between the composition ratio [N]/[Si] and the refractive index n ($\lambda$=633 nm) of the silicon nitride film.

The refractive index n is generally measured with visible light ellipsometry (λ=633 nm). FIG. 21 is a graph showing the relation between the refractive index n (λ=633 nm) and the composition ratio [N]/[Si] of the silicon nitride film. The vertical axis represents the refractive index n, and the horizontal axis represents the composition ratio [N]/[Si]. As shown in FIG. 21, the refractive index n has a composition ratio dependency. The refractive index n and the composition ratio have the relation represented by the following equation (3).

[Mathematical Expression 3]

$$n = \frac{n(Si) + \left(\frac{3[N]}{4[Si]}\right)\{2n(Si_3N_4) - n(Si)\}}{1 + \frac{3[N]}{4[Si]}} \quad (3)$$

Thus, the value of the refractive index n, and FIG. 21 or the equation (3) can provide the composition ratio [N]/[Si] of the silicon nitride film. Further, when attention is given to the relation, the composition ratio can be derived from the refractive indexes n described in, for example, various literatures to consider the relation between the characteristic and the composition ratio.

Characteristics of Silicon Nitride Film—Etching Resistance

Then, for the resulting silicon nitride film, the following measurements were performed, and the properties were studied. Herein, in the following study, a description will be given using the composition ratio [Si]/[N] as an indicator. This is for the following reason. With the composition ratio [Si]/[N], 3/4 which is the stoichiometric composition ratio [Si]/[N] can be expressed as "0.75" in a rational number of nonrepeating decimal. This and other points are convenient for discussing the characteristics of the silicon nitride film with a composition close to the stoichiometric composition.

Figure 22:
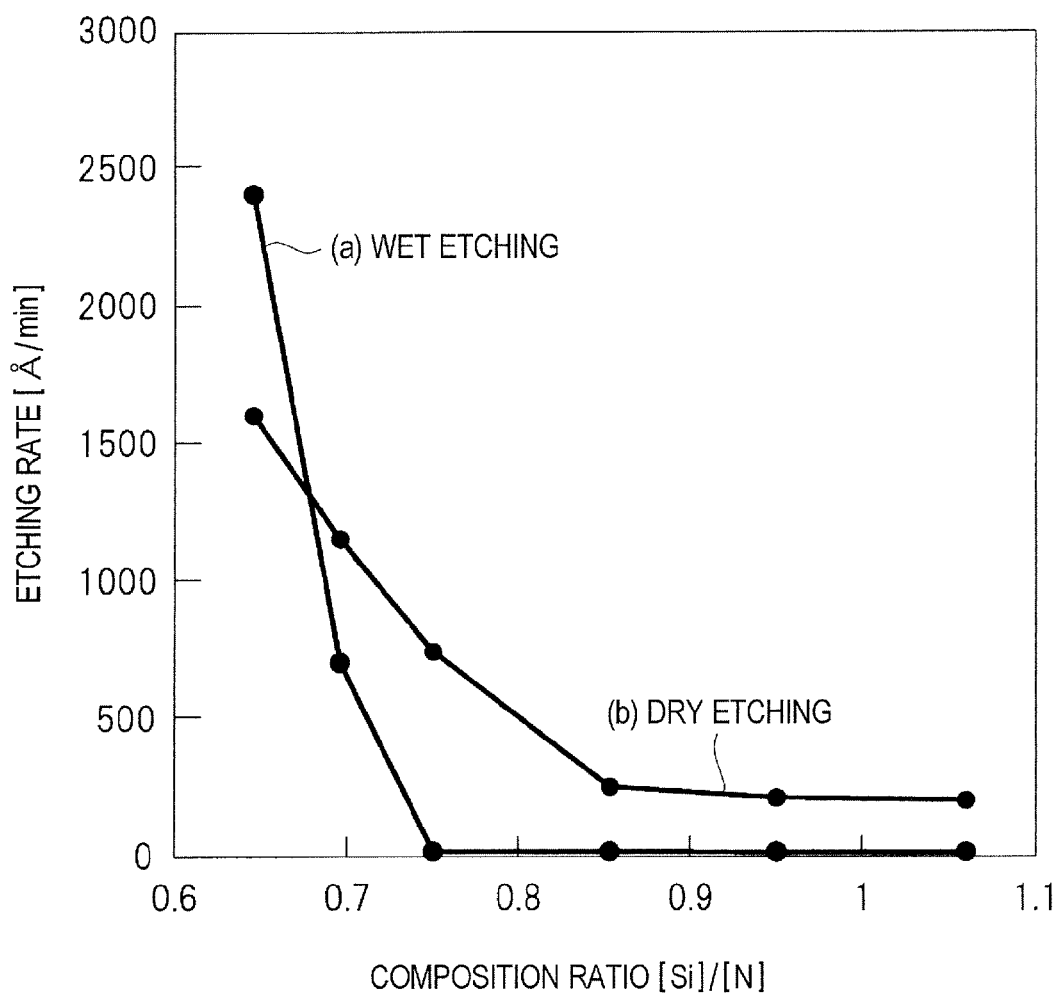
FIG. 22 is a graph showing the relation between the composition ratio [Si]/[N] and the etching rate of the silicon nitride film.

FIG. 22 is a graph showing the relation between the composition ratio [Si]/[N] and the etching rate of the silicon nitride film. The vertical axis represents the etching rate [angstrom/min], and the horizontal axis represents the composition ratio [Si]/[N]. The graph (a) represents the case of wet etching. The graph (b) represents the case of dry etching. For wet etching, room-temperature 130 buffered hydrofluoric acid (130BHF) was used. The 130BHF includes a 5% $(NH_4)^+$ $(HF_2)^-$ salt, 37% ammonium fluoride ($NH_4F$), and 58% water ($H_2O$). Further, in dry etching, as the etching gas, a mixed gas of $BCl_3$, $Cl_2$, and Ar (chlorine type gas) was used, and was used at a ratio of $BCl_3:Cl_2:Ar=40:10:50$ sccm. Thus, under the conditions of 0.5 Pa and 150 W, dry etching was performed.

As shown in FIG. 22, when the composition ratio [Si]/[N] is a composition ratio of 0.75 or less, the wet etching rate is large. Further, the dry etching rate is also large. This indicates as follows: in either etching of wet etching and dry etching, the etching resistance is small. On the other hand, in the case of a Si-rich composition ratio of a composition ratio [Si]/[N] of 0.85 or more, the wet etching rate is small. Further, the dry etching rate is also small. This indicates as follows: in either etching of wet etching and dry etching, the etching resistance is large. Accordingly, by configuring the upper layer of the insulation film (protective film) IF1 as a Si-rich silicon nitride film IF1b, it is possible to improve the etching resistance.

Characteristics of Silicon Nitride Film—Conductivity and Insulation Property

Figure 23:
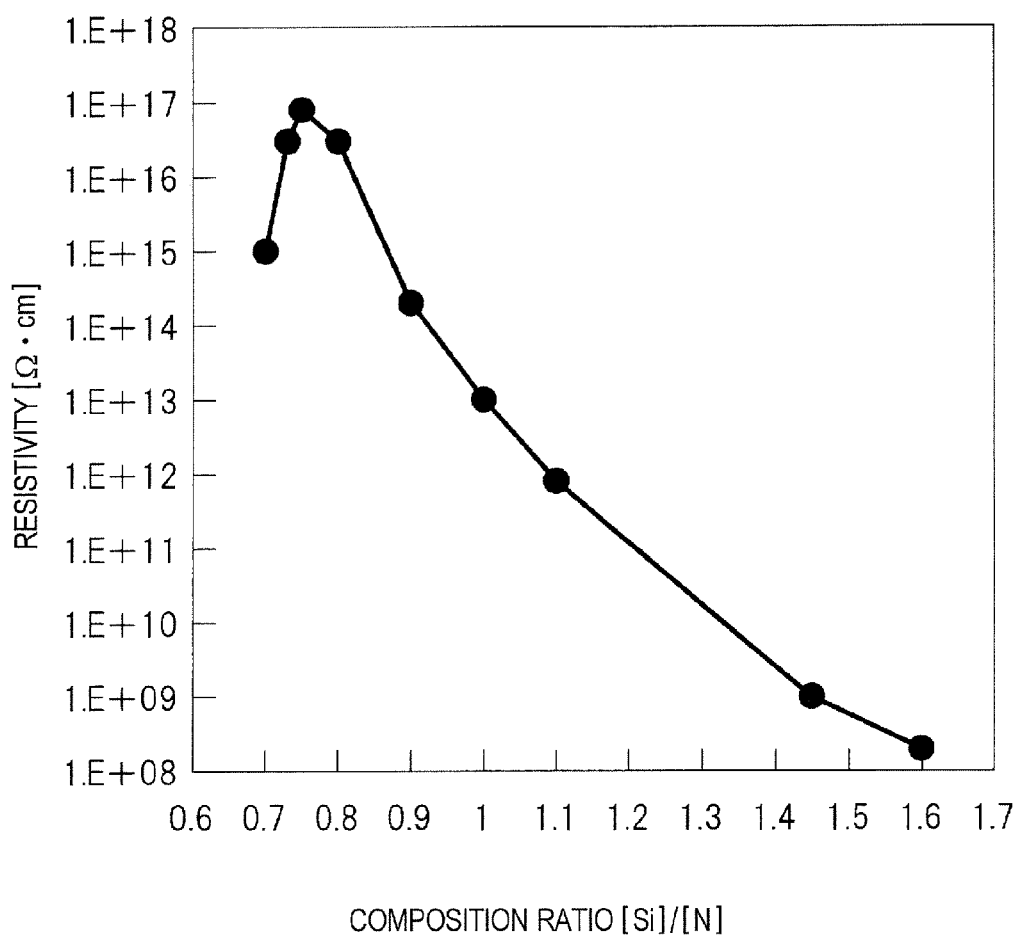
FIG. 23 is a graph showing the relation between the composition ratio [Si]/[N] and the resistivity of the silicon nitride film.

FIG. 23 is a graph showing the relation between the composition ratio [Si]/[N] and the resistivity of the silicon nitride film. The vertical axis represents the resistivity [Ω·cm], and the horizontal axis represents the composition ratio [Si]/[N]. The resistivity is the resistivity when the silicon nitride film is applied with an electric field of 2 [MV/cm].

As shown in FIG. 23, the resistivity when the composition ratio [Si]/[N] is 0.75 which is the stoichiometric composition ratio is maximum. The value is about 8.E+16 ($8\times10^{16}$) In contrast, it is indicated as follows: when the composition ratio [Si]/[N] deviates from 0.75, the resistivity of the silicon nitride film drastically decreases, and the silicon nitride film becomes conductive.

This also indicates as follows: by making the silicon nitride film Si-rich, it is possible to make the silicon nitride film conductive.

Figure 24:
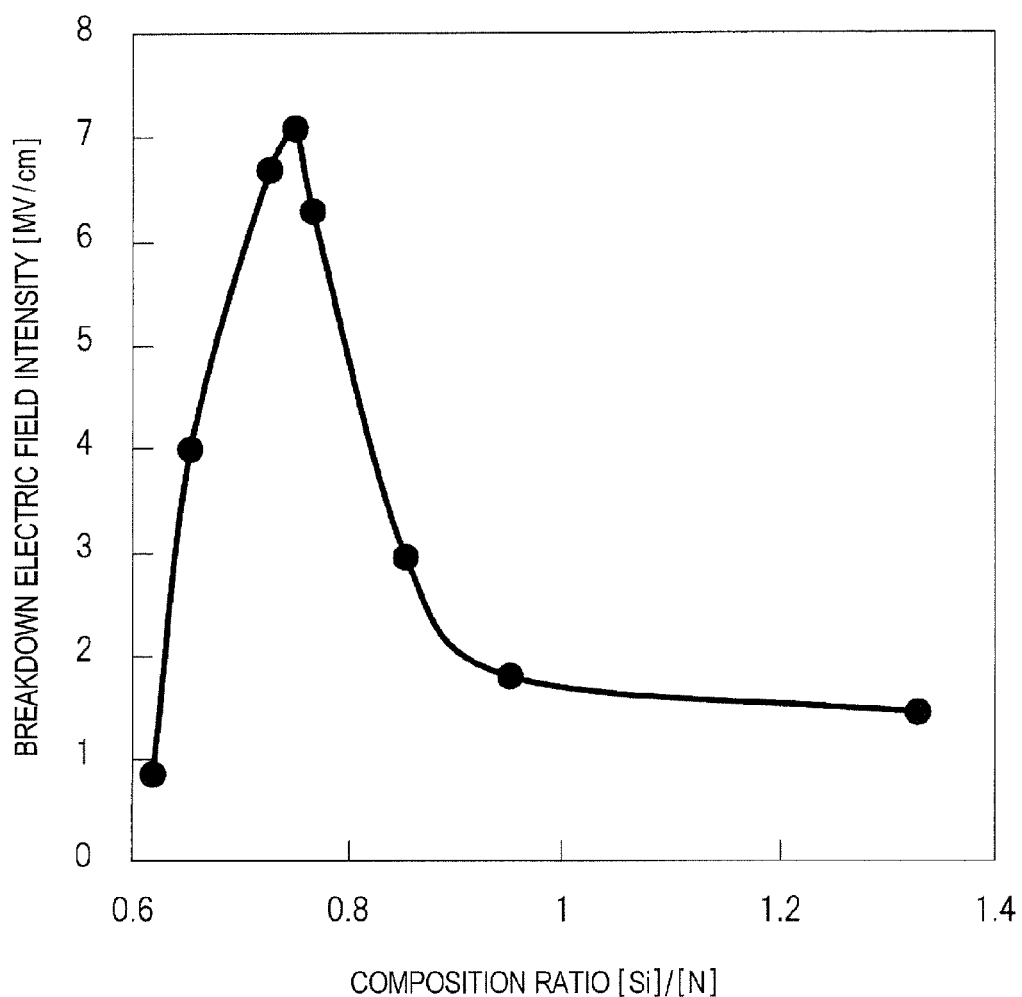
FIG. 24 is a graph showing the relation between the composition ratio [Si]/[N] and the breakdown electric field intensity of the silicon nitride film.

FIG. 24 is a graph showing the relation between the composition ratio [Si]/[N] and the breakdown electric field intensity of the silicon nitride film. The vertical axis represents the breakdown electric field intensity [MV/cm], and the horizontal axis represents the composition ratio [Si]/[N]. The film thickness of the silicon nitride film is set at 100 nm. Thus, the electric field when a current of 10 $\mu A/cm^2$ passes therethrough is defined as the breakdown electric field.

As shown in FIG. 24, the breakdown electric field intensity when the composition ratio [Si]/[N] is 0.75 which is the stoichiometric composition ratio is maximum. The value is about 7 [MV/cm]. In contrast, it is indicated as follows: whether the composition ratio [Si]/[N] deviates from 0.75, and the composition ratio [Si]/[N] is smaller than 0.75, or the composition ratio [Si]/[N] is larger than 0.75, the breakdown electric field intensity decreases. Thus, when the composition ratio [Si]/[N] is in the vicinity of 0.75 which is the stoichiometric composition ratio, the breakdown electric field becomes maximum. With the film composition, the insulation property of the film is the highest. Further, when the composition ratio [Si]/[N] deviates from 0.75, the breakdown electric field intensity decreases. Accordingly, for example, by allowing the lower layer of the insulation film (protective film) IF1 to have a film composition in the vicinity of 0.75 which is the stoichiometric composition ratio, it is possible to ensure the breakdown electric field intensity of the film itself.

Characteristic of Silicon Nitride Film—Collapse

Figures 25, 26:
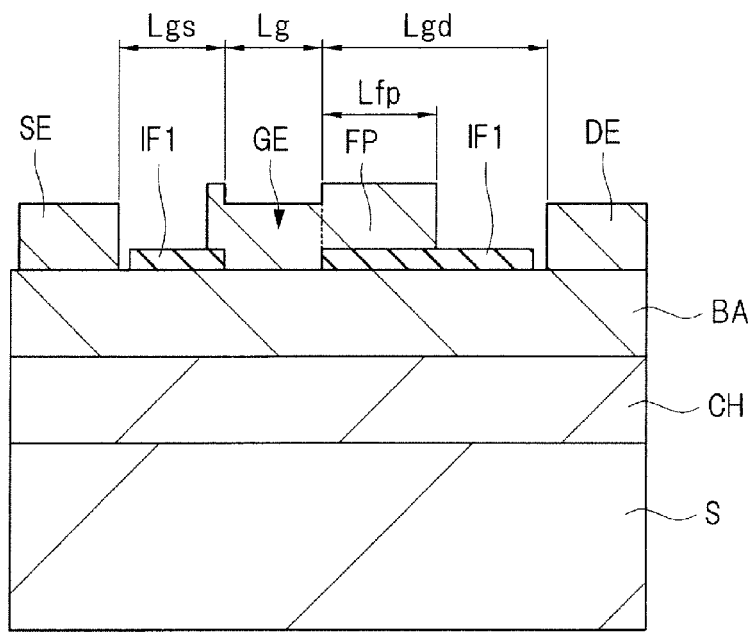
FIG. 25 is a cross sectional view showing a configuration of the semiconductor device studied in First Embodiment.
FIG. 26 is a table showing various parameters of semiconductor devices of Type-I and Type-II.

FIG. 25 is a cross sectional view showing a configuration of the semiconductor device studied in the present embodiment. The semiconductor device shown in FIG. 25 is a planar type FET not having a gate recess structure, and adopting a Schottky gate.

In the semiconductor device shown in FIG. 25, over the substrate S, there are sequentially formed a channel layer CH and a barrier layer BA. Over the barrier layer BA, there is formed an insulation film IF1 having an opening region (Lg). Then, the gate electrode GE is formed over the insulation film IF1 and over the barrier layer BA exposed from the opening region. Lg denotes the width of the opening region, and corresponds to the gate length. Lgs denotes the distance between the end of the opening region (Lg) on the source electrode SE side and the source electrode SE. Lgd denotes the distance between the end of the opening region (Lg) on the drain electrode DE side and the drain electrode DE. Lfp denotes the length of the field plate electrode FP. Incidentally, Wg described later denotes the gate width.

For the semiconductor device of the structure shown in FIG. 25, a study was conducted on two types of semiconductor devices of Type-I and Type-II shown in FIG. 26. FIG. 26 is a table showing various parameters of the semiconductor devices of Type-I and Type-II. As shown in FIG. 26, the semiconductor device of Type-I is a large semiconductor device not having the field plate electrode FP. The semiconductor device of such a type is easy to evaluate for the breakdown voltage limit. Whereas, the semiconductor device of Type-II is a small semiconductor device having the field plate electrode FP. The semiconductor device of such a type is easy to evaluate for the effect of the field plate electrode FP.

Specifically, in the semiconductor device of Type-I, Lgs was set at 3 μm; Lg, 1 μm; Lgd, 10 μm; Lfp, 0; and Wg, 500 μm. Further, as the barrier layer BA, AlGaN was used. The thickness was set at 30 nm, and the composition of Al was set at 25%. As the insulation film IF1, there was used a silicon nitride film with a film thickness of 300 nm. Whereas, in the semiconductor device of Type-II, Lgs was set at 1 μm; Lg, 1 μm; Lgd, 2.5 μm; Lfp, 1 μm or 0; and Wg, 50 μm. Whereas, as the barrier layer BA, AlGaN was used. The thickness was set at 30 nm, and the composition of Al was set at 25%. As the insulation film IF1, there was used a silicon nitride film with a film thickness of 60 nm.

Figure 27:
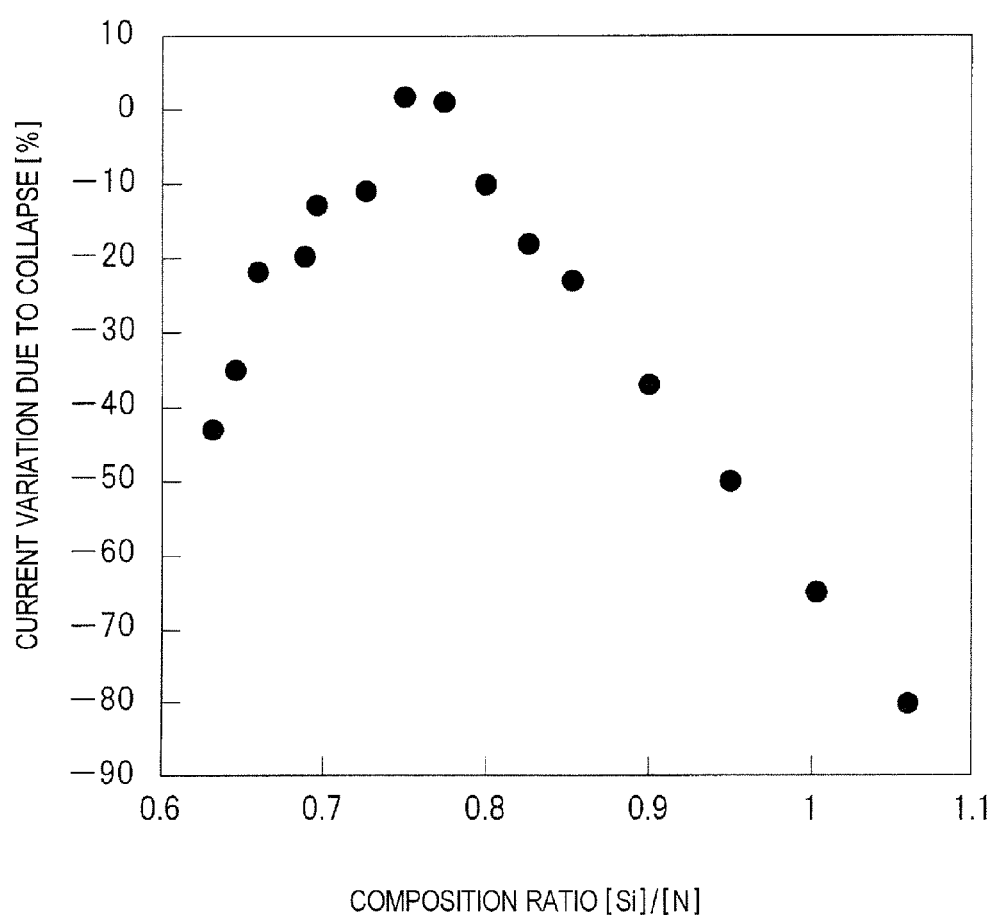
FIG. 27 is a graph showing the relation between the composition ratio [Si]/[N] of the silicon nitride film and the current variation due to collapse of the semiconductor device of Type-I.

FIG. 27 is a graph showing the relation between the composition ratio [Si]/[N] of the silicon nitride film and the current variation due to collapse of the semiconductor device of Type-I. The vertical axis represents the current variation [%] due to collapse, and the horizontal axis represents the composition ratio [Si]/[N].

A measurement is performed on the DC current-voltage (I-V) characteristic when the semiconductor device is applied with 50 Vas a source-drain voltage (Vds), and is operated. From the measurement results, there is measured the value ΔImax of change in the maximum drain current Imax in the case of a source-drain voltage (Vds) of 5 V under the conditions of Vds of 50 V, a pulse width of 1 msec, and a pulse period of 10 msec. The change rate (%)=ΔI/I×100 is defined as the current variation due to collapse, and is plotted with respect to the composition ratio [Si]/[N] of the silicon nitride film.

As shown in FIG. 27, at a composition ratio [Si]/[N] in the vicinity of 0.75 which is the stoichiometric composition ratio, the current variation due to collapse becomes minimum. Whereas, when the composition ratio [Si]/[N] exceeds 1, the current variation due to collapse becomes −80%. Thus, the current value decreases by eighty percent or more.

Thus, the composition ratio [Si]/[N] of the silicon nitride film affects the collapse characteristic. Then, for control of the collapse, it is most desirable to achieve a film composition in the vicinity of 0.75 which is the stoichiometric composition ratio. The refractive index n of the silicon nitride film in this case is about 1.98.

However, in consideration of the margin during deposition, it is preferable to adjust the composition ratio [Si]/[N] of the silicon nitride film within the range of 0.75±1%. Further, the statistical evaluation has revealed as follows: when a fluctuation of about 20% is allowable as the current variation due to collapse, the composition ratio [Si]/[N] of the silicon nitride film can be adjusted within the range of 0.65 or more and 0.85 or less. In this case, the refractive index n of the silicon nitride film is 1.86 or more and 2.1 or less.

In summary, for control of the collapse, the composition ratio [Si]/[N] of the silicon nitride film preferably satisfies 0.65≤[Si]/[N]≤0.85. In terms of the refractive index n, it is preferable that 1.86≤n≤2.1 is satisfied.

Further, for control of the collapse, the composition ratio [Si]/[N] of the silicon nitride film is more preferably set within the range of 0.75±1%. Further, for control of the collapse, the composition ratio [Si]/[N] of the silicon nitride film is most preferably set at 0.75.

Figure 28:
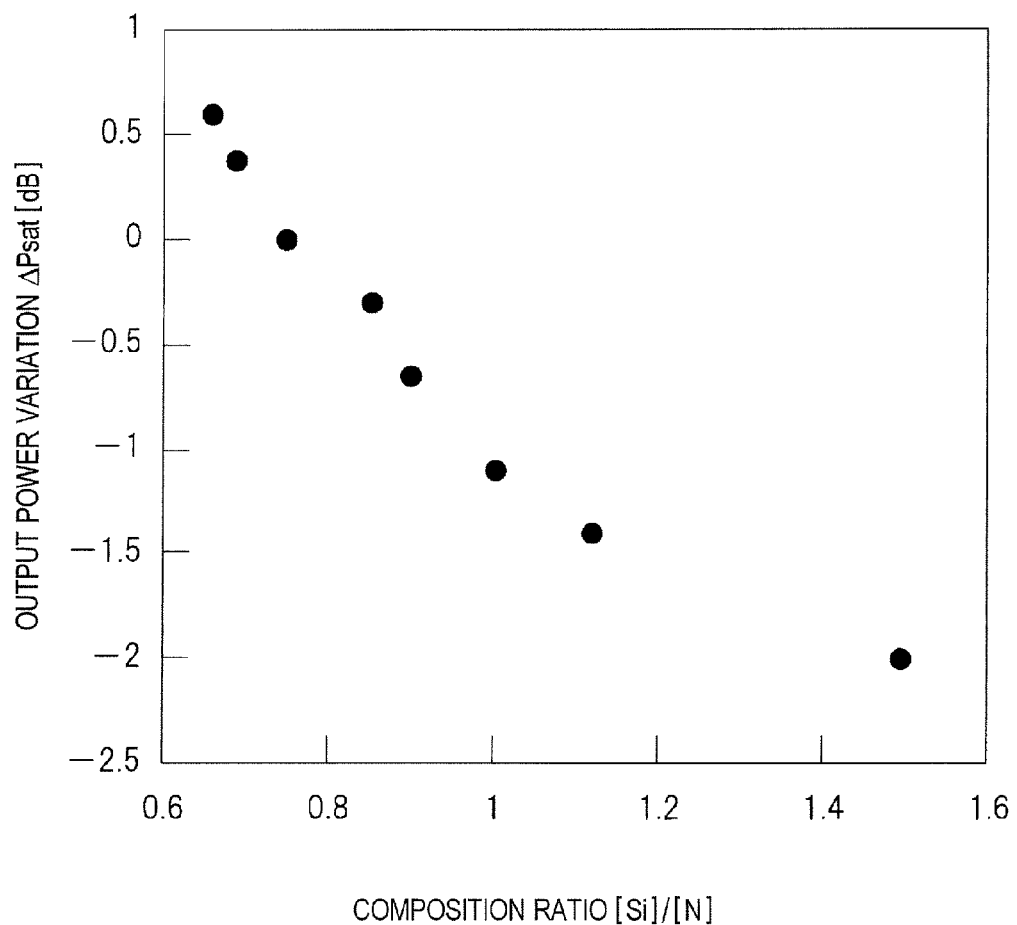
FIG. 28 is a graph showing the relation between the composition ratio [Si]/[N] of the silicon nitride film and the output power variation of the semiconductor device of Type-I after a 1000-hour high-temperature operating test.

The collapse characteristic shown in FIG. 27 is characteristic fluctuation with a relatively smaller time constant. Then, a study will be given to characteristic fluctuation on a relatively longer time scale. FIG. 28 is a graph showing the relation between the composition ratio [Si]/[N] of the silicon nitride film and the output power variation of the semiconductor device of Type-I after a 1000-hour high-temperature operating test. The vertical axis represents the output power variation (ΔPsat) [dB], and the horizontal axis represents the composition ratio [Si]/[N].

A 1000-hour high-temperature operating test was performed on the semiconductor device of Type-I. Then, the variation of the saturated output power at 800 MHz, and a drain voltage (Vd) of 50 V was measured. The variation is the output power variation (ΔPsat). The high-temperature operating test was performed under the conditions of a channel temperature of 250° C., a drain voltage (Vd) of 50 V, and a drain current of 50 mA/mm.

The output power variation (ΔPsat) is also referred to as a power slamp. It is assumed that an increase in the variation results in larger long-term fluctuations of the drain current, the threshold value, the breakdown voltage, and the like. For this reason, when the variation is small, the variation serves as an indicator indicating that the semiconductor device can operate stably even through a long-term use.

As shown in FIG. 28, when the composition ratio [Si]/[N] is 0.75 which is the stoichiometric composition ratio, the output power variation (ΔPsat) becomes about 0 (zero). Namely, it can be said as follows: with the semiconductor device in which the composition ratio [Si]/[N] is set at 0.75, the output power does not vary even through a long-time high-temperature operating test; and even through a long-term use of the semiconductor device, fluctuations in device characteristics such as the drain current, the threshold value, and the breakdown voltage are small.

On the other hand, in a region where the composition ratio [Si]/[N] is larger than 0.75 which is the stoichiometric composition ratio, the output power variation (ΔPsat) becomes a minus value. Namely, this means that the output power decreases. Such an increase in output power variation (power·slamp) is presumably caused by the following: H (hydrogen) in the Si—H bond dissociates, and electrons in the semiconductor device are trapped by the dangling bond of Si.

Whereas in a region where the composition ratio [Si]/[N] is smaller than 0.75 which is the stoichiometric composition ratio, the output power variation (ΔPsat) becomes a plus value. Namely, this means that the output power increases. The cause of the increase in the output power is a little increase in drain current. However, the details of the cause have not been able to be analyzed clearly.

Thus, in order to control the fluctuations in device characteristics in long-term use of the semiconductor device, it is most desirable to achieve the film composition in the vicinity of 0.75 which is the stoichiometric composition ratio. However, within the range of the composition ratio [Si]/[N] of the silicon nitride film for control of the collapse, such as the range of 0.75±1% or 0.65≤[Si]/[N]≤0.85, the output power variation (ΔPsat) of −0.5 or more can be ensured.

Thus, by setting the film composition of the lower layer of the insulation film IF1 as the film composition described above, it is possible to suppress the collapse and to suppress the fluctuations in device characteristics of the semiconductor device.

Figure 29:
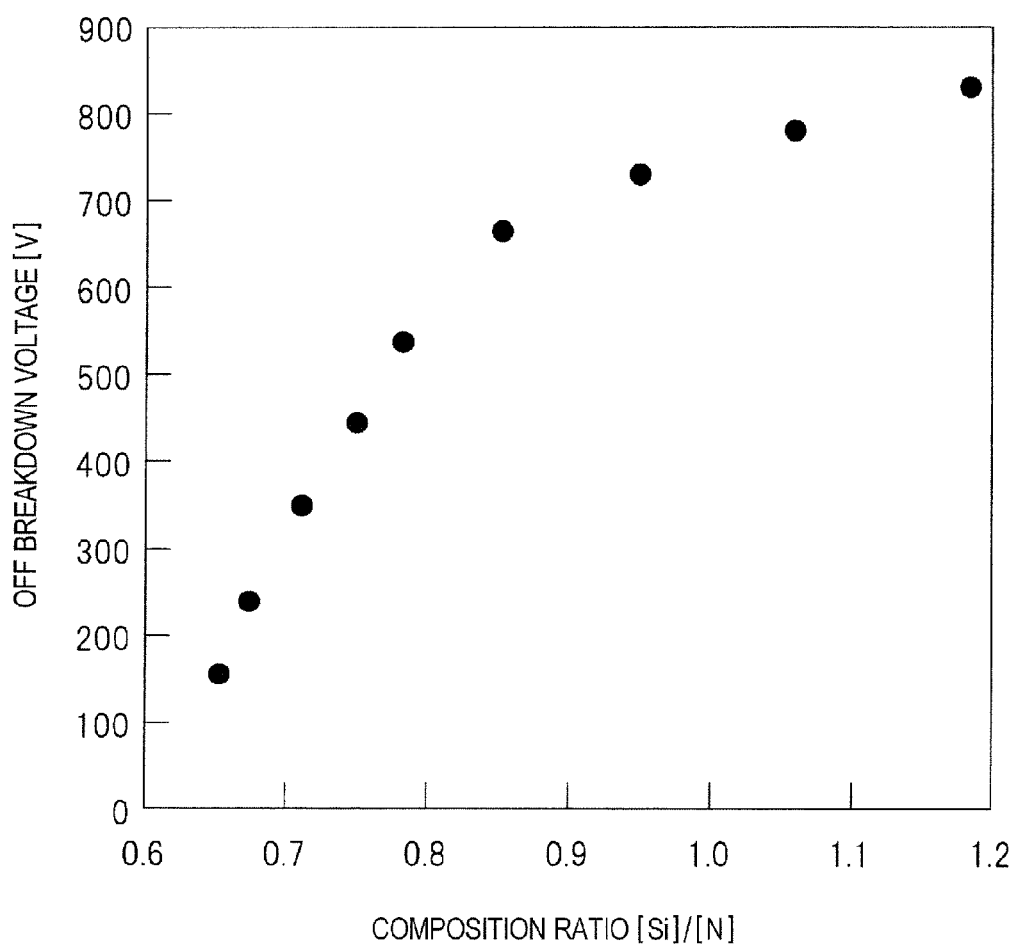
FIG. 29 is a graph showing the relation between the composition ratio [Si]/[N] of the silicon nitride film and the off breakdown voltage of the semiconductor device of Type-I.

Breakdown Voltage Characteristics of Semiconductor Device Using a Si-Rich Silicon Nitride Film Then, the breakdown voltage of a semiconductor device will be studied. FIG. 29 is a graph showing the relation between the composition ratio [Si]/[N] of the silicon nitride film and the off breakdown voltage of the semiconductor device of Type-I. The vertical axis represents the off breakdown voltage [V], and the horizontal axis represents the composition ratio [Si]/[N].

With the semiconductor device applied with −10 V as the gate voltage (Vg), the off breakdown voltage was measured. The off breakdown voltage is defined as the drain voltage (Vd) when a drain current (Ids) flows at 1 mA/mm.

As shown in FIG. 29, with an increase in composition ratio [Si]/[N] of the silicon nitride film, the off breakdown voltage increases. For example, when the composition ratio [Si]/[N] of the silicon nitride film exceeds 0.85, an off breakdown voltage of 650 V or more can be ensured. Further, in actuality, for the purpose of stably generating discharge in the device during deposition, it is preferable to set the composition ratio [Si]/[N] of the silicon nitride film at 1.6 or less.

Thus, from the viewpoints of the off breakdown voltage and the like, for the composition ratio [Si]/[N] of the silicon nitride film, it is preferable that 0.85<[Si]/[N]≤1.6 is satisfied. In terms of the refractive index n, it is preferable that 2.1<n≤2.66 is satisfied.

Accordingly, by configuring the upper layer of the insulation film (protective film) IF1 as the Si-rich silicon nitride film IF1b, it is possible to improve the breakdown voltage of the semiconductor device. Thus, the upper layer of the insulation film IF1 is allowed to function as a pseudo-field plate electrode. This improves the breakdown voltage of the semiconductor device.

Namely, the Si-rich silicon nitride film IF1b which is the upper layer film of the insulation film IF1 is closer to amorphous Si than to a $Si_3N_4$ film with a stoichiometric composition, and hence has a certain degree of conductivity (see FIG.

23). Accordingly, the Si-rich silicon nitride film IF1b functions as a pseudo-field plate electrode. For example, when the conductivity of the Si-rich silicon nitride film IF1b increases, the gate leakage may increase. However, it is considered as follows: from the electric field concentration relieving effect, avalanche is suppressed, resulting in an increase in off breakdown voltage.

Accordingly, when the Si-rich silicon nitride film IF1b is constant in composition ratio [Si]/[N], with an increase in the film thickness, the breakdown voltage of the semiconductor device is improved.

Characteristics of Semiconductor Device—Comprehensive Verification

There were measured the collapse, the breakdown voltage, and the etching rate of the semiconductor device of Type-II. As described previously, in the semiconductor device of Type-II, Lgs was set at 1 μm; Lg, 1 μm; Lgd, 2.5 μm; Lfp, 1 μm or 0; and Wg, 50 μm. Whereas, as the barrier layer BA, AlGaN was used. The thickness was set at 30 nm, and the composition of Al was set at 25%. Whereas, as the insulation film IF1, the film thickness was 60 nm. The Si-rich silicon nitride film and the N-rich silicon nitride film were studied. For the Si-rich silicon nitride film, the composition ratio [Si]/[N] is 0.95. For the N-rich silicon nitride film, the composition ratio [Si]/[N] is 0.75. As the field plate electrodes (FP electrodes), the structure with a Lfp of 1 μm (with a FP electrode), and with a Lfp of 0 (without a FP electrode) were studied (see (a) to (d) of FIG. 30).

Further, a study was also conducted on the structure using a lamination film of a Si-rich silicon nitride film and a N-rich silicon nitride film as the insulation film IF1. Thus, the case where Lfp was 1 μm or 0 was studied (see (e) and (f) of FIG. 30).

FIG. 30 is a table summarizing the characteristics of semiconductor devices with configurations (a) to (f). As shown in FIG. 30, with the configuration (a), namely, the configuration of a Si-rich monolayer, and without a FP electrode, the current variation due to collapse was 22%; the off breakdown voltage, 160 V; and the dry etching rate, 210 Å/min (1 Å=10$^{-10}$ m). With the configuration (b), namely, the configuration obtained by adding a FP electrode to the configuration (a), the current variation due to collapse was 20%; the off breakdown voltage, 240 V; and the dry etching rate, 210 Å/min.

Whereas, with the configuration (c), namely, the configuration of a N-rich monolayer and without a FP electrode, the current variation due to collapse was 8%; the off breakdown voltage, 50 V; and the dry etching rate, 800 Å/min. With the configuration (d), namely, the configuration obtained by adding a FP electrode to the configuration (c), the current variation due to collapse was 4%; the off breakdown voltage, 190 V; and the dry etching rate, 800 Å/min.

Then, with the configuration (e), namely, the configuration using a lamination film of a Si-rich silicon nitride film and a N-rich silicon nitride film, and without a FP electrode, the current variation due to collapse was 9%; the off breakdown voltage, 120 V; and the dry etching rate, 210 Å/min. With the configuration (f), namely, the configuration obtained by adding a FP electrode to the configuration (e), the current variation due to collapse was 1 to 3%; the off breakdown voltage, 210 V; and the dry etching rate, 210 Å/min.

Thus, by applying the FP electrode, not only the off breakdown voltage but also the collapse characteristic are improved as compared with the case without a FP electrode. The field plate electrode has a function of relieving the electric field concentration to the drain end of the gate, and improving the breakdown voltage. In addition, the field plate electrode also has a function of discharging electron traps at the semiconductor surface between the gate and the drain, and thereby relieving channel narrowing, and hence suppressing the collapse.

Whereas, also in the case not applying a field plate electrode, when a lamination film of a Si-rich silicon nitride film and a N-rich silicon nitride film is used, not only the off breakdown voltage but also the collapse characteristic are also improved as compared with the case using a N-rich monolayer film. This is considered due to the fact that, as described previously, the Si-rich silicon nitride film functioned as a pseudo-field plate electrode. Further, the Si-rich silicon nitride film improves the etching resistance of the film upper layer part.

Further, in the structure applying a field plate electrode while using a lamination of a Si-rich silicon nitride film and a N-rich silicon nitride film, the field plate electrode extends over the Si-rich silicon nitride film. This enhances the function of the Si-rich silicon nitride film as a pseudo-field plate electrode. For this reason, while most improving the collapse characteristic, and sufficiently ensuring the off breakdown voltage, the structure is also excellent in etching resistance.

Figure 31:
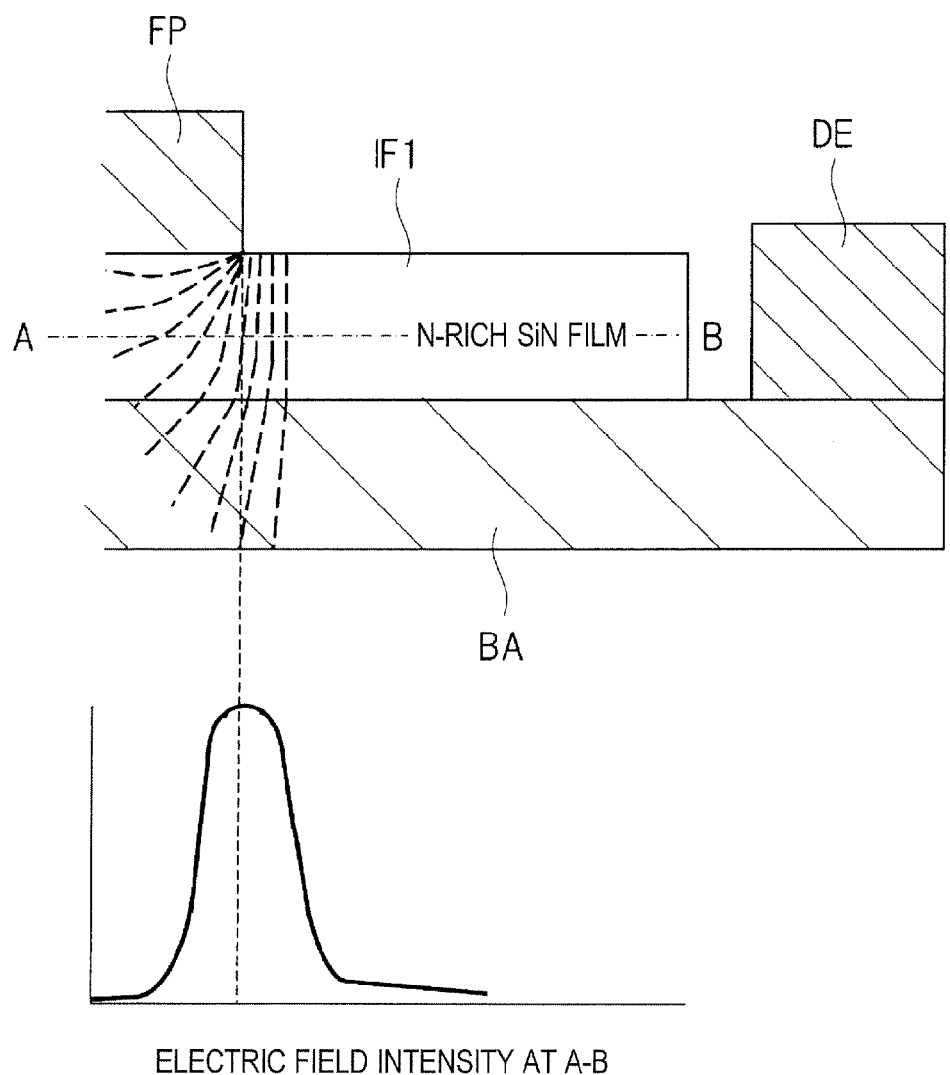
FIG. 31 is a view schematically showing the electric field distribution in the case of a N-rich monolayer and with a FP electrode.
Figure 32:
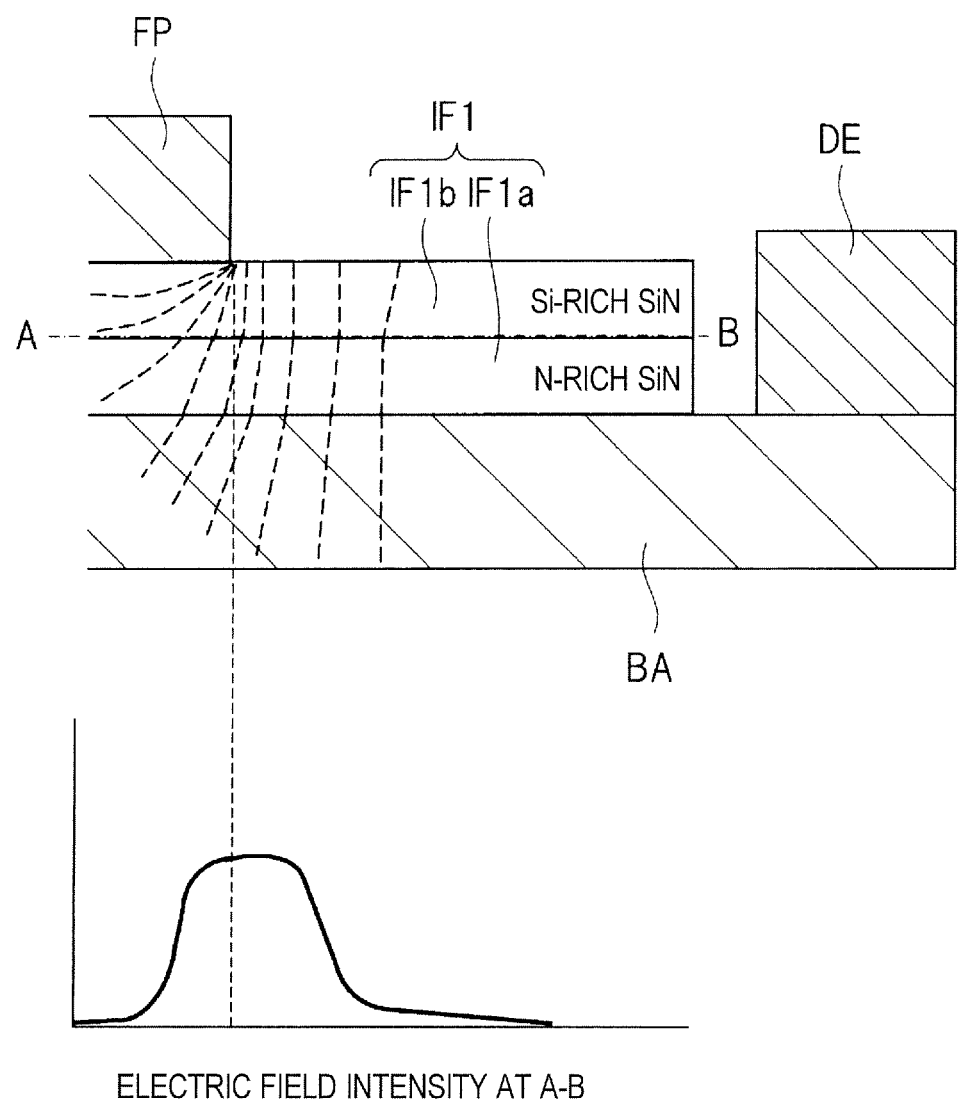
FIG. 32 is a view schematically showing the electric field distribution in the case using a lamination film of the Si-rich silicon nitride film and the N-rich silicon nitride film, and with a FP electrode.

FIG. 31 is a view schematically showing the electric field distribution in the case of a N-rich monolayer and with a FP electrode. Whereas, FIG. 32 is a view schematically showing the electric field distribution in the case using a lamination film of the Si-rich silicon nitride film and the N-rich silicon nitride film, and with a FP electrode. For each, the upper diagram is a cross sectional view in the vicinity of the FP electrode, in which an equipotential line is indicated with a broken line. Whereas, the lower diagram is a graph showing the electric field intensity distribution between A-B of the cross sectional view.

In the case of a N-rich monolayer and with a FP electrode, as shown in FIG. 31, the electric field concentrates to the end of the FP electrode on the drain electrode DE side. In contrast, in the case using a lamination film of a Si-rich silicon nitride film and a N-rich silicon nitride film, and with a FP electrode, as shown in FIG. 32, the electric field at the end of the FP electrode on the drain electrode DE side is dispersed on the drain electrode DE side. This relieves the electric field concentration at the end of the FP electrode on the drain electrode DE side.

Thus, a lamination film of a Si-rich silicon nitride film and a N-rich silicon nitride film is used, and a FP electrode is applied. As a result, it is possible to improve the breakdown voltage of the semiconductor device.

Herein, in FIGS. 31 and 32, the Si-rich silicon nitride film is in direct contact with the field plate electrode FP. However, for example, as shown in FIG. 1, also when the Si-rich silicon nitride film is in contact with the field plate electrode FP via the gate insulation film GI, the same effects are produced. Namely, as shown in FIG. 1, by using a lamination film of a Si-rich silicon nitride film and a N-rich silicon nitride film, and applying a FP electrode, it is possible to improve the breakdown voltage of the semiconductor device.

Then, the preferable range of the length (Lfp) of the field plate electrode will be studied from the viewpoints of the switching rate required of the semiconductor device, the driving loss, and the like.

First, the parasitic capacity of the semiconductor device is expressed as follows.

Input capacity $Ciss = Cgs + Cgd$ (4)

Output capacity $Coss = Cgd + Cds$ (5)

Feedback capacity $Crss = Cgd$ (6)

Herein, Cgd is the gate-drain capacity; Cgs, the gate-source capacity; and Cds, the source-drain capacity. Each capacity has a non-linear voltage dependency. At a low voltage, the capacity value becomes large. Whereas, the semiconductor device of the present embodiment (FIG. 1) includes the gate electrode GE insulated by the gate insulation film GI, and is a unipolar device. Accordingly, the switching mechanism is capable of high-speed operation because of no accumulation of minority carriers as distinct from a bipolar transistor.

In order to achieve a further increase in speed of the operation, as described next, it is necessary to reduce the gate-drain capacity Cgd.

In order to turn on the semiconductor device of the present embodiment (FIG. 1), the MIS capacitor by the gate insulation film GI is charged, and the gate voltage Vg is set at a threshold voltage Vth or higher. On the other hand, in order to turn off the semiconductor device, it is essential only that the electric charges accumulated in the MIS capacitor are extracted. Accordingly, the rate of switching the semiconductor device of the present embodiment (FIG. 1) is determined by the rate of charging and discharging the input capacity Ciss of the gate insulation film GI. An improvement of the switching rate requires the reduction of the resistance of the gate electrode GE, and the reduction of the input capacity Ciss (=Cgs+Cgd). Whereas, the driving loss increases in proportion to the switching frequency, but can be reduced by the reduction of the parasitic capacity.

Of power MOS's like the semiconductor device of the present embodiment (FIG. 1), for the one for low breakdown voltage use, when high frequency switching is performed, the input waveform to the gate electrode GE and the output waveform from the drain electrode DE are different from each other by 180°. For this reason, the gate-drain capacity Cgd feedbacks the output waveform from the drain electrode DE to the input waveform to the gate electrode GE, the gate waveform, and adversely affects the input waveform. In order to reduce the adverse effects, it becomes necessary to reduce the gate-drain capacity Cgd which is the feedback capacity. In terms of circuit design, the effects of the feedback capacity and the bias are added. Thus, discussion based on the electric charge Q corresponding to the capacity C facilitates understanding. Accordingly, with the one for low breakdown voltage use, in order to improve the switching rate, it is necessary to reduce the electric charges Qg (=Qiss=Ciss×Vg) from the discussion.

On the other hand, with the one for high breakdown voltage use, the drain voltage Vd is high. For this reason, an improvement of the switching rate requires the reduction of the output charge amount Qoss in addition to the electric charges Qg. Further, the reduction of the driving loss requires the reduction of the electric charges Qg.

Thus, with the semiconductor device of the present embodiment (FIG. 1), an improvement of the switching rate requires the reduction of the parasitic capacity Cgd. For the reduction of the parasitic capacity Cgd, it is effective to elongate the distance from the end of the FP electrode on the drain electrode DE side to the drain electrode DE.

With the semiconductor device of the present embodiment (FIG. 1), in the case for high breakdown voltage use, in order to ensure the breakdown voltage, the gate-drain distance Lgd is preferably set at 1 μm or more. Whereas, the length (Lfp) of the FP electrode is preferably longer than 0.5 μm. Whereas, the upper limit of the length (Lfp) of the FP electrode is preferably set at √Lgd (μm in unit) from the empirical rule.

From the description up to this point, the length (Lfp, μm in unit) of the FP electrode preferably satisfies 0.5<Lfp<√Lgd.

Below, a description will be given to other configurations and modified examples of the present embodiment.

Figure 33A:
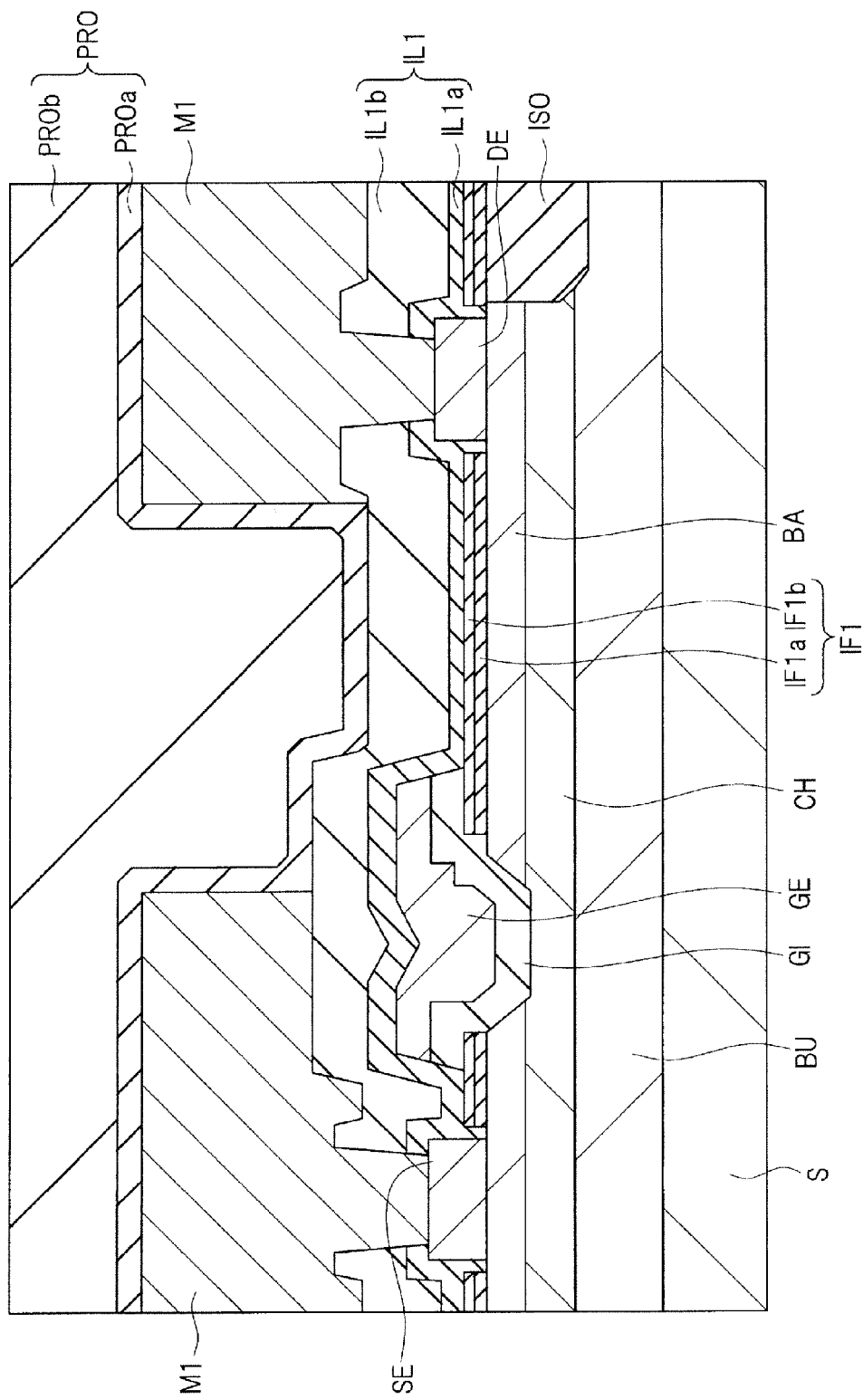
FIG. 33A is a cross sectional view showing another configuration of the semiconductor device of First Embodiment.

FIG. 33A is a cross sectional view showing another configuration of the semiconductor device of the present embodiment.

Structure Description

Also in the semiconductor device shown in FIG. 33A, as with the semiconductor device shown in FIG. 1, over a substrate S, there are sequentially formed a nucleation layer (not shown), a strain relaxation layer (not shown), a buffer layer BU, a channel layer CH, and a barrier layer BA. A gate electrode GE is formed in the inside of a trench penetrating through an insulation film IF1 and the barrier layer BA, and reaching some point of the channel layer CH via a gate insulation film GI. The channel layer CH and the barrier layer BA are each formed of a nitride semiconductor. The barrier layer BA is a nitride semiconductor larger in band gap than the channel layer CH.

Further, the insulation film IF1 is, as with First Embodiment, formed over the barrier layer BA, and is formed of a lamination film of a Si-rich silicon nitride film IF1b, and a N-rich silicon nitride film IF1a situated thereunder.

In other words, between the gate electrode GE and the insulation film IF1, there is arranged the gate insulation film GI provided in such a manner as to be in contact with at least the Si-rich silicon nitride film IF1b. Alternatively, the gate electrode GE may be provided in such a manner as to be in contact with the Si-rich silicon nitride film IF1b (see FIG. 42, and the like).

Over the insulation film IF1 and the gate electrode GE, there is formed an insulation layer IL1. The insulation layer IL1 is formed of a lamination film of a first layer IL1a and the overlying second layer IL1b. The first layer IL1a is formed of a silicon nitride film with a film thickness of, for example, about 90 nm. The silicon nitride film is a stoichiometric composition film (N-rich silicon nitride film) with a composition ratio [Si]/[N] of about 0.75. Accordingly, the N-rich silicon nitride film (IL1a) covers the insulation film IF1.

The second layer IL1b is formed of a lamination film of a silicon oxide film with a film thickness of about 500 nm, and a TEOS film with a film thickness of about 400 nm thereover formed by, for example, a plasma CVD method.

In other words, the N-rich silicon nitride film (IL1a) is provided over the gate electrode GE and the insulation film IF1, and is smaller in composition ratio of silicon (Si) than the Si-rich silicon nitride film IF1b. Further, over the N-rich silicon nitride film (IL1a), there is provided a second layer IL1b formed of a silicon oxide film.

Whereas, the source electrode SE and the drain electrode DE are formed over the portions of the barrier layer BA on the opposite sides of the gate electrode GE. The source electrode SE and the drain electrode DE are coupled with respective wires M1 via plugs in the contact holes formed in the insulation layer IL1, respectively.

Further, over the wires M1 and the insulation layer IL1, there is formed a protective film PRO. The protective film PRO is formed of a lamination film of a first layer PROa and a second layer PROb thereover. The first layer PROa is formed of, for example, a silicon oxynitride film. The second layer PROb is formed of, for example, a polyimide film.

Further, the gate electrode GE, the source electrode SE, and the drain electrode DE are formed in active regions defined by element isolation regions ISO. The element isolation region ISO is a region formed in the following manner: for example, ion species such as boron (B) and nitrogen (N) are implanted into the buffer layer BU, the channel layer CH, and the barrier layer BA, resulting in a change in crystal state, which leads to a higher resistance.

Incidentally, other configurations are the same as in the case of FIG. 1, and hence a detailed description thereon is omitted. Further, in the form shown in FIG. 33A, over the wires M1, there was formed the protective film PRO. However, between the wires M1 and the protective film PRO, there may be formed wiring layers, resulting in a multilayer wiring structure.

[Manufacturing Method Description]

Then, a method for manufacturing the semiconductor device shown in FIG. 33A will be described. In addition, the configuration of the semiconductor device will be more elucidated.

First, in the same manner as with the semiconductor device shown in FIG. 1, over a substrate S, there are sequentially formed a nucleation layer (not shown), a strain relaxation layer (not shown), and a buffer layer BU. Then, over the buffer layer BU, in the same manner as with the semiconductor device shown in FIG. 1, there are sequentially formed a channel layer CH and a barrier layer BA.

Then, there is formed a mask for opening the element isolation region. Using the mask film as a mask, boron (B) or nitrogen (N) is implanted. As a result, an element isolation region ISO is formed. Then, the mask film is removed. Incidentally, when boron is used as ion species for forming the element isolation region ISO, the reduction ratio of the resistance value is small even through the subsequent heat treatments. Accordingly, boron is preferably used when the element isolation region is formed at a relatively earlier stage of a manufacturing flow.

Then, over the barrier layer BA, in the same manner as with the semiconductor device shown in FIG. 1, an insulation film IF1 is formed. First, a N-rich silicon nitride film IF1a is deposited using a CVD method or the like. Then, over the N-rich silicon nitride film IF1a, a Si-rich silicon nitride film IF1b is deposited using a CVD method or the like. The composition ratio of the silicon nitride film, namely, whether the N-rich or Si-rich composition is achieved can be adjusted by changing the gas flow rate ratio of the raw material gas (i.e., a mixed gas of a silicon compound gas and a nitrogen compound gas) as described previously.

Then, in the same manner as with the semiconductor device shown in FIG. 1, there is formed a trench penetrating through the insulation film IF1 and the barrier layer BA, and reaching some point of the channel layer CH. Further, over the insulation film IF1 including the inside of the trench and the exposed portions of the barrier layer BA, there are sequentially formed alumina to be the gate insulation film GI, and a TiN film to be the gate electrode GE. Then, the TiN film and alumina are etched, thereby to form the gate insulation film GI and the gate electrode GE.

Then, using a photolithography technology and an etching technology, the insulation film IF1 is patterned, thereby to expose the portions of the barrier layer BA in the formation regions of the source electrode SE and the drain electrode DE.

Then, over the exposed portions of the barrier layer BA, in the same manner as with the semiconductor device shown in FIG. 1, a metal film is deposited by a sputtering method or the like. The metal film is formed of, for example, an Al/Ti film. Then, using a photolithography technology and an etching technology, the metal film is patterned, thereby to form the source electrode SE and the drain electrode DE.

Then, over the gate electrode GE, the source electrode SE, and the drain electrode DE, there is formed an insulation layer IL1. First, as a first layer IL1a, a silicon nitride film is deposited with a film thickness of about 90 nm using a CVD method or the like. The silicon nitride film is a N-rich silicon nitride film with a composition ratio [Si]/[N] of about 0.75. Then, over the first layer IL1a, there is formed a second layer IL1b. For example, over the first layer IL1a, a silicon oxide film is deposited with a film thickness of about 500 nm using a plasma CVD method or the like. Then, over the silicon oxide film, by a CVD method using TEOS (Tetra Ethyl Ortho Silicate) as a raw material, there is formed a TEOS film with a film thickness of about 400 nm. As a result, as the second layer IL1b, there can be formed a lamination film of a silicon oxide film, and a TEOS film thereover.

Then, using a photolithography technology and an etching technology, contact holes are formed in the insulation layer IL1. The contact holes are arranged over the source electrode SE and the drain electrode DE, respectively.

Then, in the same manner as with the semiconductor device shown in FIG. 1, there is formed a wire M1 to be coupled with the source electrode SE or the drain electrode DE.

Then, over the wire M1, there is formed a protective film PRO. For example, over the wire M1 and the insulation layer IL1, as a first layer PROa, a silicon oxynitride film is deposited using a CVD method or the like. Then, over the silicon oxynitride film, as a second layer PROb, there is formed a polyimide film. For example, over the silicon oxynitride film (PROa), a polyimide material is applied, and is subjected to a heat treatment, thereby to form a polyimide film. As a result, as the protective film PRO, it is possible to form a lamination film of the silicon oxynitride film (PROa), and the polyimide film (PROb) thereover.

Incidentally, other manufacturing steps are the same as those in the case of FIG. 1, and hence a detailed description thereon is omitted. Further, in the steps, over the wires M1, there was formed the protective film PRO. However, the formation step of an insulation layer and a wiring layer between the wires M1 and the protective film PRO may be repeated, thereby to form multilayer wiring.

Thus, also in the semiconductor device shown in FIG. 33A, as with the semiconductor device shown in FIG. 1, the insulation film IF1 is formed of the Si-rich silicon nitride film IF1b, and the N-rich silicon nitride film IF1a situated thereunder. For this reason, it is possible to improve the characteristics of the semiconductor device.

Specifically, the upper layer of the insulation film IF1 is formed of the Si-rich silicon nitride film IF1b. As a result, it is possible to improve the breakdown voltage. Whereas, the lower layer of the insulation film IF1 is formed of the N-rich silicon nitride film IF1a. As a result, it is possible to suppress the collapse.

Incidentally, also in the present embodiment, as with the semiconductor device shown in FIG. 1, there are applicable the preferable composition ratios of the insulation film IF1 (the Si-rich silicon nitride film IF1b and the N-rich silicon nitride film IF1a), and the preferable length of the FP electrode. For example, as described previously, for control of the collapse, the composition ratio [Si]/[N] of the N-rich silicon nitride film IF1a is preferably set within the range of 0.65 or more and 0.85 or less. Further, the composition ratio [Si]/[N] is more preferably adjusted within the range of 0.75±1%. Further, for an improvement of the off breakdown voltage, the composition ratio [Si]/[N] of the Si-rich silicon nitride film IF1b is preferably set at larger than 0.85.

Modified Example 1

Figure 33B:
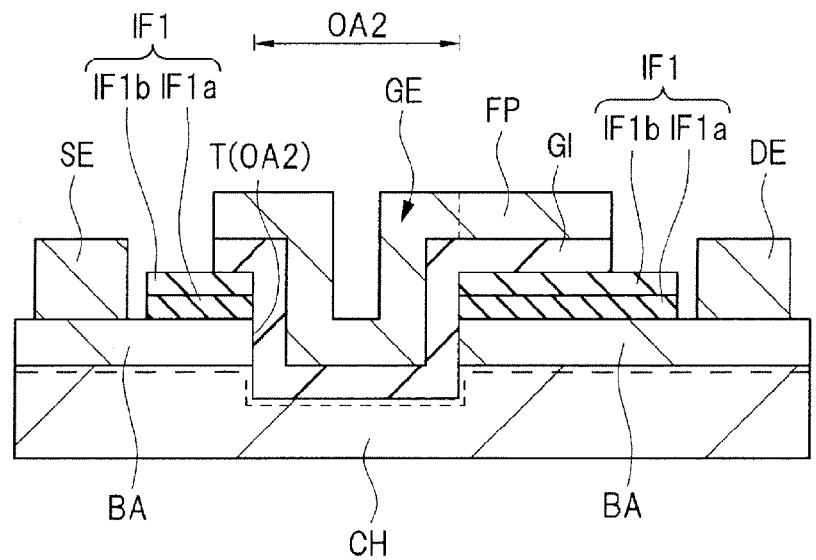
FIG. 33B is a cross sectional view showing a configuration of Modified Example 1 of the semiconductor device of First Embodiment.

In the embodiment (FIG. 1), the end of the insulation film IF1 on the trench T side was set back toward the drain electrode DE side. However, the set-back amount may be set at zero. FIG. 33B is a cross sectional view showing a configuration of Modified Example 1 of the semiconductor device of the present embodiment.

Namely, as shown in FIG. 33B, from the end of the trench T on the drain electrode DE side, the insulation film IF1 is allowed to extend toward the drain electrode DE side. In other words, in the lamination part of the insulation film IF1, the barrier layer BA, and the channel layer CH, there is formed the trench T penetrating through the insulation film IF1 and the barrier layer BA, and reaching some point of the channel layer CH.

In the present Modified Example, for example, Lgs is 1 µm; Lg, 1 µm; Lgd, 10 µm; and Lfp, 2.5 µm. Whereas, as the barrier layer BA, AlGaN is used. The thickness is 30 nm, and the composition of Al is 25%. Thus, for example, the upper layer of the insulation film IF1 is 20 nm in thickness, and the lower layer thereof is 40 nm in thickness. Other configurations are the same as those of the embodiment, and hence a description thereon is omitted.

Whereas, with a manufacturing method, the insulation film IF1, the barrier layer BA, and the channel layer CH are etched. As a result, there is formed the trench T penetrating through the insulation film IF1 and the barrier layer BA, and reaching some point of the channel layer CH (see FIG. 38 and the like of Second Embodiment described later). Other steps are the same as those of the embodiment, and hence a description thereon is omitted.

Modified Example 2

Figure 34:
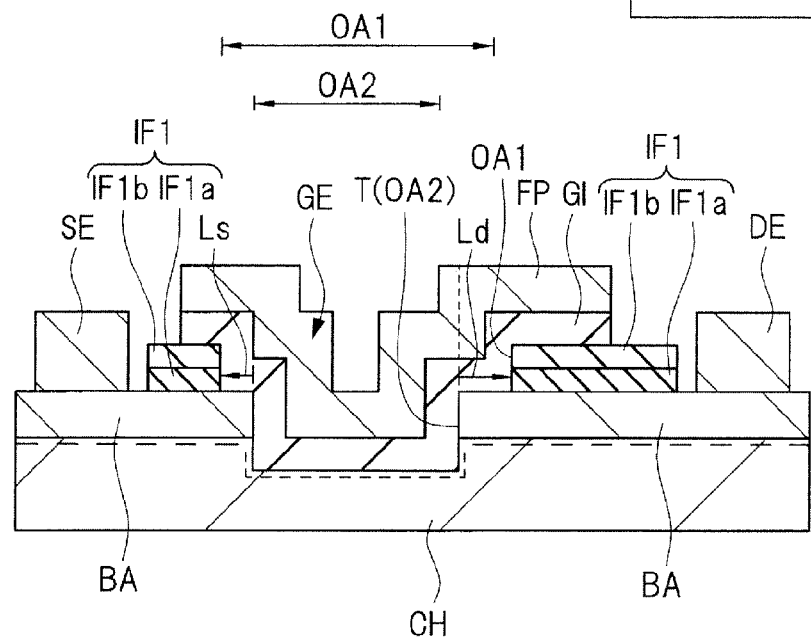
FIG. 34 is a cross sectional view showing a configuration of Modified Example 2 of the semiconductor device of First Embodiment.

In the embodiment (FIG. 1), the end of the insulation film IF1 on the trench T side was set back only toward the drain electrode DE side. However, the drain electrode DE side end and the source electrode SE side end of the insulation film IF1 on the trench T side may be set back, respectively. FIG. 34 is a cross sectional view showing a configuration of Modified Example 2 of the semiconductor device of the present embodiment.

As shown in FIG. 34, the end of the insulation film IF1 on the drain electrode DE side is set back from the end of the trench T toward the drain electrode DE side by a set-back amount Ld. Further, the end of the insulation film IF1 on the source electrode SE side is set back from the end of the trench T toward the source electrode SE side by a set-back amount Ls. Other configurations are the same as those of the embodiment, and hence a description thereon is omitted.

Further, in a manufacturing method, the formation region of an opening region OA1 is enlarged from the opening region OA2 toward the source electrode SE side by the width of the distance Ls, and is enlarged toward the drain electrode DE side by the width of the distance Ld. As a result, it is possible to set the opening region OA1 larger than the opening region OA2. Then, a masking insulation film (IFM) having an opening in the opening region OA1 is formed. Using this as a mask, the insulation film IF1 is etched. Other steps are the same as those of the embodiment, and hence a description thereon is omitted. Incidentally, the set-back amounts (Ld and Ls) of the insulation film IF1 can also be controlled by the etching conditions without using the masking insulation film (IFM).

Modified Example 3

Figure 35:
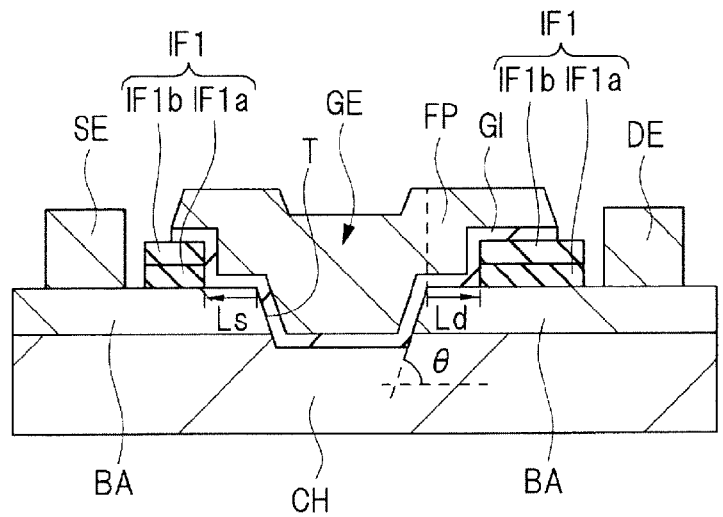
FIG. 35 is a cross sectional view showing a configuration of Modified Example 3 of the semiconductor device of First Embodiment.

In the Modified Example 2, the sidewall of the trench T was formed nearly perpendicularly (taper angle θ=90°) to the surfaces of the barrier layer BA and the channel layer CH. However, the sidewall of the trench T may be formed in a taper shape. FIG. 35 is a cross sectional view showing a configuration of Modified Example 3 of the semiconductor device of the present embodiment.

As shown in FIG. 35, in the present example, the angle (which is also referred to as a taper angle θ) formed between the side surface (sidewall) of the trench T and the extension surface of the bottom surface of the trench T is less than 90°. In other words, the angle formed between the side surface (sidewall) of the trench T and the (111) plane is less than 90°. Other configurations are the same as those in the embodiment, and hence a description thereon is omitted.

Further, in a manufacturing method, the etching conditions for forming the trench T are adjusted so that the sidewall of the trench T is formed in a taper shape. For example, etching is performed under the conditions in which the isotropic etching gas components are larger in content than the anisotropic etching gas components. Other steps are the same as those of the embodiment, and hence a description thereon is omitted.

Second Embodiment

Figure 36:
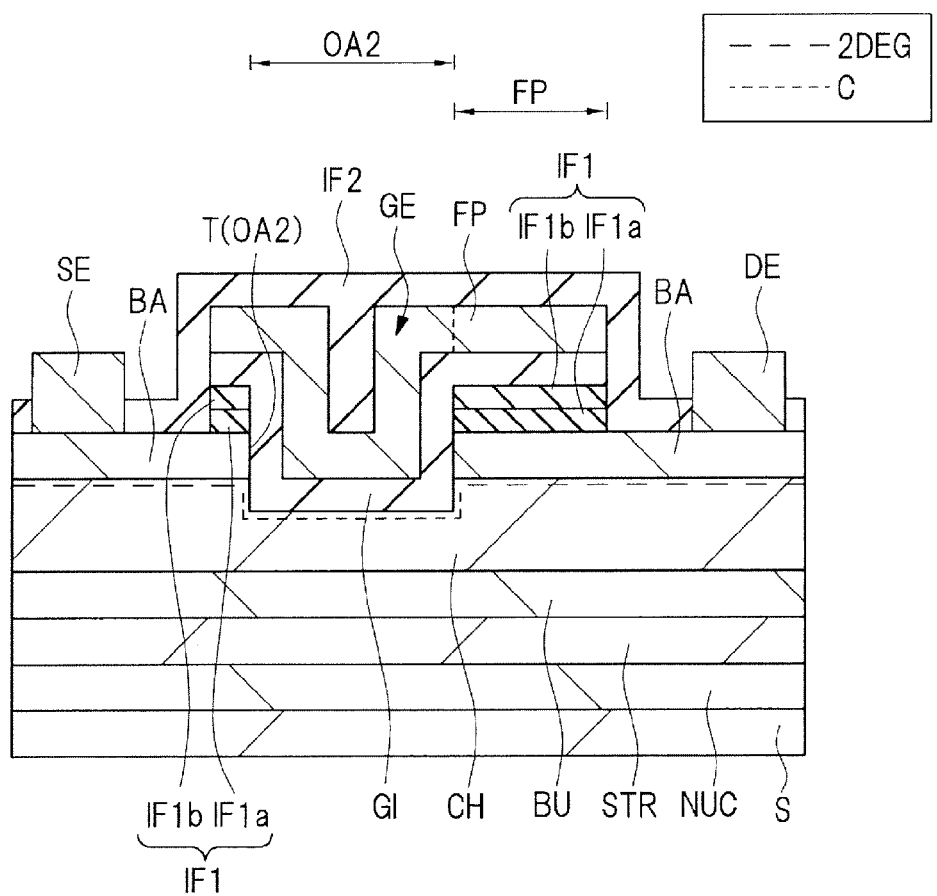
FIG. 36 is a cross sectional view showing a configuration of a semiconductor device of Second Embodiment.

In Modified Example 1 (FIG. 33B) of First Embodiment, the insulation film IF1 was allowed to extend to the vicinity of the drain electrode DE. However, in the present embodiment, the top of the barrier layer BA situated between the trench T and the drain electrode DE is covered with the insulation films IF1 and IF2. FIG. 36 is a cross sectional view showing a configuration of the semiconductor device of the present embodiment.

Structure Description

As shown in FIG. 36, also in the semiconductor device of the present embodiment, as with First Embodiment (FIG. 1), over a substrate S, there are sequentially formed a nucleation layer NUC, a strain relaxation layer STR, a buffer layer BU, a channel layer CH, and a barrier layer BA. A gate electrode GE is formed in the inside of a trench T penetrating through an insulation film IF1 and the barrier layer BA, and reaching some point of the channel layer CH via a gate insulation film GI. The channel layer CH and the barrier layer BA are each formed of a nitride semiconductor and are each a nitride semiconductor larger in band gap than the channel layer CH.

The gate electrode GE is formed in the inside of the trench T penetrating through the insulation film (protective film) IF1 and the barrier layer BA, and dug into some point of the channel layer CH via the gate insulation film GI. The the trench T is formed in an opening region OA2.

Further, as described previously, the insulation film IF1 is, as with First Embodiment, formed of a lamination film of a Si-rich silicon nitride film IF1b, and a N-rich silicon nitride film IF1a situated thereunder. Then, the insulation film IF1 has an opening (T) in the opening region OA2. In the outer circumferential part (outside) of the opening region OA2, there is arranged a lamination film of the gate electrode GE, the gate insulation film GI, and the insulation film IF1. Herein, the ends of the lamination film on the drain electrode DE side are nearly aligned. The ends on the source electrode SE side are also nearly aligned.

Thus, also in the present embodiment, the insulation film IF1 is formed in a lamination structure of the Si-rich silicon nitride film IF1b, and the N-rich silicon nitride film IF1a situated thereunder. For this reason, as described in details in First Embodiment, it is possible to improve the characteristics of the semiconductor device.

Specifically, by forming the upper layer of the insulation film IF1 as the Si-rich silicon nitride film IF1b, it is possible to improve the breakdown voltage. Whereas, by forming the lower layer of the insulation film IF1 as the N-rich silicon nitride film IF1a, it is possible to suppress the collapse.

Further, in the semiconductor device of the present embodiment, over the barrier layer BA including the top of the lamination film of the gate electrode GE, the gate insulation film GI, and the insulation film IF1, there is formed an insulation film IF2. Accordingly, the part between the insulation film IF1 and the drain electrode DE is covered with the insulation film IF2. The insulation film IF2 is formed of an insulation film such as a silicon nitride film or a silicon oxynitride film. For example, as the insulation film IF2, there is used a lamination film of a Si-rich silicon nitride film, and a N-rich silicon nitride film situated under the silicon nitride film, and smaller in composition ratio of silicon (Si) than the silicon nitride film. As a result, it is possible to improve the etching resistance when the source electrode SE and the drain electrode DE are formed. Incidentally, the N-rich silicon nitride film included in the insulation film IF2 is smaller in composition ratio of silicon (Si) than the Si-rich silicon nitride film IF1b provided thereunder.

Manufacturing Method Description

Then, referring to FIGS. 37 to 41, a description will be given to a method for manufacturing a semiconductor device of the present embodiment. In addition, the configuration of the semiconductor device will be more elucidated. FIGS. 37 to 41 are each a cross sectional view showing the semiconductor device of the present embodiment during a manufacturing step.

Figure 37:
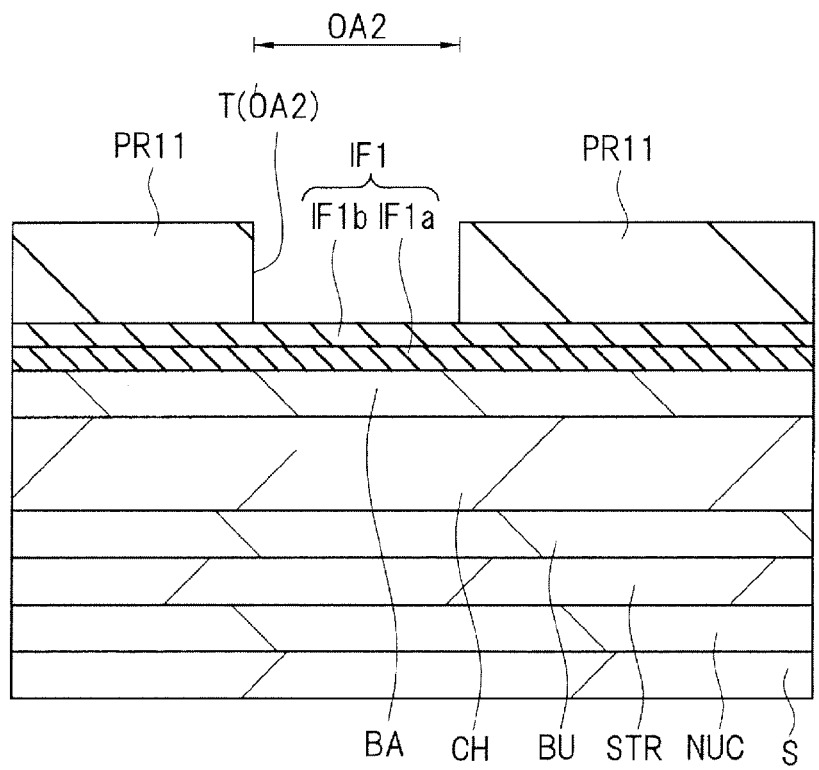
FIG. 37 is a cross sectional view showing the semiconductor device of Second Embodiment during a manufacturing step.

As shown in FIG. 37, over a substrate S, in the same manner as with First Embodiment, there are sequentially formed a nucleation layer NUC, a strain relaxation layer STR, and a buffer layer BU. Then, over the buffer layer BU, in the same manner as with First Embodiment, the channel layer CH and the barrier layer BA are sequentially formed.

Then, over the barrier layer BA, in the same manner as with First Embodiment, there is formed an insulation film IF1. First, a N-rich silicon nitride film IF1a is deposited using a CVD method or the like. Then, over the N-rich silicon nitride film IF1a, a Si-rich silicon nitride film IF1b is deposited using a CVD method or the like. The composition ratio of the silicon nitride film, namely, whether the N-rich or Si-rich composition is achieved can be adjusted by changing the gas flow rate ratio of the raw material gas (i.e., a mixed gas of silicon compound gas and a nitrogen compound gas) as described in First Embodiment.

Then, over the insulation film IF1, using a photolithography technology, there is formed a photoresist film PR11 having an opening in an opening region OA2.

Figure 38:
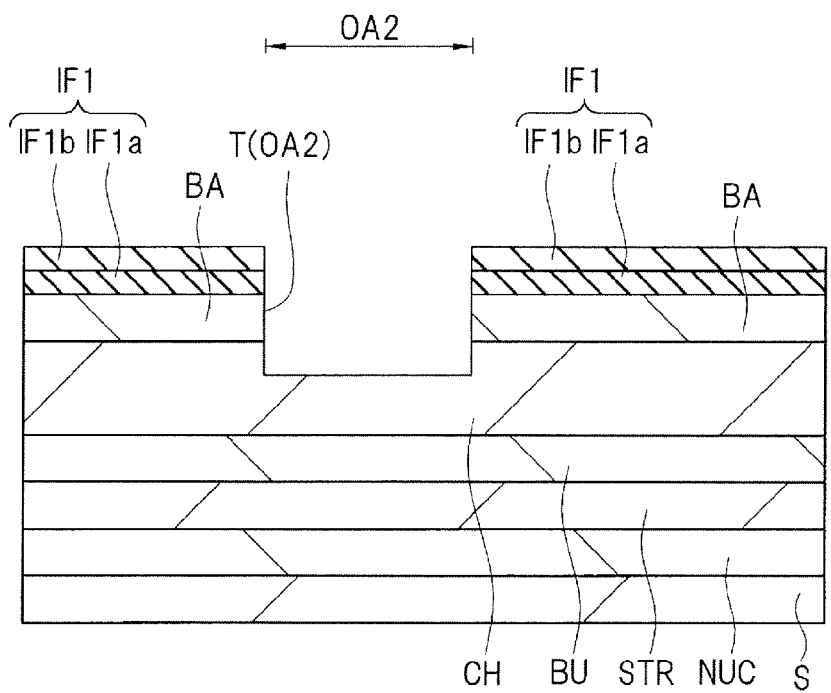
FIG. 38 is a cross sectional view showing the semiconductor device of Second Embodiment, and showing the manufacturing step following FIG. 37.

Then, as shown in FIG. 38, using the photoresist film PR11 as a mask, the insulation film IF1, the barrier layer BA, and the channel layer CH are etched. As a result, there is formed the trench T penetrating through the insulation film IF1 and the barrier layer BA, and reaching some point of the channel layer CH. As an etching gas, for example, a chlorine type gas (such as $BCl_3$) is used. Then, by a plasma peel treatment or the like, the photoresist film PR11 is removed.

Figure 39:
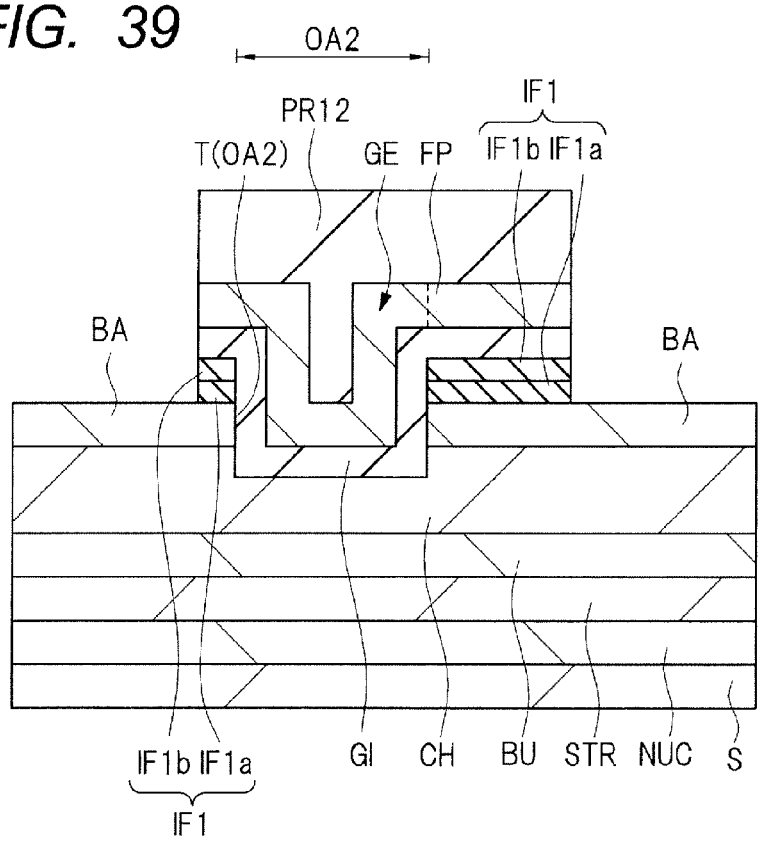
FIG. 39 is a cross sectional view showing the semiconductor device of Second Embodiment during a manufacturing step, and showing the manufacturing step following FIG. 38.

Then, as shown in FIG. 39, over the insulation film IF1 including the inside of the trench T and the exposed portions of the barrier layer BA, in the same manner as with First Embodiment, there is formed alumina to be the gate insulation film GI. Further, there is formed a TiN film (conductive film) to be the gate electrode GE. Then, over the conductive film, using a photolithography technology, there is formed a photoresist film PR12 covering the opening region OA2 and its outer circumferential part. Then, using the photoresist film PR12 as a mask, the insulation film IF1, alumina to be the gate insulation film GI, and the conductive film to be the gate electrode GE are etched. For example, the TiN film and alumina are subjected to dry etching by a chlorine type gas. Whereas, the insulation film IF1 is subjected to dry etching by a fluorine type gas. As a result, there are formed the insulation film IF1, the gate insulation film GI, and the gate electrode GE whose outer shapes are nearly the same shapes. In the patterning, the gate electrode GE is patterned in a shape projecting in one direction (the right-hand side in FIG. 39, the drain electrode DE side). In other words, patterning is performed so as to provide a field plate electrode FP as a part of the gate electrode GE. Then, by a plasma peel treatment or the like, the photoresist film PR12 is removed.

Figure 40:
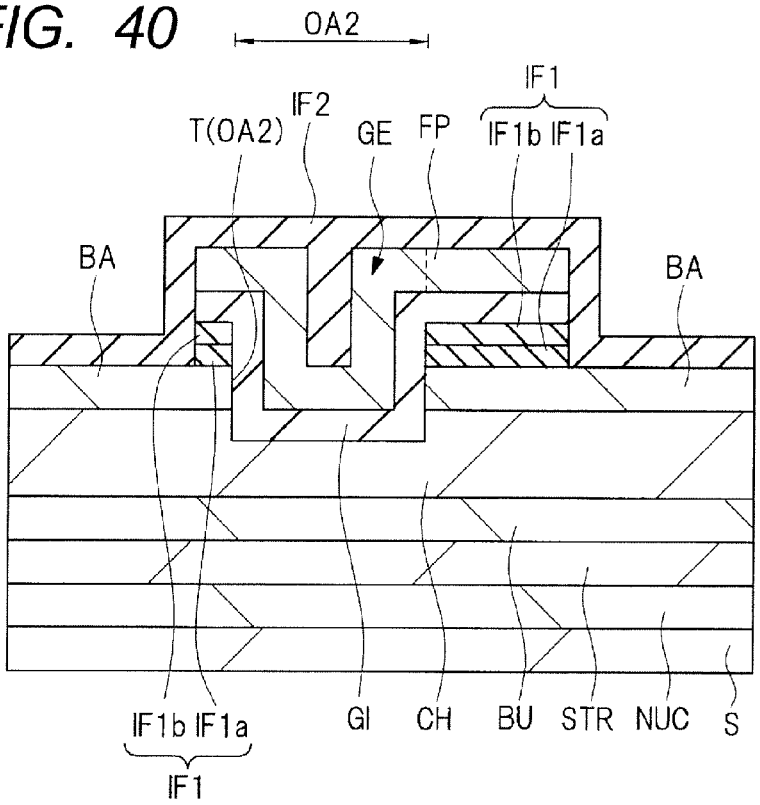
FIG. 40 is a cross sectional view showing the semiconductor device of Second Embodiment during a manufacturing step, and showing the manufacturing step following FIG. 39.

Then, as shown in FIG. 40, over the barrier layer BA including over the lamination film of the insulation film IF1, the gate insulation film GI, and the gate electrode GE, there is formed an insulation film IF2. For example, as the insulation film IF2, a silicon nitride film is deposited using a CVD method or the like. As a result, the part between the trench T and the drain electrode DE is covered with the insulation films IF1 and IF2.

Figure 41:
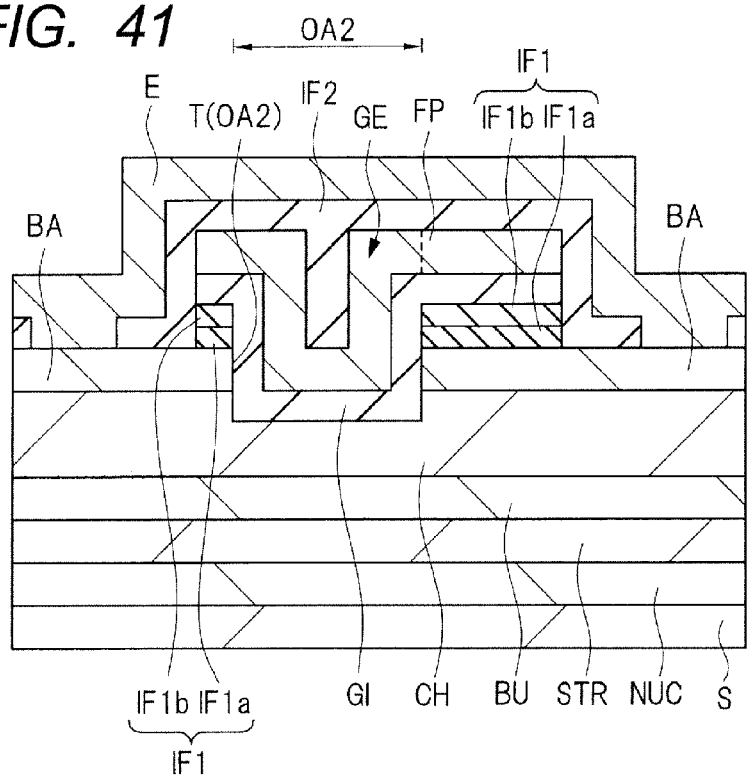
FIG. 41 is a cross sectional view showing the semiconductor device of Second Embodiment during a manufacturing step, and showing the manufacturing step following FIG. 40.

Then, using a photolithography technology and an etching technology, the insulation film IF2 is patterned, thereby to expose the portions of the barrier layer BA in the formation regions of the source electrode SE and the drain electrode DE (FIG. 41).

Then, over the insulation film IF2 including the exposed portions of the barrier layer BA, a metal film is deposited by a sputtering method or the like. The metal film is formed of, for example, an Al/Ti film. Then, using a photolithography technology and an etching technology, a metal film E is patterned, thereby to form the source electrode SE and the drain electrode DE (see FIG. 36). In this case, when as the insulation film IF2, there is used a lamination film of a Si-rich silicon nitride film, and a N-rich silicon nitride film situated thereunder, the etching resistance can be improved in the patterning step.

Then, as with First Embodiment, over the gate electrode GE, the source electrode SE, and the drain electrode DE, there is formed an insulation layer such as a silicon oxide film. Further, over the insulation layer (IL1), there is formed a wire (M1) to be coupled with the source electrode SE or the drain electrode DE.

By the steps up to this point, it is possible to form the semiconductor device shown in FIG. 36. Incidentally, the steps are examples, and the semiconductor device of the present embodiment may be manufactured by other steps than the foregoing steps.

Thus, also in the present embodiment, as with First Embodiment, the insulation film IF1 is formed of the Si-rich silicon nitride film IF1b, and the N-rich silicon nitride film IF1a situated thereunder. As a result, it is possible to improve the characteristics of the semiconductor device.

Specifically, the upper layer of the insulation film IF1 is formed of the Si-rich silicon nitride film IF1b. As a result, it is possible to improve the breakdown voltage. Whereas, the lower layer of the insulation film IF1 is formed of the N-rich silicon nitride film IF1a. As a result, it is possible to suppress the collapse.

Incidentally, also in the present embodiment, there are applicable the preferable composition ratios of the insulation film IF1 (the Si-rich silicon nitride film IF1b and the N-rich silicon nitride film IF1a), and the preferable length of the FP electrode described in First Embodiment. For example, as described in details in First Embodiment, for control of the collapse, the composition ratio [Si]/[N] of the N-rich silicon nitride film IF1a is preferably set within the range of 0.65 or more and 0.85 or less. Further, the composition ratio [Si]/[N]

is more preferably adjusted within the range of 0.75±1%. Further, for an improvement of the off breakdown voltage, the composition ratio [Si]/[N] of the Si-rich silicon nitride film IF1b is preferably set at larger than 0.85.

Third Embodiment

Figure 42:
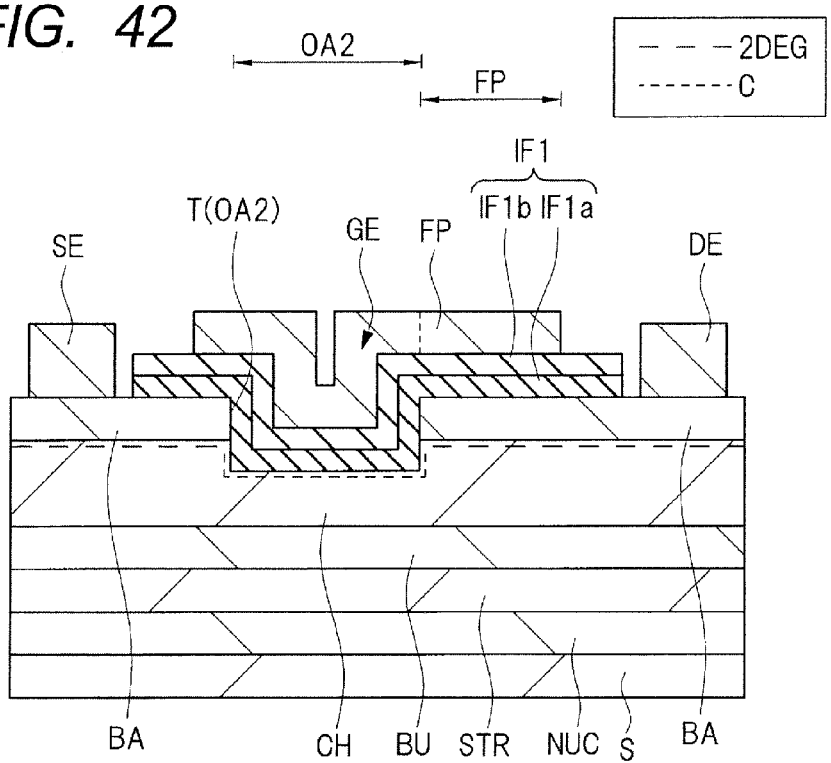
FIG. 42 is a cross sectional view showing a configuration of a semiconductor device of Third Embodiment.

In Modified Example 1 (FIG. 33B) of First Embodiment, the gate insulation film GI and the insulation film IF1 are used. However, the insulation film IF1 may be used as the gate insulation film GI. FIG. 42 is a cross sectional view showing a configuration of a semiconductor device of the present embodiment.

Structure Description

As shown in FIG. 42, also in the semiconductor device of the present embodiment, as with First Embodiment (FIG. 1), over a substrate S, there are sequentially formed a nucleation layer NUC, a strain relaxation layer STR, a buffer layer EU, a channel layer CH, and a barrier layer BA. A gate electrode GE is formed in a trench T penetrating through the barrier layer BA, and reaching some point of the channel layer CH via an insulation film IF1. The channel layer CH and the barrier layer BA are each formed of a nitride semiconductor. The barrier layer BA is a nitride semiconductor larger in band gap than the channel layer CH. The insulation film IF1 is, as with First Embodiment, formed of a lamination film of a Si-rich silicon nitride film IF1b, and a N-rich silicon nitride film IF1a situated thereunder. In the semiconductor device of the present embodiment, for example, Lgs is 1 µm; Lg, 1 µm; Lgd, 10 µm; and Lfp, 2.5 µm. Whereas, as the barrier layer BA, AlGaN is used. The thickness is 30 nm, and the composition of Al is 25%. For example, the upper layer of the insulation film IF1 is 30 nm in thickness, and the lower layer thereof is 30 nm in thickness.

Thus, also in the present embodiment, the insulation film IF1 is formed of a lamination film of the Si-rich silicon nitride film IF1b, and the N-rich silicon nitride film IF1a situated thereunder. For this reason, as described in details in First Embodiment, it is possible to improve the characteristics of the semiconductor device.

Specifically, by forming the upper layer of the insulation film IF1 as the Si-rich silicon nitride film IF1b, it is possible to improve the breakdown voltage. Further, it is possible to improve the etching resistance. Whereas, by forming the lower layer of the insulation film IF1 as the N-rich silicon nitride film IF1a, it is possible to suppress the collapse.

Manufacturing Method Description

Figure 43:
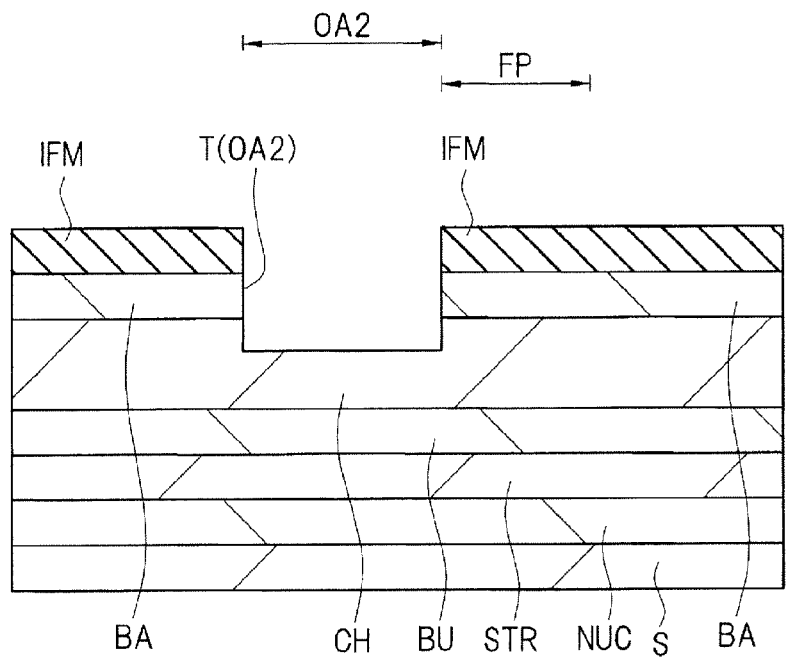
FIG. 43 is a cross sectional view showing the semiconductor device of Third Embodiment during a manufacturing step.
Figure 44:
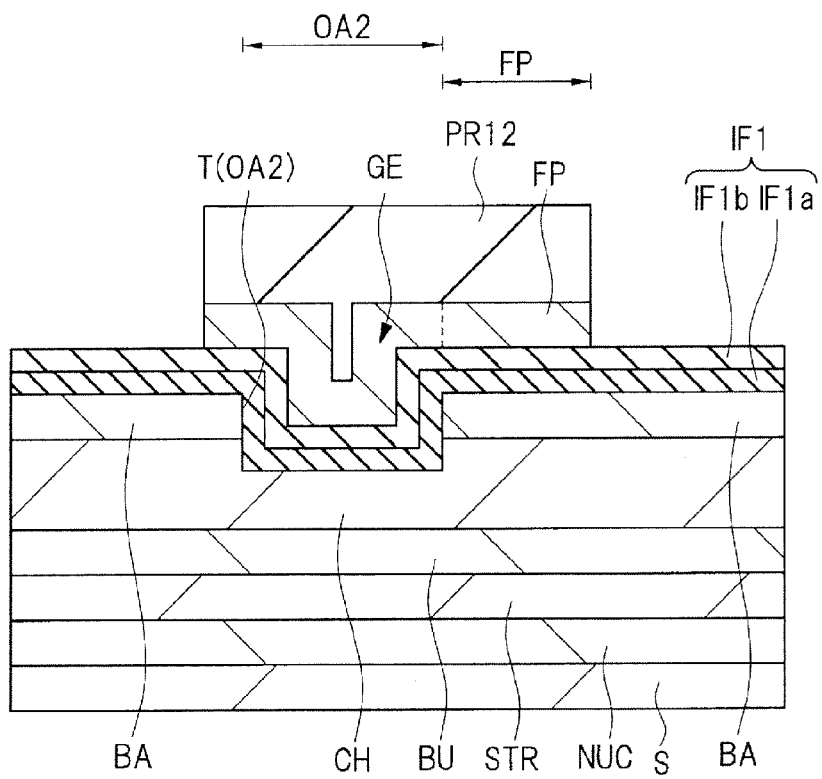
FIG. 44 is a cross sectional view showing the semiconductor device of Third Embodiment during a manufacturing step, and showing the manufacturing step following FIG. 43.
Figure 45:
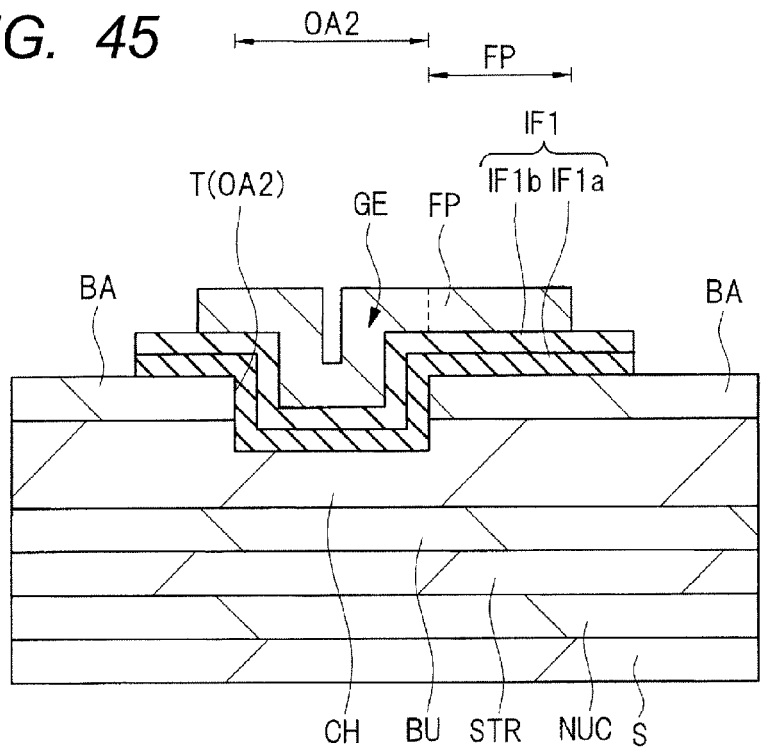
FIG. 45 is a cross sectional view showing the semiconductor device of Third Embodiment during a manufacturing step, and showing the manufacturing step following FIG. 44.

Then, referring to FIGS. 43 to 45, a description will be given to a method for manufacturing a semiconductor device of the present embodiment. In addition, the configuration of the semiconductor device will be more elucidated. FIGS. 43 to 45 are each a cross sectional view showing the semiconductor device of the present embodiment during a manufacturing step.

As shown in FIG. 43, over a substrate S, in the same manner as with First Embodiment, there are sequentially formed a nucleation layer NUC, a strain relaxation layer STR, a buffer layer BU, a channel layer CH, and a barrier layer BA.

Then, over the buffer layer BA, as a masking insulation film IFM, for example, a silicon oxide film is formed. Then, using a photolithography technology and an etching technology, the insulation film IFM is patterned, thereby to form an opening in an opening region OA2.

Then, using a lamination film of the insulation film IFM as a mask, the barrier layer BA and the channel layer CH are etched. As a result, there is formed the trench T penetrating through the barrier layer BA, and reaching some point of the channel layer CH. As an etching gas, for example, a chlorine type gas (such as $BCl_3$) is used. Then, the masking insulation film IFM is removed by etching.

Then, as shown in FIG. 44, over the barrier layer BA including the inside of the trench T, as with First Embodiment, an insulation film IF1 is formed. First, a N-rich silicon nitride film IF1a is deposited using a CVD method or the like. Then, over the N-rich silicon nitride film IF1a, a Si-rich silicon nitride film IF1b is deposited using a CVD method or the like. The composition ratio of the silicon nitride film, namely, whether the N-rich or Si-rich composition is achieved can be adjusted by changing the gas flow rate ratio of the raw material gas (i.e., a mixed gas of a silicon compound gas and a nitrogen compound gas) as described in First Embodiment.

Then, over the insulation film IF1, there is formed a TiN film (conductive film) to be a gate electrode GE. Then, over the conductive film, using a photolithography technology, there is formed a photoresist film PR12 covering the opening region OA2 and its outer circumferential part. Then, using the photoresist film PR12 as a mask, the conductive film is etched, thereby to form a gate electrode GE. For example, a TiN film is dry etched by a chlorine type gas. Then, by a plasma peel treatment or the like, the photoresist film PR12 is removed.

Then, as shown in FIG. 45, using a photolithography technology and an etching technology, the insulation film IF1 is patterned. The insulation film IF1 is dry etched by a fluorine type gas. This results in exposure of the portions of the barrier layer BA in the formation regions of the source electrode SE and the drain electrode DE.

Then, over the portions of the barrier layer BA on the opposite sides of the gate electrode GE, there are formed the source electrode SE and the drain electrode DE, respectively. The source electrode SE and the drain electrode DE are, as with First Embodiment, formed using a lift-off method (see FIG. 42).

Then, as with First Embodiment, over the gate electrode GE, the source electrode SE, and the drain electrode DE, there is formed an insulation layer (IL1). Further, over the insulation layer (IL1), there is formed a wire (M1) to be coupled with the source electrode SE or the drain electrode DE.

By the steps up to this point, it is possible to form the semiconductor device shown in FIG. 42. Incidentally, the steps are examples, and the semiconductor device of the present embodiment may be manufactured by other steps than the foregoing steps.

Thus, also in the present embodiment, as with First Embodiment, the insulation film IF1 is formed of the Si-rich silicon nitride film IF1b, and the N-rich silicon nitride film IF1a situated thereunder. As a result, it is possible to improve the characteristics of the semiconductor device.

Specifically, the upper layer of the insulation film IF1 is formed of the Si-rich silicon nitride film IF1b. As a result, it is possible to improve the breakdown voltage. Further, it is possible to improve the etching resistance. Whereas, the lower layer of the insulation film IF1 is formed of the N-rich silicon nitride film IF1a. As a result, it is possible to suppress the collapse.

Incidentally, also in the present embodiment, there are applicable the preferable composition ratios of the insulation film IF1 (the Si-rich silicon nitride film IF1b and the N-rich silicon nitride film IF1a), and the preferable length of the FP electrode described in First Embodiment. For example, as described in details in First Embodiment, for control of the collapse, the composition ratio [Si]/[N] of the N-rich silicon nitride film IF1a is preferably set within the range of 0.65 or more and 0.85 or less. Further, the composition ratio [Si]/[N]

is more preferably adjusted within the range of 0.75±1%. Further, for an improvement of the off breakdown voltage, the composition ratio [Si]/[N] of the Si-rich silicon nitride film IF1b is preferably set at larger than 0.85.

Fourth Embodiment

Figure 46:
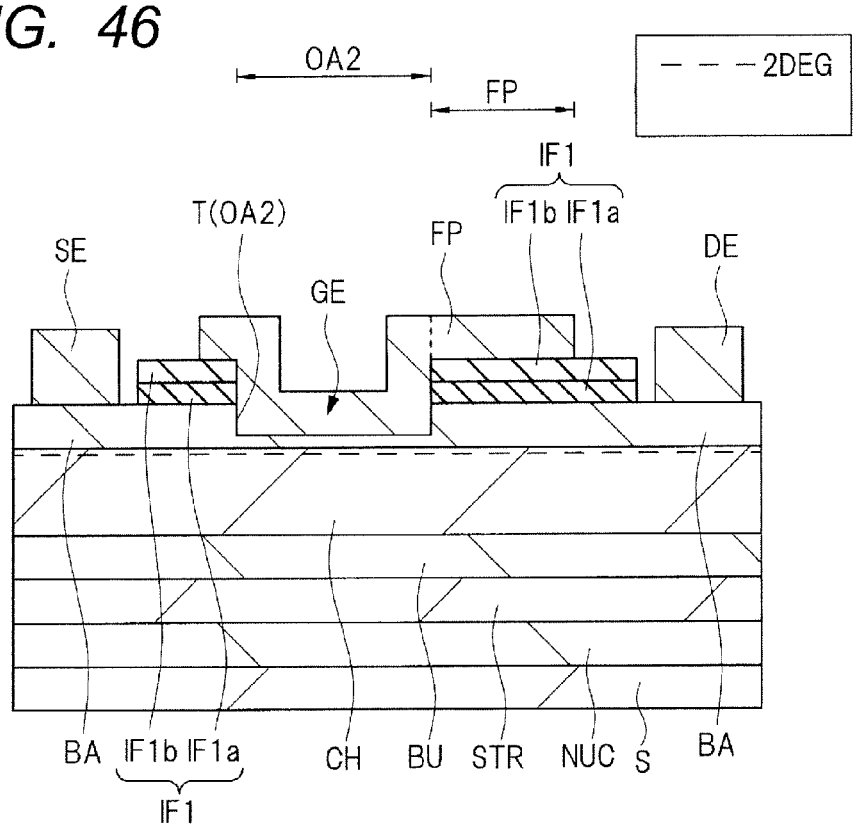
FIG. 46 is a cross sectional view showing a configuration of a semiconductor device of Fourth Embodiment.

In the semiconductor device of Modified Example 1 (FIG. 33B) of First Embodiment, the gate insulation film GI is used. However, there may be adopted a semiconductor device of a Schottky gate structure not using the gate insulation film GI. FIG. 46 is a cross sectional view showing a configuration of the semiconductor device of the present embodiment.

Structure Description

As shown in FIG. 46, also in the semiconductor device of the present embodiment, as with First Embodiment (FIG. 1), over a substrate S, there are sequentially formed a nucleation layer NUC, a strain relaxation layer STR, a buffer layer BU, a channel layer CH, and a barrier layer BA. A gate electrode GE is formed in the inside of a trench T penetrating through the insulation film IF1, and reaching some point of the barrier layer BA. The channel layer CH and the barrier layer BA are each formed of a nitride semiconductor. The barrier layer BA is a nitride semiconductor larger in band gap than the channel layer CH. The insulation film IF1 is, as with First Embodiment, formed of a lamination film of a Si-rich silicon nitride film IF1b, and a N-rich silicon nitride film IF1a situated thereunder.

Thus, also in the present embodiment, the insulation film IF1 is formed in a lamination structure of the Si-rich silicon nitride film IF1b, and the N-rich silicon nitride film IF1a situated thereunder. For this reason, as described in details in First Embodiment, it is possible to improve the characteristics of the semiconductor device.

Specifically, by forming the upper layer of the insulation film IF1 as the Si-rich silicon nitride film IF1b, it is possible to improve the breakdown voltage. Whereas, by forming the lower layer of the insulation film IF1 as the N-rich silicon nitride film IF1a, it is possible to suppress the collapse.

Incidentally, in the present embodiment, the trench T is not required to be formed. However, the formation of the trench T more suppresses the collapse, and facilitates the adjustment of the threshold voltage.

Manufacturing Method Description

Figure 47:
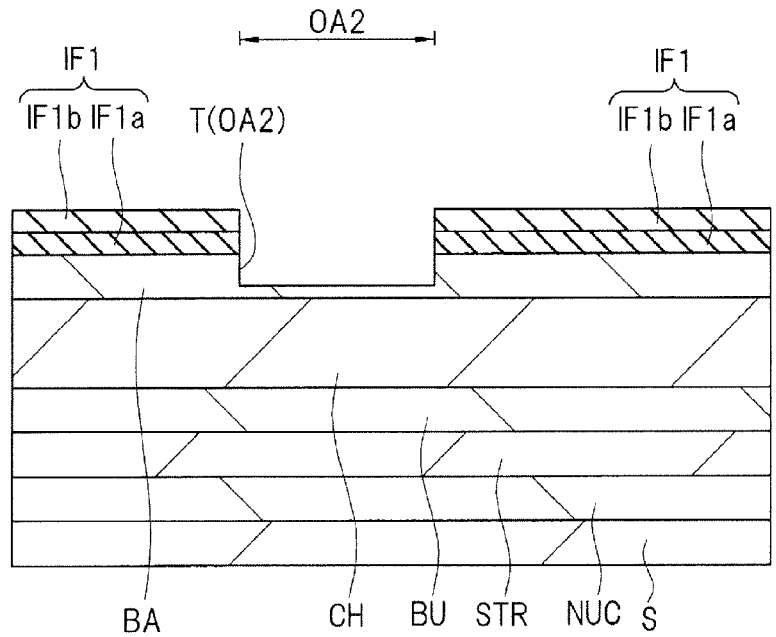
FIG. 47 is a cross sectional view showing the semiconductor device of Fourth Embodiment during a manufacturing step.
Figure 48:
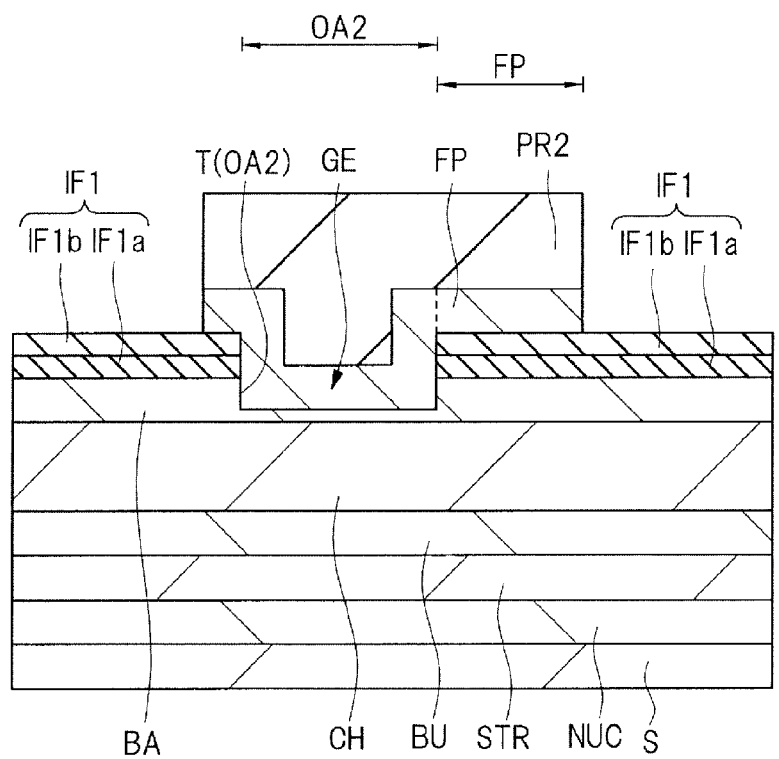
FIG. 48 is a cross sectional view showing the semiconductor device of Fourth Embodiment during a manufacturing step, and showing the manufacturing step following FIG. 47.
Figure 49:
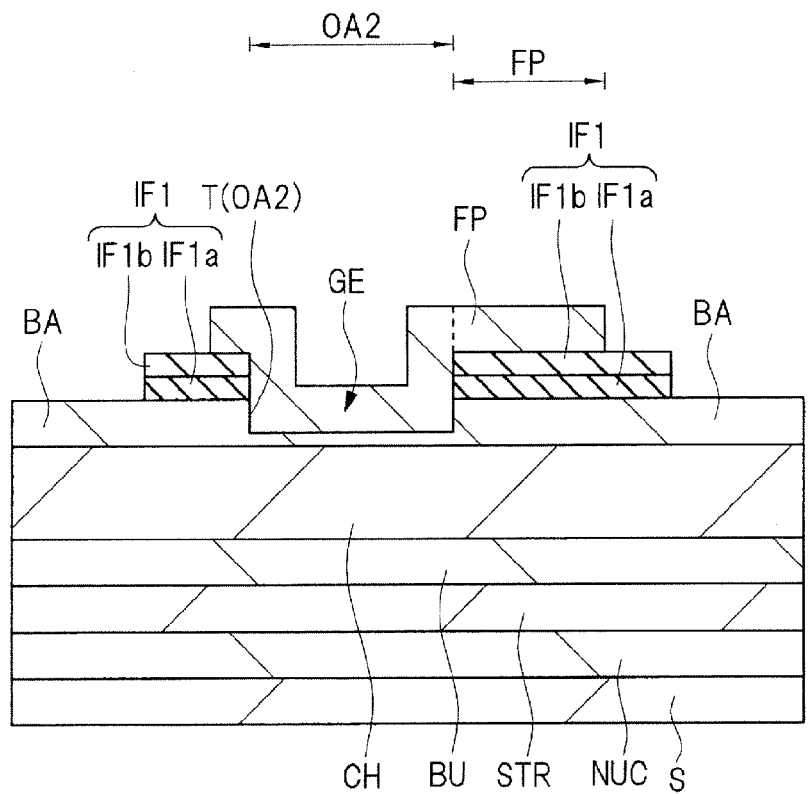
FIG. 49 is a cross sectional view showing the semiconductor device of Fourth Embodiment during a manufacturing step, and showing the manufacturing step following FIG. 48.

Then, referring to FIGS. 47 to 49, a description will be given to a method for manufacturing a semiconductor device of the present embodiment. In addition, the configuration of the semiconductor device will be more elucidated. FIGS. 47 to 49 are each a cross sectional view showing the semiconductor device of the present embodiment during a manufacturing step.

As shown in FIG. 47, over a substrate S, in the same manner as with First Embodiment, there are sequentially formed a nucleation layer NUC, a strain relaxation layer STR, a buffer layer BU, a channel layer CH, and a barrier layer BA.

Then, over the barrier layer BA, in the same manner as with First Embodiment, an insulation film IF1 is formed. First, a N-rich silicon nitride film IF1a is deposited using a CVD method or the like. Then, over the N-rich silicon nitride film IF1a, a Si-rich silicon nitride film IF1b is deposited using a CVD method or the like. The composition ratio of the silicon nitride film, namely, whether the N-rich or Si-rich composition is achieved can be adjusted by changing the gas flow rate ratio of the raw material gas (i.e., a mixed gas of a silicon compound gas and a nitrogen compound gas) as described First Embodiment.

Then, over the insulation film IF1, using a photolithography technology, there is formed a photoresist film (not shown) having an opening in an opening region OA2. Using the photoresist film as a mask, the insulation film IF1 and the barrier layer BA are etched. As a result, there is formed the trench T penetrating through the insulation film IF1, and reaching some point of the barrier layer BA. Then, by a plasma peel treatment or the like, the photoresist film (not shown) is removed.

Then, as shown in FIG. 48, over the insulation film IF1 including the inside of the the trench T, there is formed a Tin film (conductive film) to be a gate electrode GE. Then, over the conductive film, using a photolithography technology, there is formed a photoresist film PR2 covering an opening region OA2 and its outer circumferential part. Then, using the photoresist film PR2 as a mask, the conductive film to be a gate electrode GE is etched. For example, the TiN film is dry etched by a fluorine type gas. Then, the photoresist film PR2 is removed by a plasma peel treatment or the like.

Then, as shown in FIG. 49, using a photolithography technology and an etching technology, the insulation film IF1 is patterned. The insulation film IF1 is dry etched by a fluorine type gas. This results in exposure of the portions of the barrier layer BA in the formation regions of the source electrode SE and the drain electrode DE.

Then, over the portions of the barrier layer BA on the opposite sides of the gate electrode GE, there are formed the source electrode SE and the drain electrode DE, respectively. The source electrode SE and the drain electrode DE are, as with First Embodiment, formed using a lift-off method (see FIG. 46).

Then, as with First Embodiment, over the gate electrode GE, the source electrode SE, and the drain electrode DE, there is formed an insulation layer (IL1). Further, over the insulation layer (IL1), there is formed a wire (M1) to be coupled with the source electrode SE or the drain electrode DE.

By the steps up to this point, it is possible to form the semiconductor device shown in FIG. 46. Incidentally, the steps are examples, and the semiconductor device of the present embodiment may be manufactured by other steps than the foregoing steps.

Thus, also in the present embodiment, as with First Embodiment, the insulation film IF1 is formed of the Si-rich silicon nitride film IF1b, and the N-rich silicon nitride film IF1a situated thereunder. For this reason, it is possible to improve the characteristics of the semiconductor device.

Specifically, the upper layer of the insulation film IF1 is formed of the Si-rich silicon nitride film IF1b. As a result, it is possible to improve the breakdown voltage. Further, it is possible to improve the etching resistance. Whereas, the lower layer of the insulation film IF1 is formed of the N-rich silicon nitride film IF1a. As a result, it is possible to suppress the collapse.

Incidentally, also in the present embodiment, there are applicable the preferable composition ratios of the insulation film IF1 (the Si-rich silicon nitride film IF1b and the N-rich silicon nitride film IF1a), and the preferable length of the FP electrode described in First Embodiment. For example, as described in details in First Embodiment, for control of the collapse, the composition ratio [Si]/[N] of the N-rich silicon nitride film IF1a is preferably set within the range of 0.65 or more and 0.85 or less. Further, the composition ratio [Si]/[N] is more preferably adjusted within the range of 0.75±1%. Further, for an improvement of the off breakdown voltage, the composition ratio [Si]/[N] of the Si-rich silicon nitride film IF1b is preferably set at larger than 0.85.

Fifth Embodiment

Figure 50:
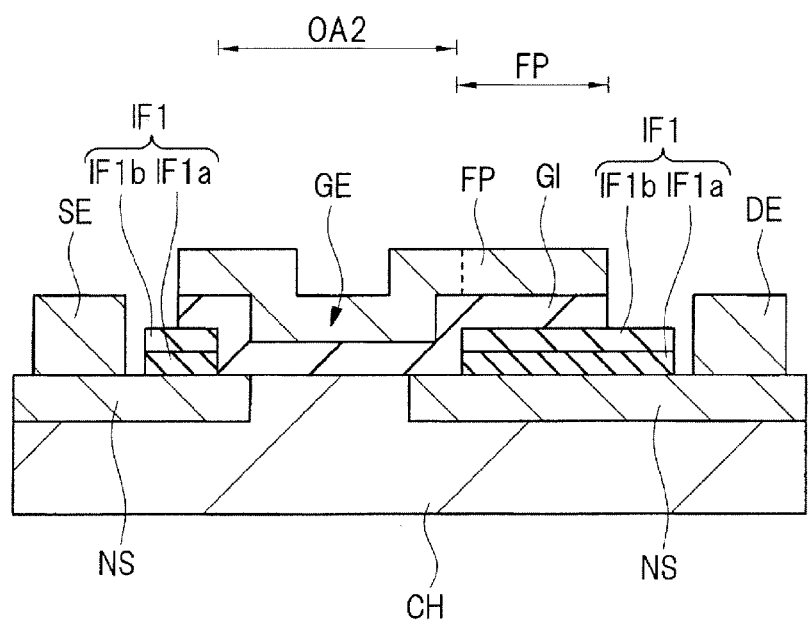
FIG. 50 is a cross sectional view showing a configuration of a semiconductor device of Fifth Embodiment.

In Modified Example 1 (FIG. 33B) of First Embodiment, there were used the two-dimensional electron gas 2DEG and the channel C. However, as in the present embodiment, only the channel C may be used. FIG. 50 is a cross sectional view showing a configuration of a semiconductor device of the present embodiment. The semiconductor device shown in FIG. 50 is a MIS type field effect transistor.

Structure Description

As shown in FIG. 50, in the semiconductor device of the present embodiment, over a substrate having a channel layer CH, a gate electrode GE is formed via a gate insulation film GI. The channel layer CH is formed of a nitride semiconductor (such as gallium nitride (GaN)). Further, over the channel layer CH, there is formed an insulation film IF1 having an opening in an opening region OA2. Then, the gate electrode GE extends from over the opening of the insulation film IF1 toward the drain electrode DE side. Further, the gate electrode GE extends from over the opening of the insulation film IF1 toward the source electrode SE side. Whereas, in the portions of the channel layer CH on the opposite sides of the opening region OA2, there are formed n type high-concentration semiconductor regions (high-concentration impurity regions, or source and drain regions) NS, respectively.

Further, the insulation film IF1 is, as with First Embodiment, formed in a lamination film of the Si-rich silicon nitride film IF1b, and the N-rich silicon nitride film IF1a situated thereunder.

Thus, also in the present embodiment, the insulation film IF1 is formed in a lamination structure of the Si-rich silicon nitride film IF1b, and the N-rich silicon nitride film IF1a situated thereunder. For this reason, as described in details in First Embodiment, it is possible to improve the characteristics of the semiconductor device.

Specifically, the upper layer of the insulation film IF1 is formed of the Si-rich silicon nitride film IF1b. As a result, it is possible to improve the breakdown voltage. Further, it is possible to improve the etching resistance. Whereas, the lower layer of the insulation film IF1 is formed of the N-rich silicon nitride film IF1a. As a result, it is possible to suppress the collapse.

Manufacturing Method Description

Then, referring to FIGS. 51 to 54, a description will be given to a method for manufacturing a semiconductor device of the present embodiment. In addition, the configuration of the semiconductor device will be more elucidated. FIGS. 51 to 54 are each a cross sectional view showing the semiconductor device of the present embodiment during a manufacturing step.

Figure 51:
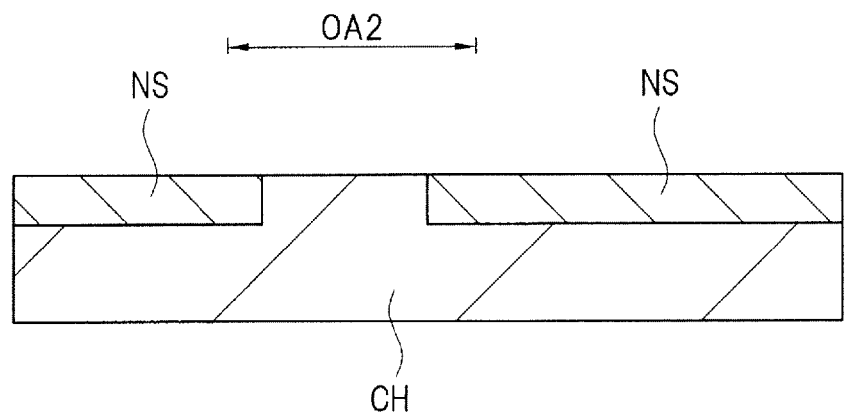
FIG. 51 is a cross sectional view showing the semiconductor device of Fifth Embodiment during a manufacturing step.

As shown in FIG. 51, the opening region OA2 of the channel layer CH of the substrate is covered with a mask film (not shown). Using the mask film as a mask, n type impurities (such as Si ions) are doped into the channel layer CH. As a result, there are formed $n^+$ type high-concentration semiconductor regions (source and drain regions) NS. Then, for activation of the doped ions, for example, a heat treatment is performed at 1200° C. for about 5 minutes. Then, the mask film is removed.

Figure 52:
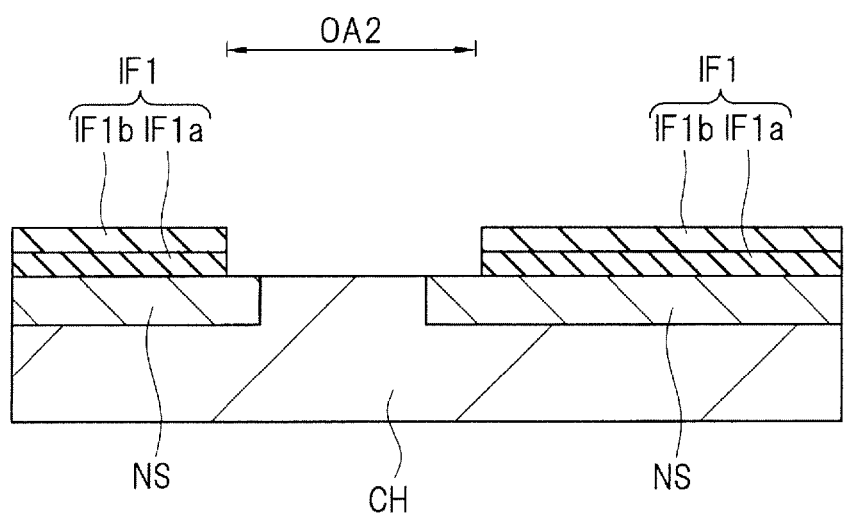
FIG. 52 is a cross sectional view showing the semiconductor device of Fifth Embodiment during a manufacturing step, and showing the manufacturing step following FIG. 51.

Then, as shown in FIG. 52, over the channel layer CH and the $n^+$ type high-concentration semiconductor regions NS, in the same manner as with First Embodiment, an insulation film IF1 is formed. First, a N-rich silicon nitride film IF1a is deposited using a CVD method or the like. Then, over the N-rich silicon nitride film IF1a, a Si-rich silicon nitride film IF1b is deposited using a CVD method or the like. The composition ratio of the silicon nitride film, namely, whether the N-rich or Si-rich composition is achieved can be adjusted by changing the gas flow rate ratio of the raw material gas (i.e., a mixed gas of a silicon compound gas and a nitrogen compound gas) as described in First Embodiment.

Then, using a photolithography technology and an etching technology, the insulation film IF1 is patterned, thereby to form an opening in the opening region OA2.

Figure 53:
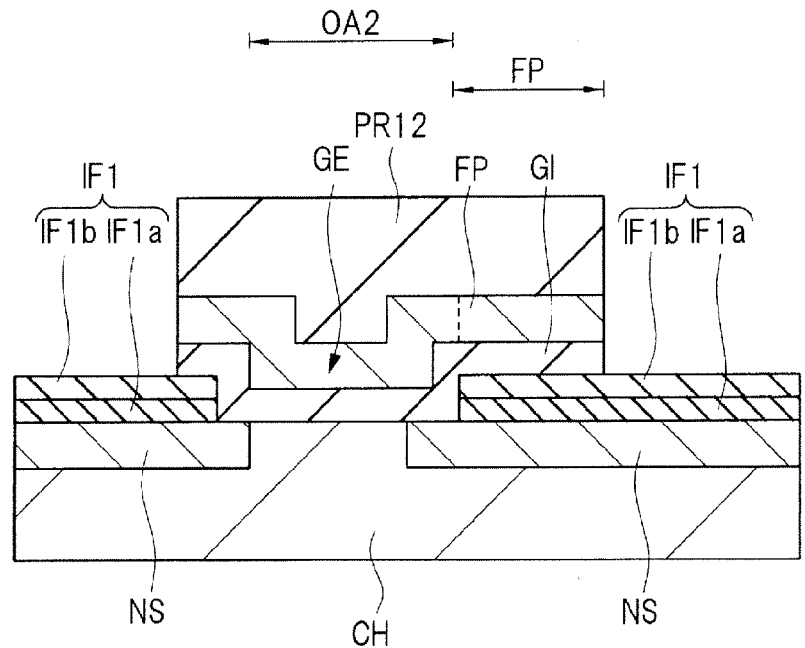
FIG. 53 is a cross sectional view showing the semiconductor device of Fifth Embodiment during a manufacturing step, and showing the manufacturing step following FIG. 52.

Then, as shown in FIG. 53, over the insulation film IF1 including the inside of the opening, as with First Embodiment, there is formed alumina to be a gate insulation film GI. Further, there is formed a TiN film (conductive film) to be a gate electrode GE. Then, over the conductive film, using a photolithography technology, there is formed a photoresist film PR12 covering the opening region OA2 and its outer circumferential part. Then, using the photoresist film PR12 as a mask, alumina to be the gate insulation film GI and the conductive film to be the gate electrode GE are etched. For example, the TiN film and alumina are dry etched by a chlorine type gas. During the patterning, the gate electrode GE is patterned in a shape projecting in one direction (the right hand side in FIG. 53, the drain electrode DE side). In other words, patterning is performed so as to provide a field plate electrode FP as a part of the gate electrode GE. Then, by a plasma peel treatment or the like, the photoresist film PR12 is removed.

Figure 54:
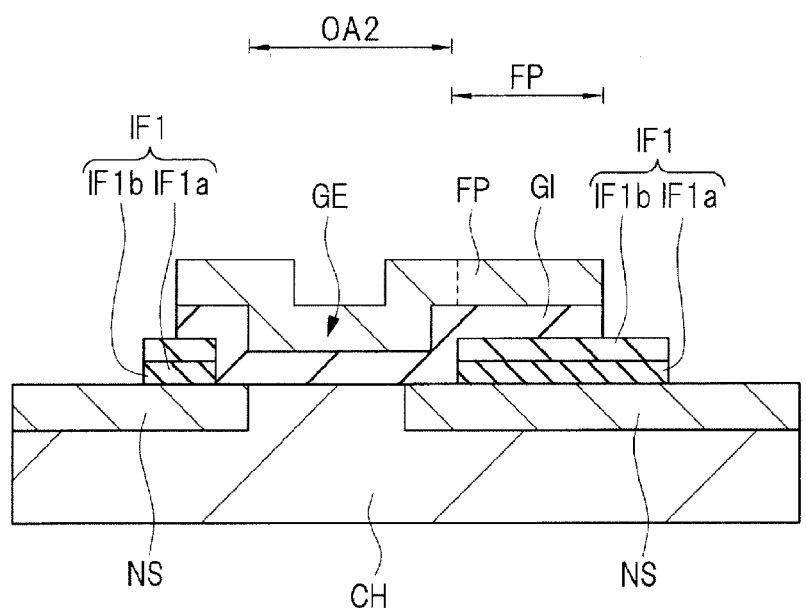
FIG. 54 is a cross sectional view showing the semiconductor device of Fifth Embodiment during a manufacturing step, and showing the manufacturing step following FIG. 53.

Then, as shown in FIG. 54, using a photolithography technology and an etching technology, the insulation film IF1 is patterned. The insulation film IF1 is dry etched by a fluorine type gas. This results in exposure of the portions of the barrier layer BA in the formation regions of the source electrode SE and the drain electrode DE.

Then, for example, over the $n^+$ type high-concentration semiconductor regions NS on the opposite sides of the gate electrode GE, there are formed the source electrode and the drain electrode. Further, over the gate electrode GE, the source electrode, and the drain electrode, there are formed insulation layers and wires.

By the steps up to this point, it is possible to form the semiconductor device shown in FIG. 50. Incidentally, the steps are examples, and the semiconductor device of the present embodiment may be manufactured by other steps than the foregoing steps.

Thus, also in the present embodiment, as with First Embodiment, the insulation film IF1 is formed of the Si-rich silicon nitride film IF1b, and the N-rich silicon nitride film IF1a situated thereunder. As a result, it is possible to improve the characteristics of the semiconductor device.

Specifically, the upper layer of the insulation film IF1 is formed of the Si-rich silicon nitride film IF1b. As a result, it is possible to improve the breakdown voltage. Further, it is possible to improve the etching resistance. Whereas, the lower layer of the insulation film IF1 is formed of the N-rich silicon nitride film IF1a. As a result, it is possible to suppress the collapse.

Incidentally, also in the present embodiment, there are applicable the preferable composition ratios of the insulation film IF1 (the Si-rich silicon nitride film IF1b and the N-rich silicon nitride film IF1a), and the preferable length of the FP electrode described in First Embodiment. For example, as described in details in First Embodiment, for control of the collapse, the composition ratio [Si]/[N] of the N-rich silicon nitride film IF1a is preferably set within the range of 0.65 or more and 0.85 or less. Further, the composition ratio [Si]/[N] is more preferably adjusted within the range of 0.75±1%. Further, for an improvement of the off breakdown voltage, the composition ratio [Si]/[N] of the Si-rich silicon nitride film IF1b is preferably set at larger than 0.85.

Up to this point, the invention made by the the present inventors was specifically described by way of embodiments. However, it is naturally understood that the present invention is not limited to the embodiments, and may be variously changed within the scope not departing from the gist thereof.

For example, the configuration of the insulation film IF2 of Second Embodiment may be applied to the semiconductor devices of Third to Fifth Embodiments.

[Additional Statement 1]

A semiconductor device including:

a nitride semiconductor layer formed over a substrate, a first insulation film formed over the nitride semiconductor layer, and having an opening in a first region, a gate electrode formed over the nitride semiconductor layer in the first region via a gate insulation film, and source and drain regions formed in the nitride semiconductor layer on the opposite sides of the gate electrode situated over the nitride semiconductor layer, wherein the first insulation film has a first silicon nitride film formed over the nitride semiconductor layer and a second silicon nitride film formed over the first silicon nitride film, and wherein the second silicon nitride film is larger in composition ratio of silicon (Si) than the first silicon nitride film.

[Additional Statement 2]

The semiconductor device according to Additional Statement 1, wherein the gate electrode has an electrode part extending from the end of the opening toward the drain region side.

[Additional Statement 3]

A semiconductor device including:

a first nitride semiconductor layer formed over a substrate, a second nitride semiconductor layer formed over the first nitride semiconductor layer, and wider in band gap than the first nitride semiconductor layer, a trench penetrating through the second nitride semiconductor layer in a first region, and reaching the first nitride semiconductor layer at the bottom thereof, a gate electrode provided in the trench, a first electrode and a second electrode formed over the second nitride semiconductor layer on the opposite sides of the gate electrode, respectively, and a first insulation film formed over the second nitride semiconductor layer outside the first region, wherein the first insulation film has a first silicon nitride film formed over the second nitride semiconductor layer, and a second silicon nitride film formed over the first silicon nitride film, and wherein the second silicon nitride film is larger in composition ratio of silicon (Si) than the first silicon nitride film.

[Additional Statement 4]

A semiconductor device including:

a first nitride semiconductor layer formed over a substrate, a second nitride semiconductor layer formed over the first nitride semiconductor layer, and wider in band gap than the first nitride semiconductor layer, a gate electrode, a first electrode and a second electrode formed over the second nitride semiconductor layer on the opposite sides of the gate electrode, respectively, and a first insulation film formed over the second nitride semiconductor layer, wherein the first insulation film has a first silicon nitride film formed over the second nitride semiconductor layer, and a second silicon nitride film formed over the first silicon nitride film, wherein the second silicon nitride film is larger in composition ratio of silicon (Si) than the first silicon nitride film, wherein at least the top surface of the first insulation film and the top surface of the second nitride semiconductor layer are opened to form a trench, and the trench is provided such that the width in a first direction in which the first insulation film is opened is wider than the width in the first direction in which the second nitride semiconductor layer is opened by the trench, and wherein the gate electrode is provided over the opening opened in the first insulation film, and over the second silicon nitride film.

[Additional Statement 5]

A method for manufacturing a semiconductor device, including the steps of:

(a) forming a first nitride semiconductor layer, forming a second nitride semiconductor layer wider in band gap than the first nitride semiconductor layer over the first nitride semiconductor layer, and thereby forming a lamination, (b) forming a first silicon nitride film over the second nitride semiconductor layer, and forming a second silicon nitride film larger in composition ratio of silicon (Si) than the first silicon nitride film over the first silicon nitride film, and (c) forming a conductive film over the second nitride semiconductor layer, etching the conductive film until the second silicon nitride film is exposed, and thereby forming a gate electrode.

What is claimed is:

1. A semiconductor device comprising:

a first nitride semiconductor layer formed over a substrate;

a second nitride semiconductor layer formed over the first nitride semiconductor layer, and wider in band gap than the first nitride semiconductor layer;

a trench formed in the second nitride semiconductor layer, the trench penetrating through the second nitride semiconductor layer and reaching the first nitride semiconductor layer at a bottom surface thereof, a first insulation film formed over the second nitride semiconductor layer to surround the trench;

a gate insulation film being formed over the first insulation film and being formed on a side surface and the bottom surface of the trench;

a gate electrode formed on the gate insulation film to overlap with the first insulation film; and a first electrode and a second electrode formed over the second nitride semiconductor layer on the opposite sides of the gate electrode, respectively, wherein the first insulation film has a first silicon nitride film in contact with the second nitride semiconductor layer, and a second silicon nitride film formed over the first silicon nitride film in contact with the gate insulating film, wherein the second silicon nitride film is larger in composition ratio of silicon (Si) than the first silicon nitride film, wherein the first silicon nitride film is larger in composition ratio of nitrogen (N) than the second silicon nitride film, and wherein a portion of the gate electrode is provided at least over the second silicon nitride film.

2. The semiconductor device according to claim 1, wherein the composition ratio [Si]/[N] of the first silicon nitride film is within ±1% around 0.75.

3. The semiconductor device according to claim 1, wherein the composition ratio [Si]/[N] of the first silicon nitride film is 0.65 or more and 0.85 or less.

4. The semiconductor device according to claim 1, wherein the composition ratio [Si]/[N] of the second silicon nitride film is larger than 0.85.

5. The semiconductor device according to claim 1, wherein the composition ratio [Si]/[N] of the first silicon nitride film is within ±1% around 0.75, and wherein the composition ratio [Si]/[N] of the second silicon nitride film is larger than 0.85.

6. The semiconductor device according to claim 1,
wherein the composition ratio [Si]/[N] of the first silicon nitride film is 0.65 or more and 0.85 or less, and
wherein the composition ratio [Si]/[N] of the second silicon nitride film is larger than 0.85.

7. The semiconductor device according to claim 1,
wherein the first insulation film has an opening exposing the trench, and
wherein the gate electrode is also provided over the gate insulation film at the opening.

\* \* \* \* \*